(12) United States Patent
Dan et al.

(10) Patent No.: US 7,420,833 B2
(45) Date of Patent: Sep. 2, 2008

(54) MEMORY

(75) Inventors: Toru Dan, Gifu (JP); Naofumi Sakai, Gifu (JP); Shigeharu Matsushita, Katano (JP); Yoshiyuki Ishizuka, Inazawa (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/936,593

(22) Filed: Sep. 9, 2004

(65) Prior Publication Data

US 2005/0068809 A1    Mar. 31, 2005

(30) Foreign Application Priority Data

Sep. 30, 2003  (JP) .............................. 2003-340560

(51) Int. Cl.
*G11C 11/22* (2006.01)
(52) U.S. Cl. .................. 365/145; 365/158; 365/171
(58) Field of Classification Search .............. 365/158, 365/145, 171, 173, 189.09
See application file for complete search history.

(56) References Cited

U.S. PATENT DOCUMENTS

| | | | |
|---|---|---|---|
| 5,550,770 | A | 8/1996 | Kuroda |
| 6,356,475 | B1 | 3/2002 | Tamura et al. |
| 6,473,329 | B1 | 10/2002 | Nakamura |
| 6,522,572 | B2 | 2/2003 | Nakamura |
| 6,717,837 | B2* | 4/2004 | Hasegawa et al. ........... 365/145 |
| 6,795,351 | B2* | 9/2004 | Sakai .................... 365/189.09 |
| 2004/0022090 | A1 | 2/2004 | Hasegawa et al. |
| 2004/0105297 | A1 | 6/2004 | Takano |
| 2004/0109363 | A1 | 6/2004 | Hamada |
| 2004/0174729 | A1* | 9/2004 | Sakai et al. ................. 365/145 |
| 2005/0057958 | A1* | 3/2005 | Miyamoto et al. .......... 365/145 |
| 2005/0152193 | A1* | 7/2005 | Sakai .................... 365/189.09 |
| 2006/0067139 | A1 | 3/2006 | Sakai et al. |

FOREIGN PATENT DOCUMENTS

| | | |
|---|---|---|
| JP | 06-77434 | 3/1994 |
| JP | 6-77434 | 3/1994 |
| JP | 09-116107 | 5/1997 |
| JP | 10-162587 | 6/1998 |
| JP | 2001-210795 | 8/2001 |
| KR | 2001-0031598 | 4/2001 |
| WO | 99/26252 | 5/1999 |

OTHER PUBLICATIONS

Japanese Office Action dated Jan. 30, 2007 w/translation.
Japanese Office Action dated Jan. 30, 2007 w/translation related to Japanese Appln. No. 2003-057179.
Japanese Office Action dated Jan. 30, 2007 w/translation related to Japanese Appln. No. 2004-050968.

* cited by examiner

*Primary Examiner*—Richard T. Elms
*Assistant Examiner*—Hien N Nguyen
(74) *Attorney, Agent, or Firm*—McDermott Will & Emery LLP

(57) ABSTRACT

A memory capable of suppressing disturbance causing disappearance of data in a nonselected memory cell is provided. This memory comprises a memory cell array including a bit line, a word line arranged to intersect with the bit line and memory cells connected between the bit line and the word line, for accessing a selected memory cell thereby deteriorating a remanent polarization in an arbitrary memory cell and thereafter performing recovery for recovering all memory cells to remanent polarizations immediately after a write operation or remanent polarizations subjected to single application of a voltage applied to a nonselected memory cell in the access.

21 Claims, 37 Drawing Sheets

STATE BEFORE REFRESH

FIG.12 SECOND REFRESH OPERATION

THIRD REFRESH OPERATION

FIRST REFRESH OPERATION

SECOND REFRESH OPERATION

STATE BEFORE REFRESH

SECOND REFRESH OPERATION

AFTER FIRST REFRESH    AFTER SECOND REFRESH    AFTER THIRD REFRESH

STATE BEFORE REFRESH

STATE BEFORE REFRESH

FIG.41 FIRST REFRESH OPERATION

FIG.42 SECOND REFRESH OPERATION

STATE BEFORE REFRESH

FIRST REFRESH OPERATION

MEMORY

BACKGROUND OF THE INVENTION

1. Field of the Invention

The present invention relates to a memory.

2. Description of the Background Art

In general, volatile and nonvolatile memories are known as semiconductor memories. A DRAM (dynamic random access memory) is known as the volatile memory, while a flash EEPROM (electrically erasable and programmable read only memory) is known as the nonvolatile memory. The DRAM and the flash EEPROM allowing high integration are widely used.

FIG. 55 is an equivalent circuit diagram showing the structure of each memory cell 103 of a conventional DRAM. FIG. 56 is a sectional view showing the structure of each trench capacitor employed in the conventional DRAM. Referring to FIG. 55, each memory cell 103 of the conventional DRAM, i.e., a conventional volatile memory, is constituted of a selection transistor 101 and a capacitor 102. The capacitor 102 stores information of the memory cell 103 as charges. In order to read the information from the memory cell 103, a word line WL rises to turn on the selection transistor 101. Thus, a cell capacitance Ccell and a bit line capacitance Cb1 are capacitively coupled with each other. Therefore, a bit line potential decided by the quantity of charges stored in the memory cell 103 can be read.

In order to ensure the cell capacitance Ccell of the capacitor 102 also when the memory cell 103 of the conventional DRAM having the aforementioned structure is refined, the trench capacitor formed by vertically extending upper and lower electrodes 102a and 102c and a dielectric film 102b constituting the capacitor 102 is employed as shown in FIG. 56. If refinement further progresses, however, it is difficult to ensure the cell capacitance Ccell of the capacitor 102 with the trench capacitor shown in FIG. 56. In other words, high integration of the DRAM by reduction of a design rule increasingly approaches the limit.

In the flash EEPROM (hereinafter referred to as a flash memory), i.e., the nonvolatile memory, memory cells of a stacked or split gate CHE (channel hot electron) write system are limited in refinement of the channel length. In memory cells of an FN (Fowler-Nordheim) write system such as a NAND form, the limit of refinement is equivalent to that in logic transistors. However, the flash memory requires a high voltage of 15 V to 20 V in operation, and when a power supply voltage for the logic transistors is progressively reduced, generation efficiency for generating the high voltage of 15 V to 20 V from the reduced power supply voltage is reduced. Therefore, power consumption is increased and the area of a charge pumping part is increased, disadvantageously hindering refinement.

On the other hand, a ferroelectric memory is known as one of nonvolatile memories recently watched with interest. This ferroelectric memory is disclosed in Japanese Patent Laying-Open No. 2001-210795, for example. This ferroelectric memory utilizes pseudo capacitance variation with the direction of polarization of a ferroelectric substance as a memory element. This ferroelectric memory, allowing data rewriting at a high speed with a low voltage in principle, is spotlighted as an ideal memory having the advantages of the DRAM, i.e., the high speed and the low voltage, and that of the flash memory, i.e., nonvolatility.

Memory cell systems for a ferroelectric memory are roughly classified into three types, i.e., a one-transistor one-capacitor system, a simple matrix system and a one-transistor system. FIG. 57 is an equivalent circuit diagram showing each memory cell 113 of a one-transistor one-capacitor ferroelectric memory. FIG. 58 is an equivalent circuit diagram showing a memory cell array of a simple matrix ferroelectric memory. FIG. 59 is a hysteresis diagram for illustrating operations of the simple matrix ferroelectric memory, and FIG. 60 is a hysteresis diagram for illustrating disturbance in the simple matrix ferroelectric memory. FIG. 61 is an equivalent circuit diagram showing memory cells of a one-transistor ferroelectric memory.

As shown in FIG. 57, each memory cell 113 of the one-transistor one-capacitor ferroelectric memory is constituted of a selection transistor 111 and a ferroelectric capacitor 112, similarly to a DRAM cell. The memory cell 113 is different from the DRAM cell in the ferroelectric capacitor 112. In operation, a word line WL rises to turn on the selection transistor 111. Thus, a capacitance Ccell of the ferroelectric capacitor 112 and a bit line capacitance Cb1 are connected with each other. Then, a plane line PL is pulse-driven for transmitting charges, varied in quantity with the direction of polarization of the ferroelectric capacitor 112, to a bit line BL. Data is read as potential difference of the bit line BL, similarly to the DRAM cell.

In the one-transistor one-capacitor ferroelectric memory, refinement of the ferroelectric capacitor 112 is limited due to the structure similar to that of the DRAM. Therefore, the one-transistor one-capacitor ferroelectric memory is limited in integration similarly to the DRAM.

The simple matrix ferroelectric memory is now described with reference to FIGS. 58 to 60. As shown in FIG. 58, memory cells 121 of the simple matrix ferroelectric memory are constituted of ferroelectric capacitors 122 consisting of word lines WL and bit lines BL formed to extend in directions intersecting with each other and ferroelectric films (not shown) arranged between the word lines WL and the bit lines BL. First and second ends of the ferroelectric capacitors 122 are connected to the word lines WL and the bit lines BL respectively. This simple matrix ferroelectric memory, reading potentials resulting from capacitive coupling between the bit lines BL and the ferroelectric capacitors 122, must ensure capacitances similarly to the DRAM. However, the simple matrix ferroelectric memory, having the memory cells 121 constituted of only the ferroelectric capacitors 122 with no selection transistors, can be more increased in degree of integration than the one-transistor one-capacitor ferroelectric memory.

Operations of the simple matrix ferroelectric memory are described with reference to FIGS. 59 and 60. Table 1 shows voltages applied to the memory cells 121 in standby, reading and writing states respectively.

TABLE 1

|  | Standby | Read | Write "1" | Write "0" |
| --- | --- | --- | --- | --- |
| Selected WL | ½ Vcc | Vcc | 0 | Vcc |
| Nonselected WL | ½ Vcc | ⅓ Vcc | ⅔ Vcc | ⅓ Vcc |
| Selected BL | ½ Vcc | 0→Floating | Vcc | 0 |
| Nonselected BL | ½ Vcc | ⅔ Vcc | ⅓ Vcc | ⅔ Vcc |

As to a write operation, both ends of each ferroelectric capacitor 122 are at the same potential in the standby state. In order to write data "0" in any memory cell 121, the ferroelectric memory applies potential differences Vcc and 0 V to the word line WL and the bit line BL corresponding to this memory cell 121 respectively. At this time, the ferroelectric memory applies the potential difference Vcc to the ferroelectric capacitor 122 of this memory cell 121. Thus, the ferroelectric memory shifts to a point A shown in FIG. 59. Thereafter the ferroelectric memory sets both ends of the ferroelectric capacitor 122 to the same potential for making a transition to "0" shown in FIG. 59. In order to write data "1" in any memory cell 121, on the other hand, the ferroelectric memory applies the potential differences 0 V and Vcc to the corresponding word line WL and the corresponding bit line BL respectively. At this time, the ferroelectric memory applies a potential difference −Vcc to the ferroelectric capacitor 122. Thus, the ferroelectric memory shifts to another point B shown in FIG. 59. Thereafter the ferroelectric memory sets both ends of the ferroelectric capacitor 122 to the same potential for making a transition to "1" shown in FIG. 59.

As to a read operation, the ferroelectric memory precharges the corresponding bit line BL at 0 V and thereafter brings the same into a floating state. Then, the ferroelectric memory activates the corresponding word line WL to the potential difference Vcc. Assuming that CFE represents the capacitance of the ferroelectric capacitor 122 and CBL represents the parasitic capacitance of the bit line BL, this potential difference Vcc is capacitively divided by the parasitic capacitance CFE and the capacitance CBL. The capacitance CFE of the ferroelectric capacitor 122 can be approximated as C0 or C1 in response to data held therein. Therefore, the potential of the bit line BL is expressed as follows:

$$V0 = \{C0/(C0+CBL)\} \times Vcc \quad (1)$$

$$V1 = \{C1/(C1+CBL)\} \times Vcc \quad (2)$$

The above expression (1) indicates the potential V0 of the bit line BL connected to the memory cell 121 holding data "0", while the above expression (2) indicates the potential V1 of the bit line BL connected to the memory cell 121 holding data "1".

A read amplifier determines the difference between the bit line potentials V0 and V1 according to the above expressions (1) and (2), thereby reading data. The data of the memory cell 121 is destroyed in this data reading, and hence the ferroelectric memory performs a write operation (restore operation) responsive to the read data after the data reading.

In the simple matrix ferroelectric memory, data disadvantageously disappear from nonselected cells. More specifically, the ferroelectric memory applies potential difference ⅓ Vcc to all nonselected memory cells in writing and reading. As shown in FIG. 60, therefore, the quantity of polarization is reduced due to the hysteresis of a ferroelectric substance, leading to disappearance of the data.

The one-transistor ferroelectric memory is now described with reference to FIGS. 57, 59 and 61. As shown in FIG. 61, memory cells 131 of the one-transistor ferroelectric memory are formed by connecting ferroelectric capacitors 132 to the gates of MOS transistors 133. In this one-transistor ferroelectric memory, first and second ends of the ferroelectric capacitors 132 are connected to word lines WL and the gates of the MOS transistors 133 constituting cell transistors respectively. In the one-transistor ferroelectric memory, threshold potential differences of the MOS transistors 133 vary with the directions of polarization of the ferroelectric capacitors 132, to vary memory cell currents. The ferroelectric memory reads data by determining the variation of the memory cell currents. In the one-transistor ferroelectric memory reading data by detecting the memory cell currents, the capacitances of the ferroelectric capacitors 132 may not be increased to some extent in consideration of bit line capacitances, dissimilarly to the one-transistor one-capacitor ferroelectric memory shown in FIG. 57. Therefore, the ferroelectric capacitors 132 can be so reduced in size that the one-transistor ferroelectric memory is suitable for refinement.

Operations of the one-transistor ferroelectric memory, having a hysteresis curve similar to that of the aforementioned simple matrix ferroelectric memory, are now described with reference to FIG. 59. In a standby state, all word lines WL, all bit lines BL and all source lines SL are at the potential difference 0 V. In a write operation for writing data "0" in any memory cell 131, the ferroelectric memory applies a step-up potential difference Vpp to the word line WL corresponding to this memory cell 131. At this time, the ferroelectric memory applies a potential Vcc capacitively divided with the gate capacitance of the MOS transistor 133 to the ferroelectric capacitor 132. Thus, the ferroelectric memory shifts to the point A shown in FIG. 59 despite the initial state. Thereafter the ferroelectric memory returns the word line WL to the potential difference 0 V, for making a transition to data "0" shown in FIG. 59. In order to write data "1" in any memory cell 131, on the other hand, the ferroelectric memory applies the potential difference 0 V and the step-up potential difference Vpp to the corresponding word line WL and the corresponding bit line BL respectively. In this case, the ferroelectric memory applies a potential difference −Vcc to the ferroelectric capacitor 132. Thus, the ferroelectric memory shifts to the point B shown in FIG. 59. Thereafter the ferroelectric memory returns the bit line BL to the potential difference 0 V, for making a transition to the data "1" shown in FIG. 59.

The one-transistor ferroelectric memory performs a read operation by activating the corresponding word line WL to a potential difference Vr not causing polarization inversion. Thus, the gate potential difference of the cell transistor (MOS transistor) 133 varies with the written state. A current flowing through the cell transistor 133 varies with the gate potential difference thereof, and hence the ferroelectric transistor reads the current difference through the corresponding bit line BL. In other words, the one-transistor ferroelectric memory may read not the potential difference between the ferroelectric capacitor 132 and the bit line BL resulting from capacitive coupling but the current of the cell transistor 133, to require no polarization inversion in reading. Thus, the one-transistor ferroelectric memory is capable of nondestructive reading. However, the one-transistor ferroelectric memory has a problem of disturbance of nonselected cells, similarly to the aforementioned simple matrix ferroelectric memory.

As hereinabove described, it is difficult to refine the conventional DRAM and the conventional flash memory, and hence a memory cell system allowing higher integration is demanded. In the one-transistor or simple-matrix ferroelectric memory allowing high integration, on the other hand, data disadvantageously disappear from the nonselected memory cells as described above. Thus, it is disadvantageously difficult to put the conventional one-transistor and simple matrix ferroelectric memories into practice.

SUMMARY OF THE INVENTION

The present invention has been proposed in order to solve the aforementioned problems, and an object of the present invention is to provide a memory capable of suppressing disturbance causing disappearance of data from a nonselected memory cell.

In order to attain the aforementioned object, a memory according to an aspect of the present invention comprises a memory cell array including a bit line, a word line arranged to intersect with the bit line and memory cells connected between the bit line and the word line. The memory accesses a selected memory cell thereby deteriorating a remanent polarization in an arbitrary memory cell and thereafter performs recovery for recovering all memory cells to remanent polarizations immediately after a write operation or remanent polarizations subjected to single application of a voltage applied to a nonselected memory cell in the access.

As hereinabove described, the memory according to this aspect accesses the selected memory cell thereby deteriorating the remanent polarization of the arbitrary memory cell and thereafter recovers all memory cells to the remanent polarizations immediately after the write operation or those subjected to single application of the voltage applied to the nonselected memory cell in the access so that all memory cells including that deteriorating the remanent polarization can be recovered to the remanent polarizations immediately after the write operation or those subjected to single application of the voltage applied to the nonselected memory cell in the access, whereby the memory cells can be inhibited from disturbance causing disappearance of data resulting from deterioration of the remanent polarizations. Further, the memory performs the recovery not every access but after the arbitrary memory cell deteriorates the remanent polarization, whereby the operating time for the recovery can be remarkably reduced as compared with a case of performing the recovery every access. Thus, the memory can be inhibited from increase of the number of operations also when performing the recovery.

The memory according to the aforementioned aspect preferably performs the recovery so that the memory cell other than the memory cell subjected to the recovery maintains the remanent polarization immediately after the write operation or the remanent polarization subjected to single application of the voltage applied to the nonselected memory cell in the access. According to this structure, the memory can inhibit the memory cell other than that subjected to the recovery from disturbance resulting from deterioration of the remanent polarization while recovering the memory cell subjected to the recovery from deterioration of the remanent polarization.

In the memory according to the aforementioned aspect, the memory cells preferably include a selected memory cell connected to a selected bit line and a selected word line and a nonselected memory cell other than the selected memory cell, and the memory preferably performs the recovery by applying a first voltage pulse supplying an electric field of a first direction and a second voltage pulse supplying an electric field opposite to the first direction to the memory cells by the same frequencies respectively throughout read and rewrite operations performed on the selected memory cell while varying a method of applying the first voltage pulse and the second voltage pulse to the memory cells with first or second data read through the read operation. According to this structure, the memory can cancel deterioration of the remanent polarization caused in the nonselected memory cell by applying the first and second voltage pulses of opposite directions to the nonselected memory cell by the same frequencies while recovering the selected memory cell from deterioration of the remanent polarization through the read and rewrite operations performed on the selected memory cell in the recovery, whereby the memory can inhibit the nonselected memory cell from deterioration of the remanent polarization while recovering the selected memory cell from deterioration of the remanent polarization. Thus, all memory cells can be inhibited from disturbance resulting from deterioration of the remanent polarizations. Further, the memory varying the method of applying the first voltage pulse and the second voltage pulse to the memory cells with the first or second data read through the read operation in the recovery can apply the voltages of opposite directions to the nonselected memory cell by the same necessary frequencies separately for the first and second data respectively.

In this case, the memory preferably performs the recovery once on each of a plurality of selected memory cells connected to the selected word line. According to this structure, the memory can easily recover the plurality of selected memory cells connected to the selected word line from deterioration of the remanent polarizations.

In the aforementioned structure applying the first and second voltage pulses to the memory cells, voltages of the first voltage pulse and the second voltage pulse may be substantially ⅓ of a voltage applied to the selected memory cell in the write operation.

In the aforementioned structure applying the first and second voltage pulses to the memory cells, voltages of the first voltage pulse and the second voltage pulse may alternatively be substantially half a voltage applied to the selected memory cell in the write operation.

In the aforementioned structure varying the method of applying the first voltage pulse and the second voltage pulse to the memory cells with the first or second data read through the read operation, the memory preferably applies each of the first voltage pulse and the second voltage pulse once when reading the first data through the read operation, and applies each of the first voltage pulse and the second voltage pulse twice when reading the second data through the read operation. According to this structure, the memory can easily apply the voltages of opposite directions to the nonselected memory cell by the same frequencies separately for the first and second data respectively.

In the memory according to the aforementioned aspect, the memory cells preferably include a selected memory cell connected to the selected word line and a nonselected memory cell other than the selected memory cell, and the memory preferably performs the recovery by applying a first voltage pulse supplying an electric field of a first direction and a second voltage pulse supplying an electric field opposite to the first direction to the memory cells by the same frequencies respectively or substantially applying no voltage pulse throughout read and rewrite operations performed on the selected memory cell. According to this structure, the memory can cancel deterioration of the remanent deterioration of the nonselected memory cell by applying the first and second voltage pulses of opposite directions by the same frequencies or inhibit the nonselected memory cell from deterioration of the remanent polarization by substantially applying no voltage pulse while recovering the selected memory cell from deterioration of the remanent polarization through the read and rewrite operations performed on the selected memory cell in the recovery. Thus, the memory can inhibit all memory cells from disturbance resulting from deterioration of the remanent polarizations in the recovery.

In this case, the memory preferably collectively performs the recovery on a plurality of selected memory cells connected to the selected word line. According to this structure, the memory can easily recover the plurality of selected memory cells connected to the selected word line from deterioration of the remanent polarizations.

In the aforementioned structure applying the first and second voltage pulses to the memory cells, voltages of the first voltage pulse and the second voltage pulse may be substantially ⅓ of a voltage applied to the selected memory cell in the write operation.

In the aforementioned structure applying the first and second voltage pulses to the memory cells, voltages of the first voltage pulse and the second voltage pulse may alternatively be substantially half a voltage applied to the selected memory cell in the write operation.

In the memory according to the aforementioned aspect, the memory cell array preferably has a hierarchical structure consisting of a plurality of local memory cell arrays including the memory cells. According to this structure, the memory comprising the memory cell array having the hierarchical structure consisting of the plurality of local memory cell arrays can suppress disappearance of data resulting from deterioration of remanent polarizations by performing the aforementioned recovery. Further, the memory can suppress incapability of external normal access resulting from the recovery while suppressing disappearance of data resulting from deterioration of remanent polarizations by individually performing normal access and the recovery every local memory cell array.

In this case, the plurality of local memory cell arrays preferably include a first local memory cell array and a second local memory cell array, and the memory preferably accesses the first local memory cell array and performs the recovery on the second local memory cell array at the same time. According to this structure, the memory can easily suppress incapability of external normal access resulting from the recovery while suppressing disappearance of data resulting from deterioration of remanent polarizations.

The memory according to the aforementioned aspect preferably further comprises counting means for counting the frequency of access to the memory cells, for performing the recovery every prescribed access to the memory cells counted by the counting means. According to this structure, the memory can inhibit the number of operations from remarkable increase also when performing the recovery by adjusting the frequency of access for performing the recovery.

In this case, the counting means preferably includes a counter for counting the frequency of access to the memory cells. According to this structure, the counter can easily count a prescribed frequency of access to the memory cells.

The memory according to the aforementioned aspect preferably further comprises counting means for counting the time of access to the memory cells, for performing the recovery every lapse of a prescribed access time to the memory cells counted by the counting means elapses. According to this structure, the memory can inhibit the number of operations from remarkable increase also when performing the recovery in addition to the normal access by adjusting the access time for the recovery.

In this case, the counting means preferably includes a timer for counting the access time to the memory cells. According to this structure, the timer can easily count a prescribed access time to the memory cells.

In the memory according to the aforementioned aspect, the voltage applied to the nonselected memory cell in the access may be substantially ⅓ of a voltage applied to the selected memory cell in the write operation.

In the memory according to the aforementioned aspect, the voltage applied to the nonselected memory cell in the access may alternatively be substantially half a voltage applied to the selected memory cell in the write operation.

The memory according to the aforementioned aspect preferably further comprises a sensing part for determining data of the memory cells on the basis of remanent polarizations of the memory cells in the read operation, and the remanent polarizations subjected to single application of the voltage applied to the nonselected memory cell in the access preferably allow data determination by the sensing part. According to this structure, the sensing part can determine the data of the memory cells also when the memory recovers the memory cells to the remanent polarizations subjected to single application of the voltage applied to the nonselected memory cell in the access, whereby the memory can suppress disappearance of the data in the memory cells.

In the memory according to the aforementioned aspect, the memory cells preferably consist of single ferroelectric capacitors connected between the bit line and the word line. According to this structure, a simple matrix ferroelectric memory can suppress disturbance and inhibit the number of operations from increase also when performing recovery.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

Figure 1:
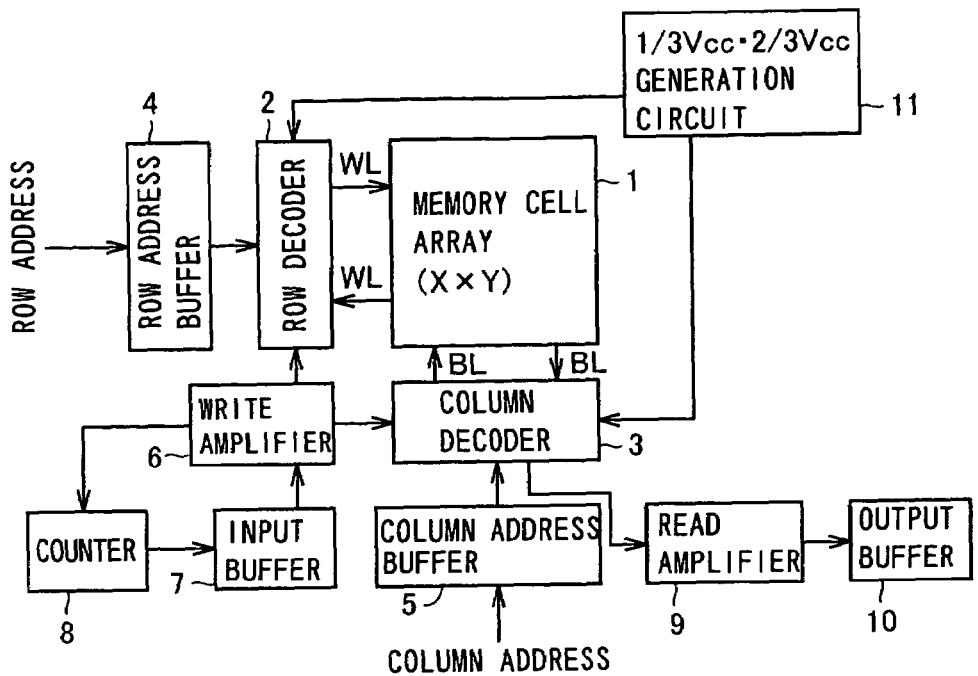
FIG. 1 is a block diagram showing the overall structure of a simple matrix ferroelectric memory according to a first embodiment of the present invention.

The overall structure of a simple matrix ferroelectric memory according to a first embodiment of the present invention is described with reference to FIG. 1. The ferroelectric memory according to the first embodiment comprises a memory cell array 1, a row decoder 2, a column decoder 3, a row address buffer 4, a column address buffer 5, a write amplifier 6, an input buffer 7, a counter 8, a read amplifier 9 consisting of a voltage sense amplifier, an output buffer 10 and a ⅓ Vcc-⅔ Vcc generation circuit 11. The counter 8 is an example of the "counting means" in the present invention. The read amplifier 9 is an example of the "sensing part" in the present invention.

Figure 58:
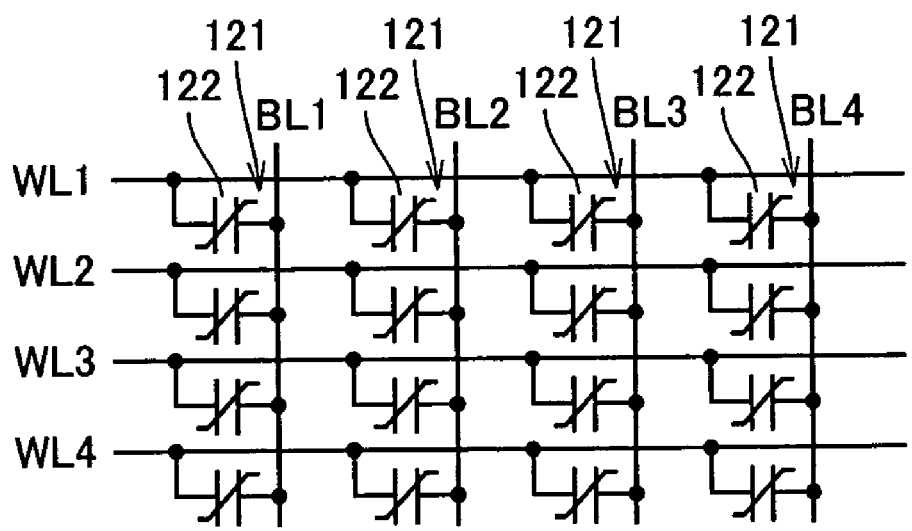
FIG. 58 is an equivalent circuit diagram showing a memory cell array of a conventional simple matrix ferroelectric memory.
Figure 59:
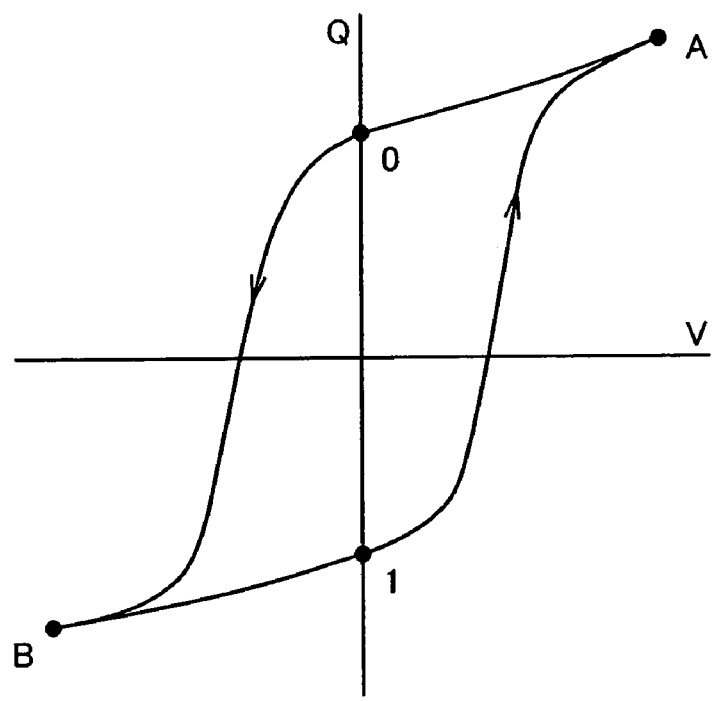
FIG. 59 is a hysteresis diagram for illustrating operations of the conventional simple matrix ferroelectric memory.
Figure 60:
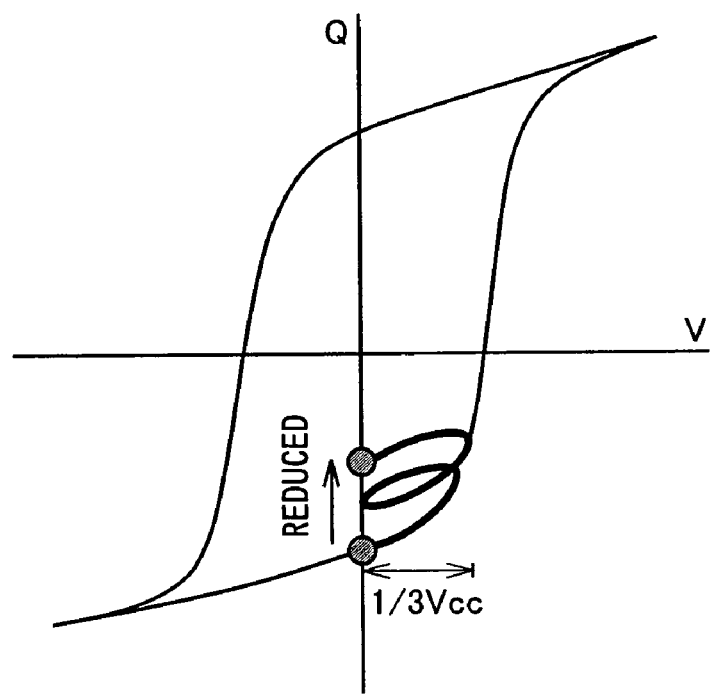
FIG. 60 is a hysteresis diagram for illustrating disturbance in the conventional simple matrix ferroelectric memory.
Figure 61:
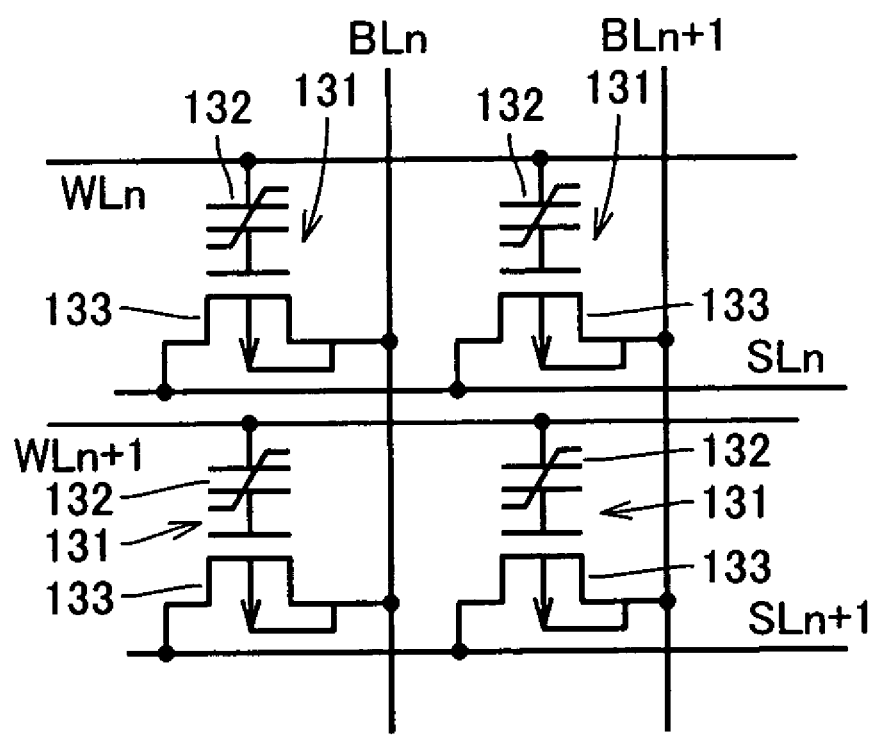
FIG. 61 is an equivalent circuit diagram showing memory cells of a conventional one-transistor ferroelectric memory.

The memory cell array 1 includes a plurality of simple matrix memory cells each consisting of only a ferroelectric capacitor (not shown). In other words, each memory cell of the simple matrix ferroelectric memory according to the first embodiment is constituted of the ferroelectric capacitor (not shown) consisting of a corresponding word line WL and a corresponding bit line BL formed to extend in directions intersecting with each other and a ferroelectric film (not shown) arranged between the word line WL and the bit line BL, similarly to each of memory cell of the conventional simple matrix ferroelectric memory shown in FIG. 58. As shown in FIG. 1, the row decoder 2 and the column decoder 3 are connected to the word lines WL and the bit lines BL of the memory cell array 1 respectively. The ⅓ Vcc·⅔ Vcc generation circuit 11 is connected to the row decoder 2 and the column decoder 3. Thus, the ferroelectric memory can apply voltages ⅓ Vcc and ⅔ Vcc to nonselected word lines WL1, WL3 and WL4 and nonselected bit lines BL1, BL3 and BL4. The row decoder 2 and the column decoder 3 are structured to be capable of applying voltages Vcc (a power supply voltage or a voltage generated on the basis of the power supply voltage) and 0 V to a selected word line WL2 and a selected bit line BL2.

Figure 2:
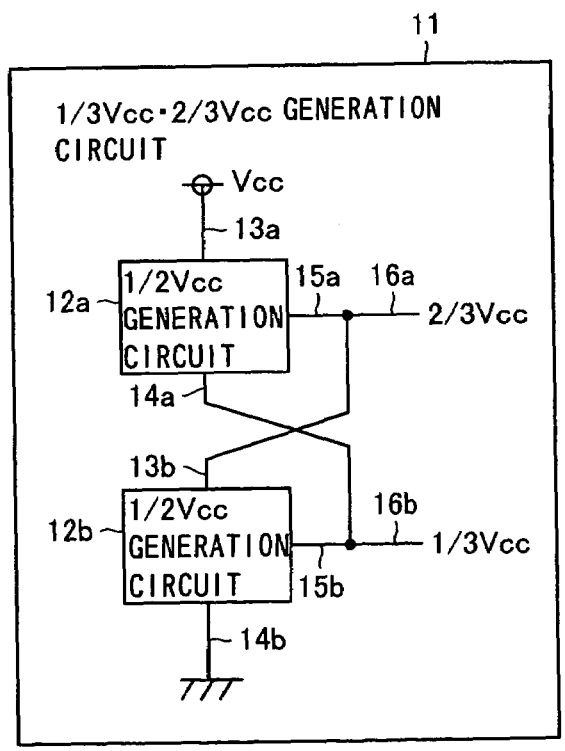
FIG. 2 is a circuit diagram showing the internal structure of a ⅓Vcc·⅔Vcc generation circuit of the ferroelectric memory according to the first embodiment shown in FIG. 1.

As shown in FIG. 2, the ⅓ Vcc·⅔ Vcc generation circuit 11 is constituted by combining two ½ Vcc generation circuits 12a and 12b with each other. Each of the ½ Vcc generation circuits 12a and 12b has two voltage input terminals 13a or 13b and 14a or 14b and a voltage output terminal 15a or 15b. The voltage Vcc is applied to the first voltage input terminal 13a of the first ½ Vcc generation circuit 12a, whose second voltage input terminal 14a is connected to the voltage output terminal 15b of the second ½ Vcc generation circuit 12b. The voltage output terminal 15a of the first ½ Vcc generation circuit 12a is connected to the first voltage input terminal 13b of the second ½ Vcc generation circuit 12b. Further, the voltage 0 V is applied to the second voltage input terminal 14b of the second ½ Vcc generation circuit 14b.

According to this structure, the ferroelectric memory obtains a voltage ⅔ Vcc, i.e., an intermediate voltage between the voltages Vcc and ½ Vcc, from a first voltage output terminal 16a of the ⅓ Vcc·⅔ Vcc generation circuit 11 (the voltage output terminal 15a of the first ½ Vcc generation circuit 12a). The ferroelectric memory also obtains a voltage ⅓ Vcc, i.e., an intermediate voltage between the voltages ⅔ Vcc and 0 V, from a second voltage output terminal 16b of the ⅓ Vcc·⅔ Vcc generation circuit 11 (the voltage output terminal 15b of the second ½ Vcc generation circuit 12b).

Figure 3:
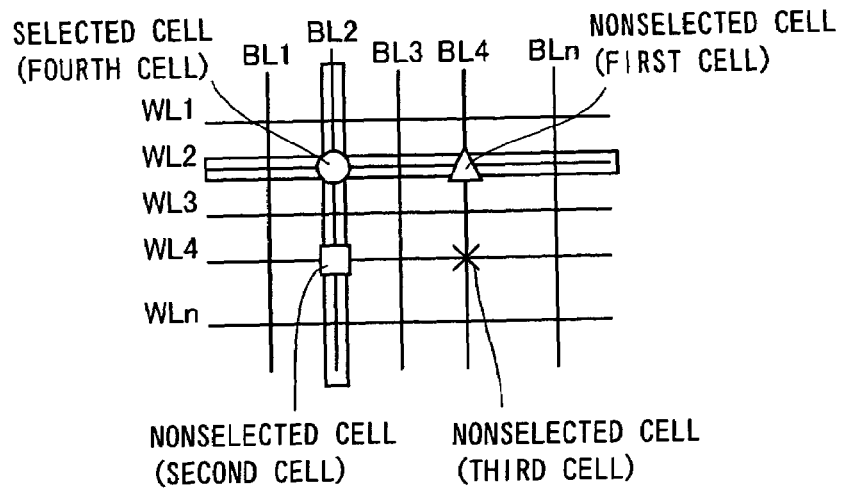
FIG. 3 is a schematic diagram for illustrating a selected cell and nonselected cells of a memory cell array according to the first embodiment of the present invention.

Read-rewrite operations and a write operation of the simple matrix ferroelectric memory according to the first embodiment are now described. In the following description, it is assumed that a fourth memory cell located on the intersection between the word line WL2 and the bit line BL2 shown in FIG. 3 is selected.

The simple matrix ferroelectric memory according to the first embodiment performs operations according to two driving methods A and B. According to the driving method A, the number of necessary operations is reduced while remanent polarizations of nonselected memory cells (hereinafter referred to as nonselected cells) may be deteriorated in the read-rewrite operations or the write operation. According to the driving method B, the number of necessary operations is increased as compared with the aforementioned driving method A while nonselected cells cause no remarkable deterioration of remanent polarizations allowing no determination of data in the read-rewrite operations.

According to the first embodiment, the ferroelectric memory performs the read-rewrite operations and the write operation according to the driving method A in normal access while performing a refresh operation (recovery operation) for recovering the memory cells from deterioration of remanent polarizations accumulated due to the driving method A according to the driving method B after a prescribed frequency of access. The ferroelectric memory according to the first embodiment counts the frequency of normal access according to the driving method A with the counter 8 shown in FIG. 1, and performs the refresh operation every prescribed access frequency counted by the counter 8. The driving method A employed for the normal access and the driving method B employed for the refresh operation are now described.

(Driving Method A: Normal Access Operation)

(1) Read-Rewrite Operations

The read-rewrite operations according to the driving method A are described with reference to FIGS. 1 and 3 to 5. It is assumed that operating periods T1 and T2 shown in FIGS. 4 and 5 are identical to each other (T seconds).

Figure 4:
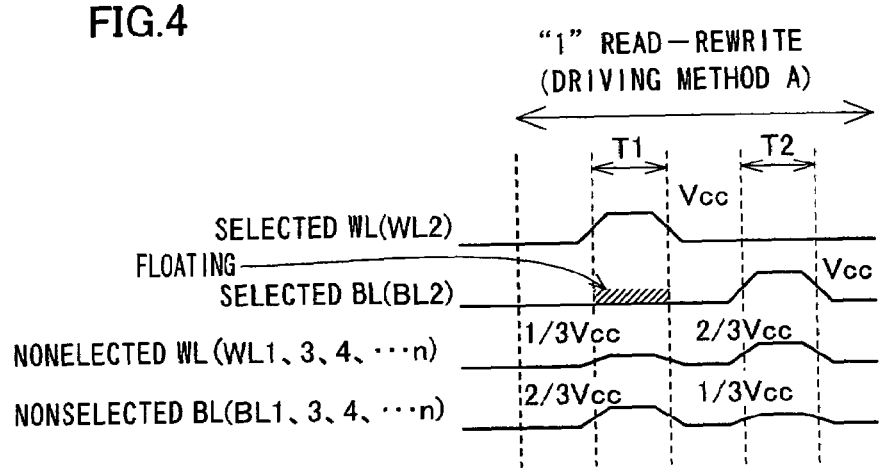
FIGS. 4 and 5 are voltage waveform diagrams for illustrating read-rewrite operations in normal access according to a driving method A in the first embodiment.
Figure 5:
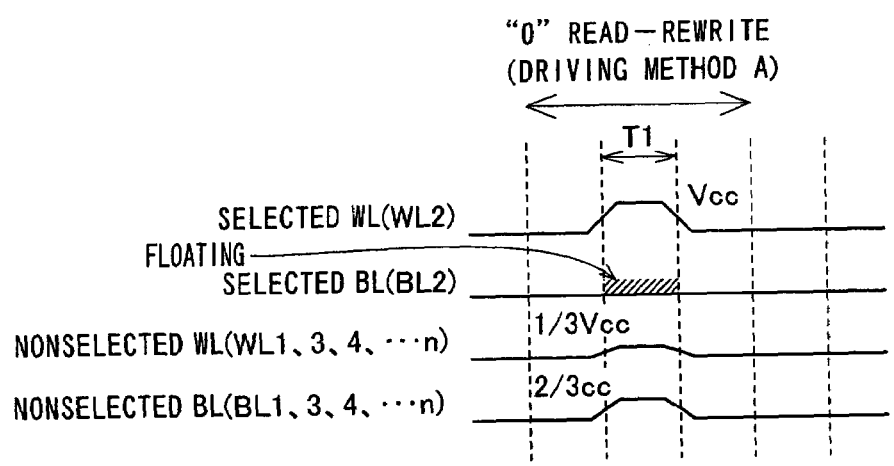

The ferroelectric memory performs the read operation in the period T1 shown in each of FIGS. 4 and 5. First, both of the word lines WL and the bit lines BL are at the voltage 0 V in a standby state. From the standby state, the ferroelectric memory brings the selected bit line BL2 into a floating state. The ferroelectric memory further sets the selected word line WL2, the nonselected word lines WL1, WL3 and WL4 and the nonselected bit lines BL1, BL3 and BL4 to the voltages Vcc, ⅓ Vcc and ⅔ Vcc respectively at the same timing. In this state, the ferroelectric memory senses the voltage of the selected bit line BL2, thereby determining data "0" or "1". The ferroelectric memory determines the data "0" or "1" by comparing the potential of the selected bit line BL2 with a separately generated reference potential and amplifying the difference therebetween by the read amplifier 9 (see FIG. 1) formed by the voltage sense amplifier. In this read operation in the period T1, the ferroelectric memory applies the following potential differences to the first to fourth cells (see FIG. 3) for T seconds respectively:

In the read operation in the period T1, the ferroelectric memory applies the potential difference ⅓ Vcc to the nonselected first cell located on the intersection between the selected word line WL2 and the nonselected bit line BL4 shown in FIG. 3 for T seconds. The ferroelectric memory applies the potential difference between the voltage ⅓ Vcc and the potential (floating potential) of the selected bit line BL2 (⅓ Vcc–floating potential) to the nonselected second cell located on the intersection between the nonselected word line WL4 and the selected bit line BL2 for T seconds. The ferroelectric memory applies the potential difference −⅓ Vcc to the nonselected third cell located on the intersection between the nonselected word line WL4 and the nonselected bit line BL4 for T seconds. The ferroelectric memory applies the potential difference between the voltage Vcc and the potential (floating potential) of the selected bit line BL2 (Vcc–floating potential) to the selected fourth cell located on the intersection between the selected word line WL2 and the selected bit line BL2 for T seconds.

When the nonselected first to third cells deteriorate and recover the remanent polarizations when holding the following data respectively. The wording "deterioration of a remanent polarization" indicates reduction of a quantity of charges stored in the corresponding ferroelectric capacitor, and the wording "recovery of a remanent polarization" indicates increase of the quantity of charges as reduced.

The nonselected first cell deteriorates the remanent polarization when holding the data "1", while recovering the remanent polarization when holding the data "0". The nonselected second cell deteriorates the remanent polarization when holding the data "1", while recovering the remanent polarization when holding the data "0". The nonselected third cell recovers the remanent polarization when holding the data "1", while deteriorating the remanent polarization when holding the data "0". The selected fourth cell deteriorates the remanent polarization when holding the data "1", while holding the remanent polarization of the data "0" when holding the data "0".

After the aforementioned read operation in the period T1, the ferroelectric memory temporarily returns to the standby state. When reading the data "1" from the selected fourth cell in the aforementioned read operation, the ferroelectric memory sets the selected word line WL2, the nonselected word lines WL1, WL3 and WL4, the selected bit line BL2 and the nonselected bit lines BL1, BL3 and BL4 to the voltages 0 V, ⅔ Vcc, Vcc and ⅓ Vcc in the period T2 respectively as shown in FIG. 4, thereby performing the rewrite operation. In this case, the ferroelectric memory applies the following potential differences to the first to fourth cells in the period T2: The ferroelectric memory applies the potential differences −⅓ Vcc, −⅓ Vcc and ⅓ Vcc to the nonselected first, second and third cells respectively. Thus, the nonselected first cell recovers the remanent polarization when holding the data "1", while deteriorating the remanent deterioration when holding the data "0". The nonselected second cell recovers the remanent polarization when holding the data "1", while deteriorating the remanent polarization when holding the data "0". The nonselected third cell deteriorates the remanent polarization when holding the data "1", while recovering the remanent polarization when holding the data "0". The ferroelectric memory applies the potential difference −Vcc to the selected fourth cell, thereby completing the rewrite operation for the data "1".

When reading the data "0" from the selected fourth cell in the aforementioned read operation, on the other hand, the selected fourth cell holds the remanent polarization of the data "0" in the period T1 as described above, and hence the ferroelectric memory performs on rewrite operation in periods subsequent to the period T1. Thus, the nonselected first to third cells hold deterioration and recovery of the remanent polarizations resulting from the read operation in the period T1.

When the ferroelectric memory reads the data "1" from the selected fourth cell in the read-rewrite operations according to the driving method A, as hereinabove described, the nonselected first to third cells cause single deterioration and single recovery of the remanent polarizations respectively, whereby the remanent polarizations remain unchanged. When the ferroelectric memory reads the data "0" from the selected fourth cell, on the other hand, the remanent polarizations are deteriorated when the nonselected first cell holds the data "1", the nonselected second cell holds the data "1" and the nonselected third cell holds the data "0" respectively. When the ferroelectric memory repeats the read operation for the data "0" according to the driving method A, therefore, the nonselected first, second and third cells holding the data "1", "0" and "0" respectively accumulate deterioration of the remanent polarizations.

(2) Write Operation

The write operation according to the driving method A is described with reference to FIGS. 3 and 6.

In a standby state, both of the word lines WL and the bit lines BL are at the voltage 0 V. In order to write the data "0" in the selected fourth cell, the ferroelectric memory applies the voltages Vcc, 0 V, ⅓ Vcc and ⅔ Vcc to the selected word line WL2, the selected bit line BL2, the nonselected word lines WL1, WL3 and WL4 and the nonselected bit lines BL1, BL3 and BL4 in the period T1 respectively. Thus, the ferroelectric memory applies the following potential differences to the first to fourth cells (see FIG. 3) in a "0" write operation in the period T1:

In the "0" write operation in the period T1, the ferroelectric memory applies the potential difference ⅓ Vcc to the nonselected first cell. The ferroelectric memory applies the potential difference ⅓ Vcc to the nonselected second cell. The ferroelectric memory applies the potential difference −⅓ Vcc to the nonselected third cell. The ferroelectric memory applies the potential difference Vcc to the selected fourth cell. Thus, the ferroelectric memory writes the data "0" in the fourth cell.

At this time, the nonselected first to third cells deteriorate and recover the remanent polarizations when holding the following data respectively: The nonselected first cell deteriorates the remanent polarization when holding the data "1", while recovering the remanent polarization when holding the data "0". The nonselected second cell deteriorates the remanent polarization when holding the data "1", while recovering the remanent polarization when holding the data "0". The nonselected third cell recovers the remanent polarization when holding the data "1", while deteriorating the remanent polarization when holding the data "0". After the aforementioned "0" write operation in the period T1, the ferroelectric memory temporarily returns to the standby state.

Figure 6:
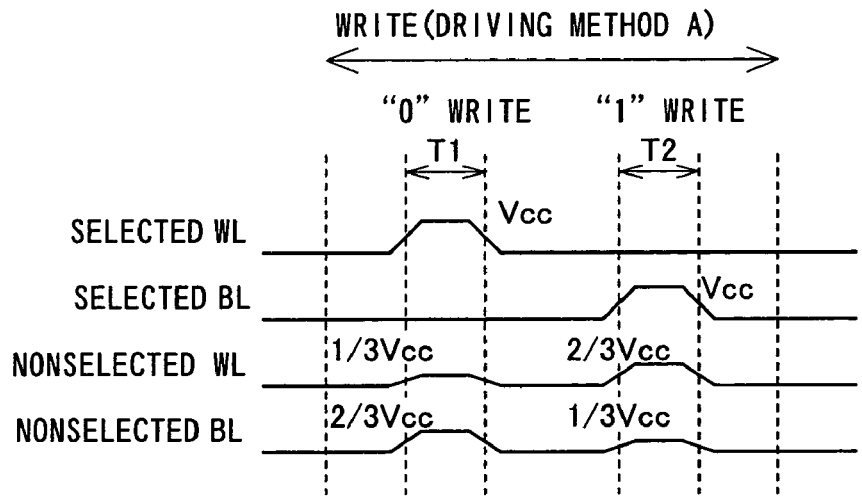
FIG. 6 is a voltage waveform diagram for illustrating a write operation in the normal access according to the driving method A in the first embodiment.

In order to write the data "1" in the selected fourth cell, the ferroelectric memory applies the potential differences 0 V, Vcc, ⅔ Vcc and ⅓ Vcc to the selected word line WL2, the selected bit line BL2, the nonselected word lines WL1, WL3 and WL4 and the nonselected bit lines BL1, BL3 and BL4 in the period T2 shown in FIG. 6 respectively. Thus, the ferroelectric memory applies the following potential differences to the first to fourth cells (see FIG. 3) in the "1" write operation in the period T2 respectively:

The ferroelectric memory applies the potential difference −⅓ Vcc to the nonselected first cell in the "1" write operation in the period T2. The ferroelectric memory applies the potential difference −⅓ Vcc to the nonselected second cell. The ferroelectric memory applies the potential difference ⅓ Vcc to the nonselected third cell. The ferroelectric memory applies the potential difference −Vcc to the selected fourth cell. Thus, the ferroelectric memory writes the data "1" in the fourth cell.

At this time, the nonselected first to third cells deteriorate and recover the remanent polarizations when holding the following data respectively: The nonselected first cell recovers the remanent polarization when holding the data "1", while deteriorating the remanent polarization when holding the data "0". The nonselected second cell recovers the remanent polarization when holding the data "1", while deteriorating the remanent polarization when holding the data "0". The nonselected third cell deteriorates the remanent polarization when holding the data "1", while recovering the remanent polarization when holding the data "0".

In the write operation for writing the data "0" according to the driving method A, the nonselected first, second and third cells deteriorate the remanent polarizations when holding the data "1", "1" and "0" respectively, as hereinabove described. In the operation for writing the data "1", on the other hand, the nonselected first, second and third cells deteriorate the remanent polarizations when holding the data "0", "0" and "1" respectively. When the ferroelectric memory repeats only the operation of writing the data "0" according to the driving method A, therefore, the first and second cells holding the data "1" and the third cell holding the data "0" respectively accumulate deterioration of the remanent polarizations. When the ferroelectric memory repeats only the operation of writing the data "1" according to the driving method A, on the other hand, the first and second cells holding the data "0" and the third cell holding the data "1" respectively accumulate deterioration of the remanent polarizations.

(Driving Method B: Refresh Operation)

The refresh operation (read-rewrite operations) according to the driving method B is described with reference to FIGS. 3 and 7. The ferroelectric memory performs the refresh operation according to the driving method B on all memory cells every prescribed access frequency counted by the counter 8 (see FIG. 1).

(1) Read Operation (T1)

Figure 7:
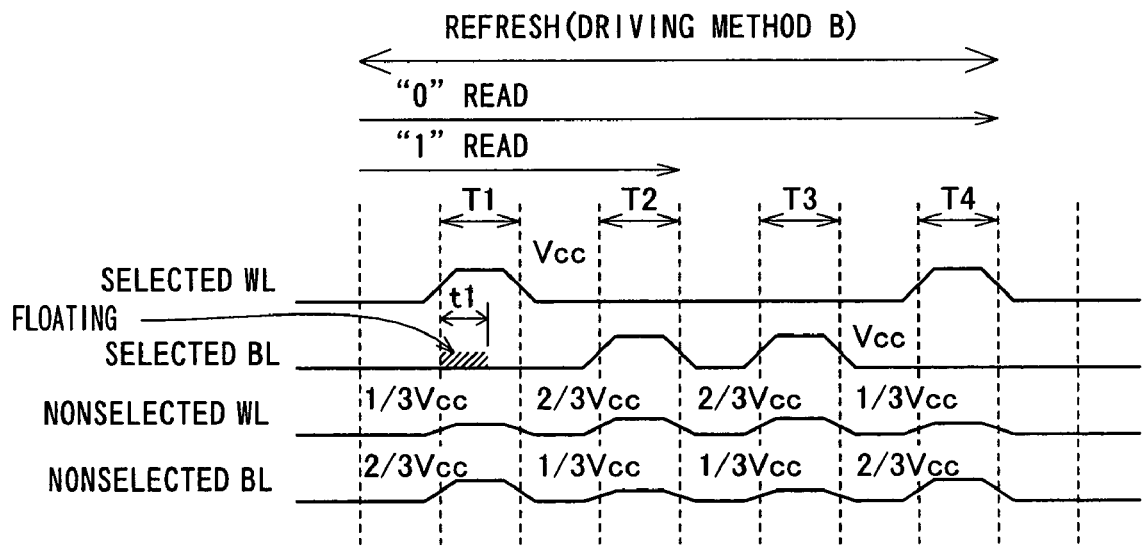
FIG. 7 is a waveform diagram for illustrating a refresh operation (read-rewrite operations) according to a driving method B in the first embodiment.

The ferroelectric memory performs the read operation in the period T1 shown in FIG. 7. From a standby state (0 V), the ferroelectric memory brings the selected bit line BL2 into a floating state. The ferroelectric memory sets the selected word line WL2, the nonselected word lines WL1, WL3 and WL4 and the nonselected bit lines BL1, BL3 and BL4 to the voltages Vcc, ⅓ Vcc and ⅔ Vcc respectively at the same timing. In this state, the ferroelectric memory senses the potential of the selected bit line BL2 thereby determining data "0" or "1". The ferroelectric memory determines the data "0" or "1" similarly to the case of the aforementioned read-rewrite operations according to the driving method A. Further, the ferroelectric memory returns the selected bit line BL2 to the voltage 0 V again after determining the data "0" or "1". It is assumed that the period T1 is for T seconds and the selected bit line BL2 remains in the floating state for t1 seconds.

In this case, the ferroelectric memory applies the potential difference ⅓ Vcc to the nonselected first cell (see FIG. 3) for T seconds. The ferroelectric memory applies the potential difference between the voltage ⅓ Vcc and the potential (floating potential) of the selected bit line BL2 (⅓ Vcc–floating potential) to the nonselected second cell (see FIG. 3) located on the intersection between the nonselected word line WL4 and the selected bit line BL2 for t1 seconds, while applying the potential difference ⅓ Vcc thereto for (T–t1) seconds. The ferroelectric memory applies the potential difference –⅓ Vcc to the nonselected third cell (see FIG. 3) located on the intersection between the nonselected word line WL4 and the nonselected bit line BL4 for T seconds. The ferroelectric memory applies the potential difference between the voltage Vcc and the potential of the selected bit line BL2 to the selected fourth cell (see FIG. 3) located on the intersection between the selected word line WL2 and the selected bit line BL2 for t1 seconds, and thereafter applies the potential difference Vcc thereto for (T–t1) seconds.

It is assumed that the aforementioned time of t1 seconds is set sufficiently short so that the change of the remanent polarization resulting from the potential difference between the voltage ⅓ Vcc and the potential of the selected bit line BL2 applied to the nonselected second cell located on the intersection between the nonselected word line WL4 and the selected bit line BL2 for t1 seconds is sufficiently small as compared with the change of the remanent polarization resulting from the potential difference ⅓ Vcc applied for (T1–t1) seconds while the change of the remanent polarization in the period T1 resulting from application of the potential difference ⅓ Vcc applied for (T1–t1) seconds is substantially equal to changes of the remanent polarization caused in periods T2 to T4 subsequent to the period T1. Thus, the remanent polarizations can be changed in this read operation in the period T1 as follows: The nonselected first cell deteriorates the remanent polarization when holding the data "1", while recovering the remanent polarization when holding the data "0". The nonselected second cell deteriorates the remanent polarization when holding the data "1", while recovering the remanent polarization when holding the data "0". The nonselected third cell recovers the remanent polarization when holding the data "1", while deteriorating the remanent polarization when holding the data "0". The selected fourth cell deteriorates the remanent polarization when holding the data "1", while holding the remanent polarization of the data "0" when holding the data "0".

(2) Data "1n" Rewrite Operation (T2)

After the aforementioned read operation in the period T1, the ferroelectric memory temporarily returns to the standby state. Thereafter the ferroelectric memory sets the selected word line WL2, the nonselected word lines WL1, WL3 and WL4, the selected bit line BL2 and the nonselected bit lines BL1, BL3 and BL4 to the voltages 0 V, ⅔ Vcc, Vcc and ⅓ Vcc in the period T2 respectively. In this case, the ferroelectric memory applies the following potential differences to the first to fourth cells in the period T2 respectively: The ferroelectric memory applies the potential differences –⅓ Vcc, –⅓ Vcc and ⅓ Vcc to the nonselected first, second and third cells for T seconds respectively. Thus, the nonselected first cell recovers the remanent polarization when holding the data "1", while deteriorating the remanent polarization when holding the data "0". The nonselected second cell recovers the remanent polarization when holding the data "1", while deteriorating the remanent polarization when holding the data "0". The nonselected third cell deteriorates the remanent polarization when holding the data "1", while recovering the remanent polarization when holding the data "0".

The ferroelectric memory applies the potential difference –Vcc to the selected fourth cell for T seconds, thereby completing the operation of rewriting the data "1" in this period T2 when reading the data "1" in the read operation in the period T1. When reading the data "1", therefore, the ferroelectric memory terminates the read-rewrite operations at this point of time.

(3) Compensatory Operation for Rewriting Data "0" (T3)

After the aforementioned operation of rewriting the data "1" in the period T2, the ferroelectric memory temporarily returns to the standby state. Thereafter the ferroelectric memory sets the selected word line WL2, the nonselected word lines WL1, WL3 and WL4, the selected bit line BL2 and the nonselected bit lines BL1, BL3 and BL4 to the voltages 0 V, ⅔ Vcc, Vcc and ⅓ Vcc in the period T3 respectively. In this case, the ferroelectric memory applies the following potential differences to the first to fourth cells for T seconds respectively: The ferroelectric memory applies the potential differences –⅓ Vcc, –⅓ Vcc and ⅓ Vcc to the nonselected first, second and third cells for T seconds respectively. The ferroelectric memory applies the potential difference –Vcc to the selected fourth cell for T seconds. According to this application of the potential differences, the nonselected first cell recovers the remanent polarization when holding the data "1", while deteriorating the remanent polarization when holding the data "0". The nonselected second cell recovers the remanent polarization when holding the data "1", while deteriorating the remanent polarization when holding the data "0". The nonselected third cell deteriorates the remanent polarization when holding the data "1", while recovering the remanent polarization when holding the data "0". In the selected fourth cell holding the data "1" due to the operation in the aforementioned period T2, the ferroelectric memory rewrites the data "1".

(4) Data "0" Rewrite Operation (T4)

After the compensatory operation for rewriting the data "0" in the aforementioned period T3, the ferroelectric memory temporarily returns to the standby state. Thereafter the ferroelectric memory sets the selected word line WL2, the nonselected word lines WL1, WL3 and WL4, the selected bit line BL2 and the nonselected bit lines BL1, BL3 and BL4 to the voltages Vcc, ⅓ Vcc, 0 V and ⅔ Vcc in the period T4 respectively. Thus, the ferroelectric memory applies the potential differences ⅓ Vcc, ⅓ Vcc and −⅓ Vcc to the nonselected first, second and third cells for T seconds respectively. The ferroelectric applies the potential difference Vcc to the selected fourth cell. Thus, the nonselected first cell deteriorates the remanent polarization when holding the data "1", while recovering the remanent polarization when holding the data "0". The nonselected second cell deteriorates the remanent polarization when holding the data "1", while recovering the remanent polarization when holding the data "0". The nonselected third cell recovers the remanent polarization when holding the data "1", while deteriorating the remanent polarization when holding the data "0". The ferroelectric memory applies the potential difference Vcc to the selected fourth cell, thereby rewriting the data "0". The ferroelectric memory terminates the series of read-rewrite operations with this operation in the period T4.

In the refresh operation employing the driving method B according to the first embodiment, the ferroelectric memory advances to the operation in the period T2 when reading the data "1" in the read-rewrite operations, while advancing to the operation in the period T4 when reading the data "0". Thereafter the ferroelectric memory shifts to the subsequent read and rewrite operations. In the refresh operation employing the driving method B according to the first embodiment, the frequencies of deterioration and recovery of the remanent resolutions are equal to each other in both cases of reading the data "1" and the data "0". Also when the ferroelectric memory repetitively performs the read-rewrite operations, therefore, the nonselected cells do not accumulate deterioration of the remanent polarizations, not to cause disappearance of finally held data.

In the refresh operation employing the driving method B according to the first embodiment, the ferroelectric memory alternately applies the potential differences ±⅓ Vcc to the nonselected first and third cells while alternately applying the potential difference between the voltage ⅓ Vcc and the potential of the selected bit line BL2 and the potential differences ⅓ Vcc and −⅓ Vcc to the nonselected second cell for canceling deterioration of the remanent polarizations in the nonselected cells resulting from disturbance throughout the read-rewrite operations, thereby efficiently inhibiting the nonselected cells from data disappearance resulting from deterioration of the remanent polarizations.

Changes of the remanent polarizations in the memory cells following the refresh operation according to the driving method B in the ferroelectric memory according to the first embodiment are now described with reference to FIGS. 8 to 13.

Figure 8:
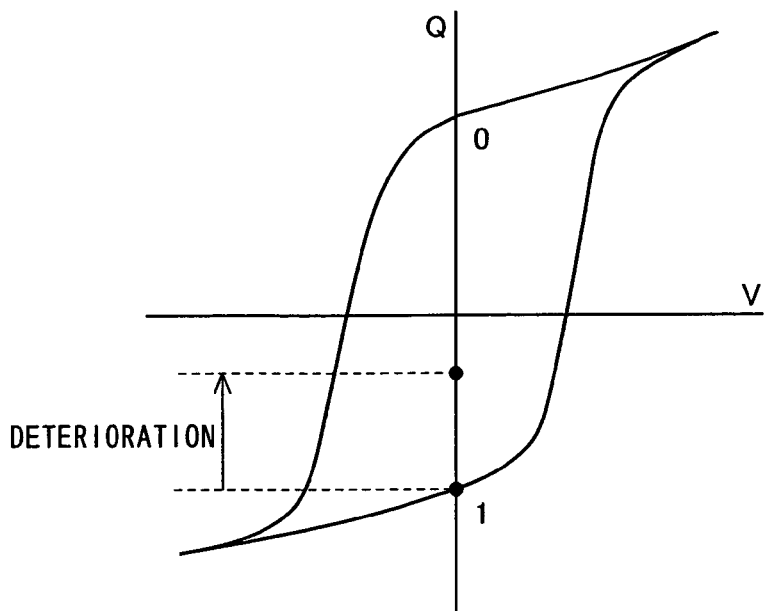
FIG. 8 is a hysteresis diagram of a memory cell accumulating deterioration of a remanent polarization.
Figure 9:
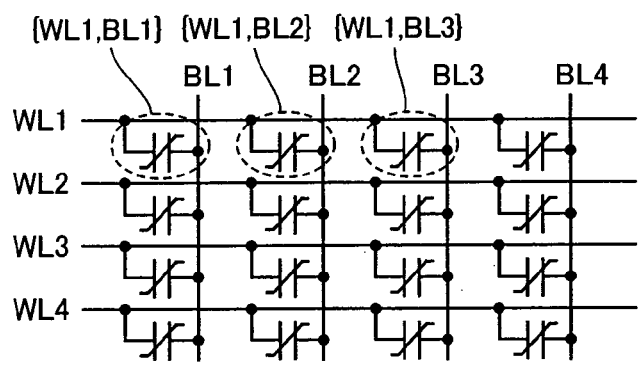
FIG. 9 is an equivalent circuit diagram of refreshed simple matrix memory cells.

As hereinabove described, the nonselected cells accumulate deterioration of the remanent polarizations when the ferroelectric memory repeats normal access according to the driving method A. Thus, the remanent polarizations are remarkably deteriorated from states immediately after data writing (remanent polarizations immediately after the operation of writing the data "1") in some of the memory cells, as shown in FIG. 8. According to the first embodiment, the ferroelectric memory performs the refresh operation according to the aforementioned driving method B, thereby recovering the remanent polarizations remarkably deteriorated as shown in FIG. 8 to those immediately after the operation of writing the data. According to the first embodiment, the ferroelectric memory performs the refresh operation every word line WL. More specifically, the ferroelectric memory successively performs the refresh operation on the memory cells {WL1, BL1}, {WL1, BL2}, {WL1, BL3}, ..., {WL1, BLn} connected to the word line WL1, as shown in FIG. 9. Thereafter the ferroelectric memory successively performs the refresh operation on the memory cells {WL2, BL1}, {WL2, BL2}, {WL2, BL3}, ..., {WL2, BLn} connected to the word line WL2. Thereafter the ferroelectric memory successively performs the refresh operation on the memory cells connected to the word lines WL3 to WLn. Thus, the ferroelectric memory performs the refresh operation on all memory cells.

Figure 10:
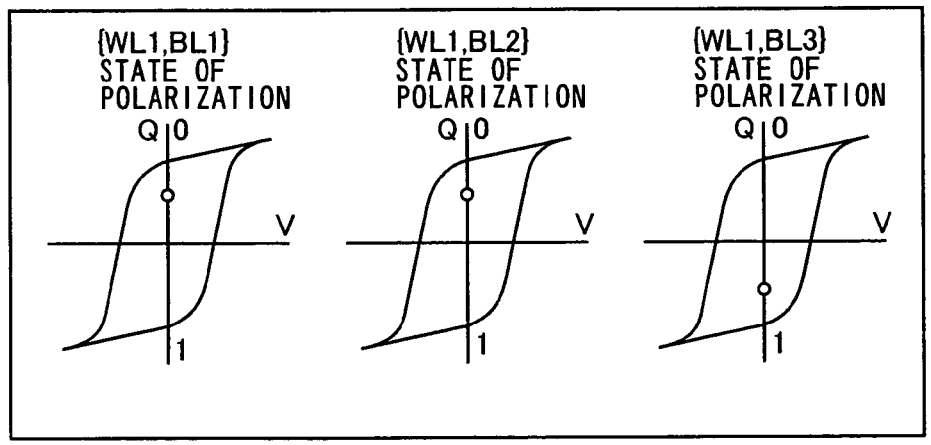
FIG. 10 is a hysteresis diagram showing remanent polarizations of unrefreshed memory cells in the ferroelectric memory according to the first embodiment.

Changes of the remanent polarizations of the memory cells {WL1, BL1}, {WL1, BL2} and {WL1, BL3} having the remanent polarizations deteriorated as shown in FIG. 10 according to the driving method A are now described with reference to a case of performing three refresh operations on these memory cells according to the driving method B.

Figure 11:
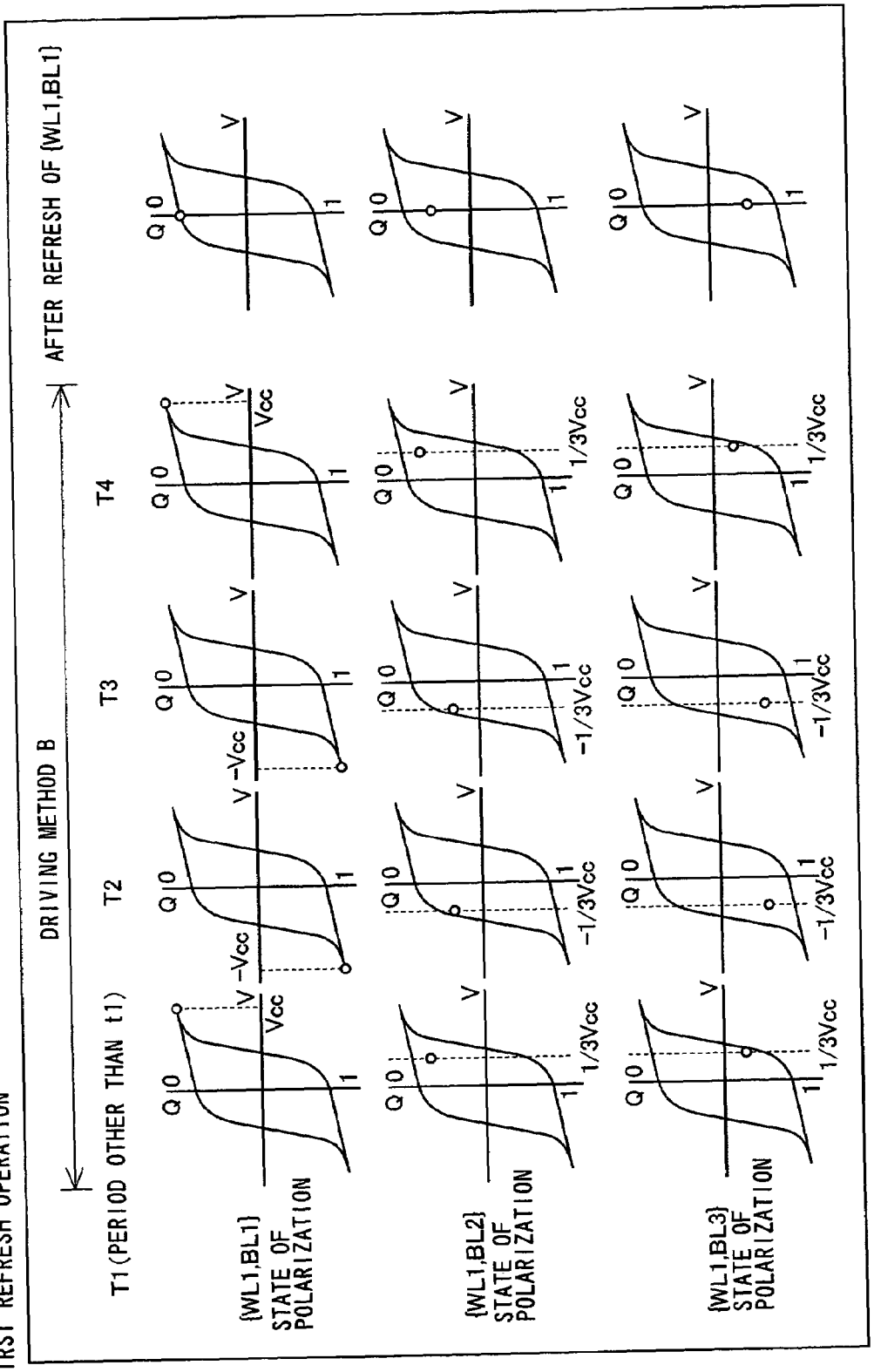
FIG. 11 is a hysteresis diagram showing changes of the remanent polarizations of the memory cells according to the first embodiment following a first refresh operation.

First, the ferroelectric memory selects the memory cell {WL1, BL1} and performs the first refresh operation thereon according to the driving method B. The ferroelectric memory applies the potential differences Vcc, −Vcc, −Vcc and Vcc to the memory cell {WL1, BL1} in periods T1 (other than t1) to T4 respectively, as shown in FIG. 11. After the first refresh operation, therefore, the remanent polarization of the selected memory cell {WL1, BL1} is recovered to the state immediately after the operation of writing the data "0", as shown in FIG. 11. In the periods T1 (T−t1) to T4 of the first refresh operation, the ferroelectric memory applies the potential differences ⅓ Vcc, −⅓ Vcc, −⅓ Vcc and ⅓ Vcc to the nonselected memory cell {WL1, BL2} respectively while applying the potential differences ⅓ Vcc, −⅓ Vcc, −⅓ Vcc and ⅓ Vcc to the nonselected memory cell {WL1, BL3} respectively. Thus, the ferroelectric memory applies the potential differences ±⅓ Vcc of opposite directions to the nonselected memory cells {WL1, BL2} and {WL1, BL3} by the same frequencies respectively, thereby recovering and deteriorating the remanent polarizations by the same frequencies. After the first refresh operation, therefore, the nonselected memory cells {WL1, BL2} and {WL1, BL3} hold the remanent polarizations identical to those before the refresh operation (see FIG. 10).

Figure 12:
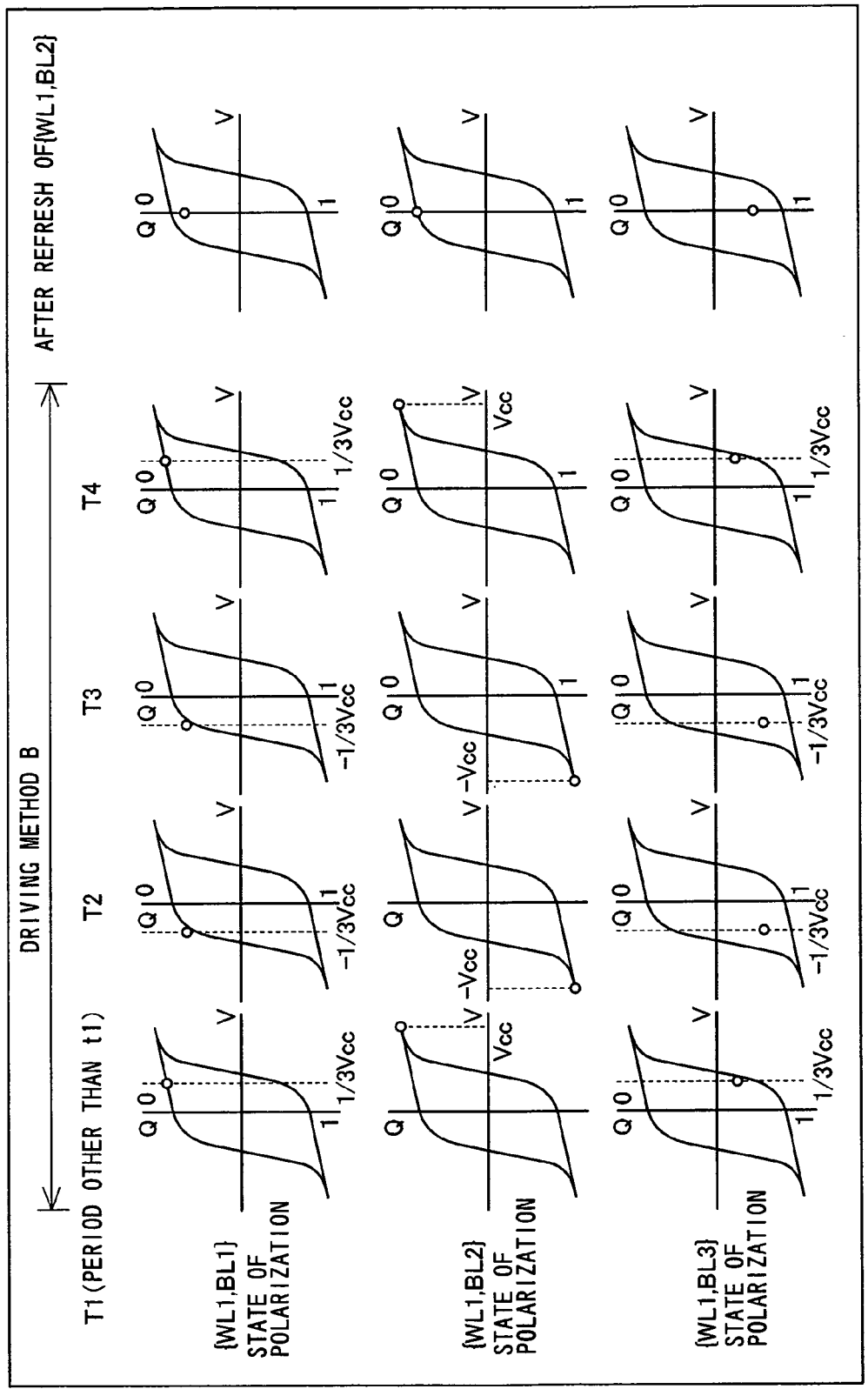
FIG. 12 is a hysteresis diagram showing changes of the remanent polarizations of the memory cells according to the first embodiment following a second refresh operation.

Then, the ferroelectric memory selects the memory cell {WL1, BL2} and performs the second refresh operation thereon. In this second refresh operation, the ferroelectric memory applies the potential differences Vcc, −Vcc, −Vcc and Vcc to the memory cell {WL1, BL2} in periods T1 (other than t1) to T4 respectively, as shown in FIG. 12. After the second refresh operation, therefore, the remanent polarization of the selected memory cell {WL1, BL2} is recovered to the state immediately after the operation of writing the data "0".

In the periods T1 (other than t1) to T4 of the second refresh operation, the ferroelectric memory applies the potential differences ⅓ Vcc, −⅓ Vcc, −⅓ Vcc and ⅓ Vcc to the nonselected memory cells {WL1, BL1} and {WL1, BL3} respectively. Thus, the nonselected memory cell {WL1, BL1} shifts to a remanent polarization corresponding to the potential difference ⅓ Vcc along a hysteresis curve in the period T1 (other than t1) and thereafter returns to the standby state after the operation in the period T1 for returning to the remanent polarization immediately after the operation of writing the data "0", whereby the potential difference applied in the period T1 (other than t1) contributes to neither deterioration nor recovery of the remanent polarization. The nonselected memory cell {WL1, BL1} deteriorates the remanent polarization twice in the periods T2 and T3 and recovers the remanent polarization once in the period T4, thereby deteriorating the remanent polarization once in correspondence to the potential difference −⅓ Vcc after the second refresh operation.

The ferroelectric memory applies the potential differences ±⅓ Vcc of opposite directions to the nonselected memory cell {WL1, BL3} in the periods T1 (other than t1) to T4 by the same frequencies respectively in the second refresh operation, thereby recovering and deteriorating the remanent polarization by the same frequencies. After the second refresh operation, therefore, the nonselected memory cell {WL1, BL3} holds the remanent polarization identical to that after the first refresh operation (see FIG. 11).

Figure 13:
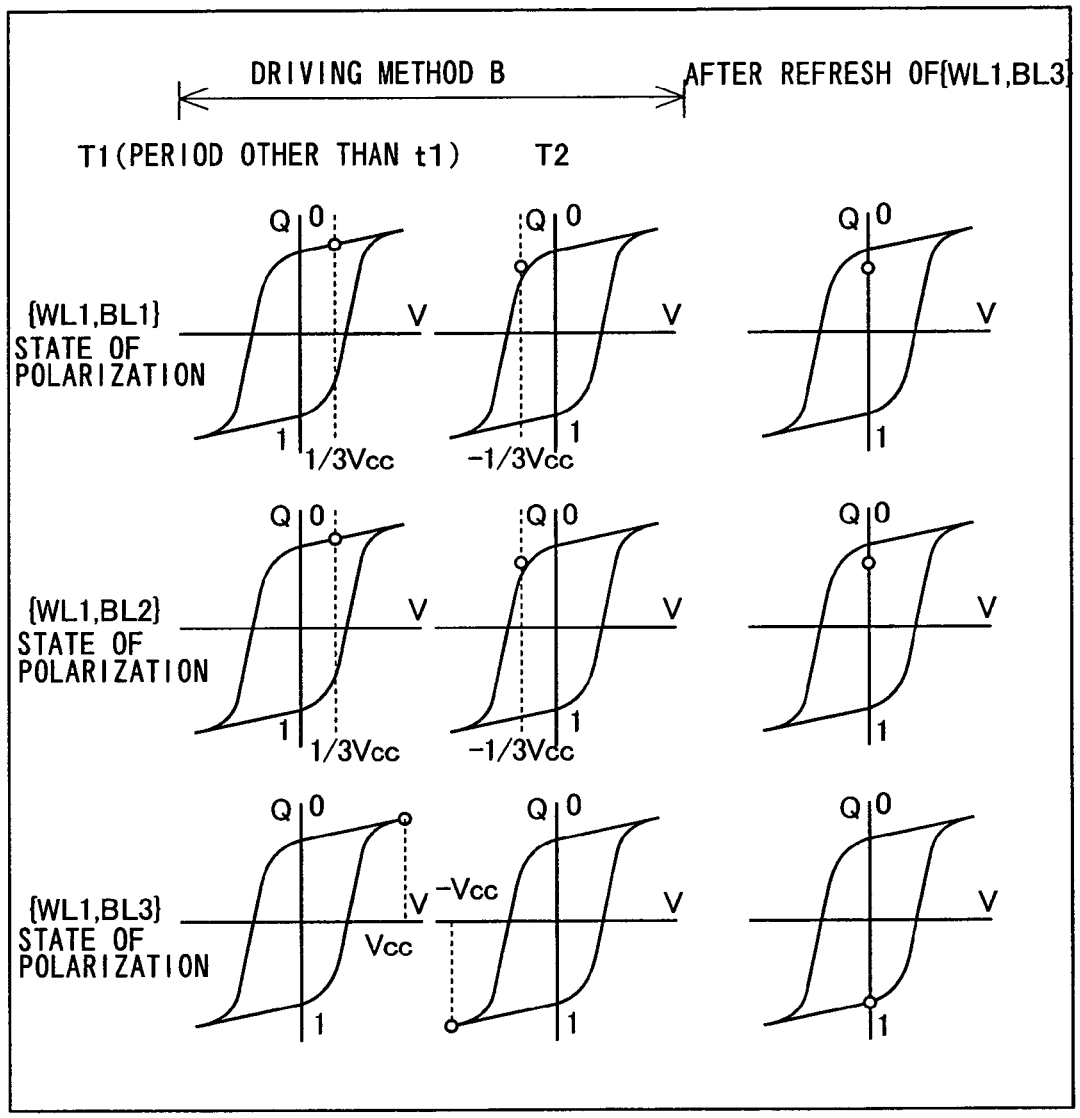
FIG. 13 is a hysteresis diagram showing changes of the remanent polarizations of the memory cells according to the first embodiment following a third refresh operation.

Then, the ferroelectric memory selects the memory cell {WL1, BL3} and performs the third refresh operation thereon. In the third refresh operation, the ferroelectric memory applies the potential differences Vcc and −Vcc to the selected memory cell {WL1, BL3} in the periods T1 (other than t1) and T2 respectively, as shown in FIG. 13. After the third refresh operation, therefore, the remanent polarization of the selected memory cell {WL1, BL3} is recovered to the state immediately after the operation of writing the data "1".

In the periods T1 (other than t1) and T2 of the third refresh operation, the ferroelectric memory applies the potential differences ⅓ Vcc and −⅓ Vcc to the nonselected memory cells {WL1, BL1} and {WL1, BL2} respectively. Thus, the ferroelectric memory applies the potential differences ±⅓ Vcc of opposite directions to the nonselected memory cell {WL1, BL1} in the periods T1 (other than t1) and T2 by the same frequencies respectively, thereby recovering and deteriorating the remanent polarization by the same frequencies. After the third refresh operation, therefore, the nonselected memory cell {WL1, BL1} holds the remanent polarization identical to that after the second refresh operation (see FIG. 12). Further, the nonselected memory cell {WL1, BL2} shifts to a remanent polarization corresponding to the potential difference ⅓ Vcc along a hysteresis curve in the period T1 (other than t1) and thereafter returns to the standby state after the operation in the period T1 for returning to the remanent polarization immediately after the operation of writing the data "0", whereby the potential difference applied in the period T1 (other than t1) contributes to neither deterioration nor recovery of the remanent polarization. The nonselected memory cell {WL1, BL2} deteriorates the remanent polarization once in the period T2, thereby deteriorating the remanent polarization once in correspondence to the potential difference −⅓ Vcc from that immediately after the operation of writing the data "0" after the third refresh operation.

As hereinabove described, the ferroelectric memory can recover the memory cells {WL1, BL1}, {WL1, BL2} and {WL1, BL3} deteriorating the remanent polarizations to those immediately after the data write operation (remanent polarizations immediately after the operation of writing the data "0" or "1") through the first to third refresh operations according to the driving method B. Further, the memory cell {WL1, BL1} once refreshed causes no deterioration of the remanent polarization exceeding the potential difference −⅓ Vcc in the subsequent second and third refresh operations. Even if the memory cell {WL1, BL1} deteriorates the remanent polarization beyond the potential difference −⅓ Vcc, the read amplifier 9 (see FIG. 1) can determine the data from the remanent polarization causing this degree of deterioration, substantially leading to no problem such as disappearance of data. While the ferroelectric memory performs the refresh operation on the arbitrary memory cell {WL1, BL1} shown in FIG. 11, no deterioration of remanent polarizations progresses in the remaining unrefreshed memory cells {WL1, BL2} and {WL1, BL3} shown in FIG. 11, as hereinabove described.

According to the first embodiment, as hereinabove described, the ferroelectric memory, accessing the selected fourth cell according to the driving method A thereby deteriorating the remanent polarizations in the nonselected first to third cells and thereafter successively performing refresh operations on all memory cells according to the driving method B, can recover all memory cells including those causing deterioration of the remanent polarizations to the remanent polarizations immediately after the operation of writing the data "0" or "1" or states causing single deterioration of the remanent polarizations in correspondence to the potential difference −⅓ Vcc (⅓ Vcc), whereby the memory cells can be inhibited from disturbance causing disappearance of data resulting from deterioration of the remanent polarizations.

According to the first embodiment, the ferroelectric memory, performing the refresh operation according to the driving method not every normal access according to the driving method A but after accumulating deterioration of the remanent polarizations in the arbitrary memory cells after a prescribed access frequency, can remarkably reduce the operating time for the refresh operation as compared with a case of performing the refresh operation every access. Thus, the ferroelectric memory can suppress increase of the number of operations also when performing the refresh operation.

With reference to FIGS. 4, 5, 10 and 14 to 23, it is described that no refresh operation may be allowed in a ferroelectric memory according to comparative example performing a refresh operation according to the driving method A and that single polarization deterioration exceeding the potential difference −⅓ Vcc is caused by a subsequent refresh operation in a memory cell once refreshed.

Figure 14:
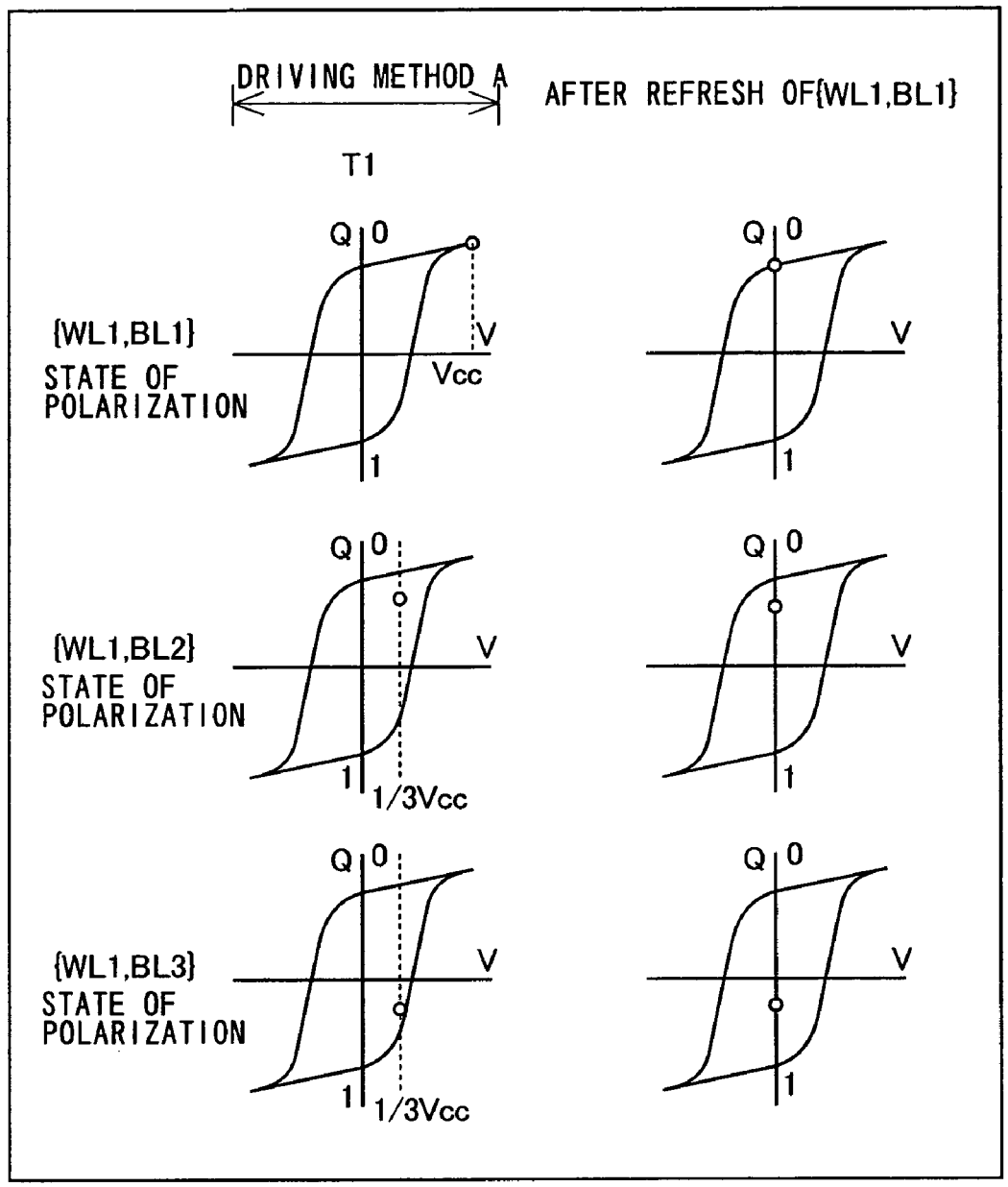
FIGS. 14 to 16 are hysteresis diagrams showing changes of the remanent polarizations of the memory cells according to the first embodiment following a refresh operation according to the driving method A in the first embodiment.

According to comparative example employing the driving method A shown in FIG. 14, the ferroelectric memory performs a first refresh operation with respect to the respective memory cells having the deteriorated remanent polarizations shown in FIG. 10. The ferroelectric memory selects the memory cell {WL1, BL1} for this first refresh operation. At this time, the ferroelectric memory refreshes the selected memory cell {WL1, BL1}, holding the data "0", through the "0" read-rewrite operations shown in FIG. 5. As shown in FIG. 14, the ferroelectric memory applies the potential difference Vcc to the selected memory cell {WL1, BL1} in a period T1. After the first refresh operation, therefore, the remanent polarization of the selected memory cell {WL1, BL1} is recovered to the state immediately after the data "0" write operation, as shown in FIG. 14. In the period T1 of the first refresh operation, the ferroelectric memory applies the potential difference ⅓ Vcc to the nonselected memory cells {WL1, BL2} and {WL1, BL3} respectively. Thus, the nonselected memory cell {WL1, BL2} recovers the remanent polarization, to recover the same after the first refresh operation as compared with the state (see FIG. 10) before the refresh operation. On the other hand, the nonselected memory cell {WL1, BL3} deteriorates the remanent polarization, to deteriorate the same after the first refresh operation as compared with the state (see FIG. 10) before the refresh operation.

Figure 15:
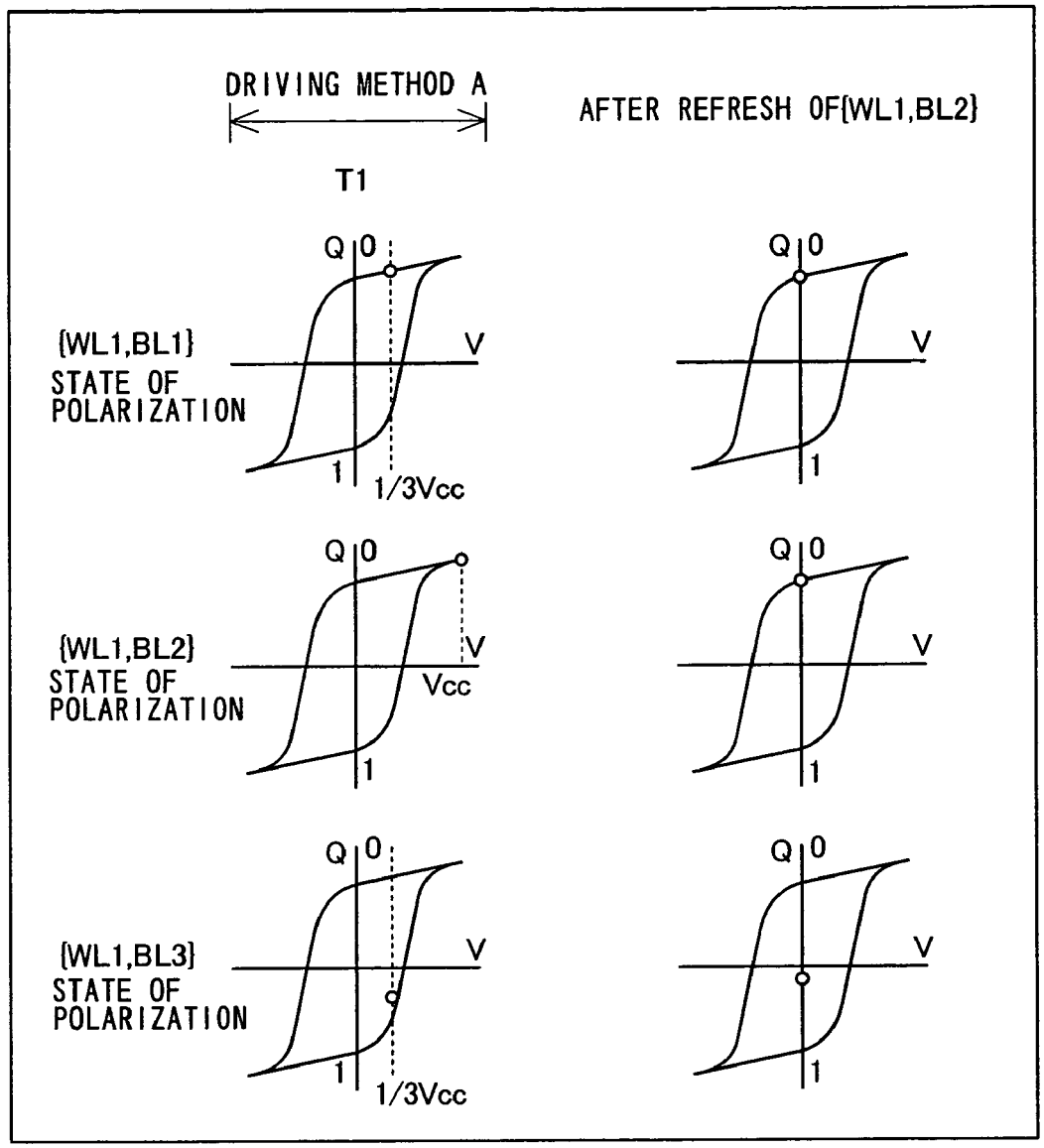

Then, the ferroelectric memory selects the subsequently selected memory cell {WL1, BL2}, for performing a second refresh operation according to the driving method A. At this time, the ferroelectric memory refreshes the selected memory cell {WL1, BL2}, holding the data "0", through the "0" read-rewrite operations shown in FIG. 5. In the second refresh operation, the ferroelectric memory applies a potential difference of about Vcc to the selected memory cell {WL1, BL2} in the period T1, as shown in FIG. 15. After the second refresh operation, therefore, the remanent polarization of the selected memory cell {WL1, BL2} is recovered to the state immediately after the operation of writing the data "0".

In the period T1 of the second refresh operation, the ferroelectric memory applies the potential difference ⅓ Vcc to the nonselected memory cells {WL1, BL1} and {WL1, BL3} respectively. Thus, the nonselected memory cell {WL1, BL1} shifts to a remanent polarization corresponding to the potential difference ⅓ Vcc along a hysteresis curve and thereafter returns to the standby state after the operation in the period T1 for returning to the remanent polarizations immediately after the operation of writing the data "0", whereby the potential difference ⅓ Vcc applied in the period T1 contributes to neither deterioration nor recovery of the remanent polarization. After the second refresh operation, therefore, the nonselected memory cell {WL1, BL1} holds the remanent polarization immediately after the operation of writing the data "0" identically to that after the first refresh operation (see FIG. 14). After the second refresh operation, further, the memory cell {WL1, BL3} deteriorating the remanent polarization in the period T1 further deteriorates the remanent polarization in correspondence to the potential difference ⅓ Vcc once from the state (see FIG. 14) after the first refresh operation.

Figure 16:
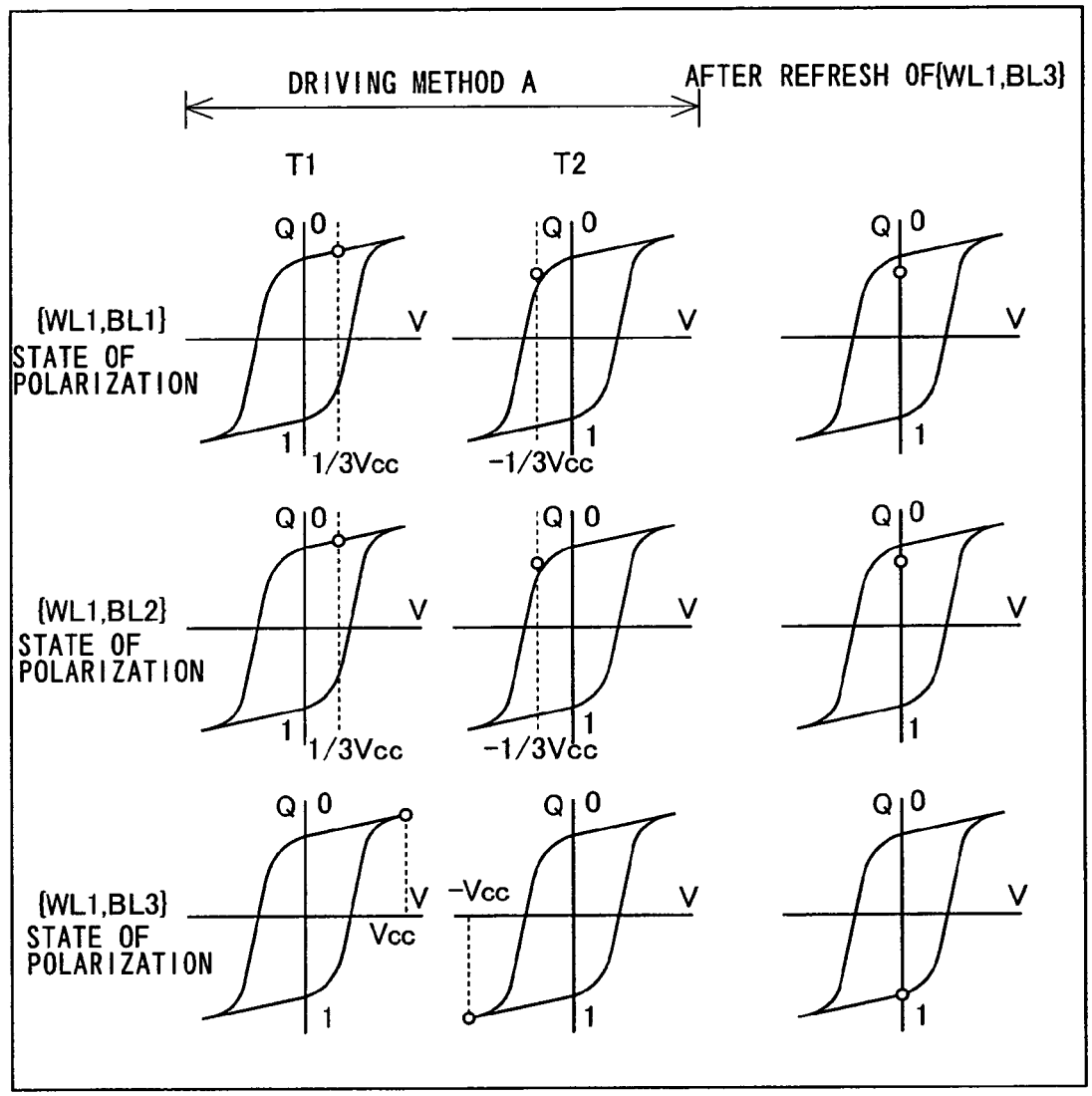

Then, the ferroelectric memory selects the subsequently selected memory cell {WL1, BL3}, for performing a third refresh operation according to the driving method A. At this time, the ferroelectric memory refreshes the selected memory cell {WL1, BL3}, holding the data "1", through the "1" read-rewrite operations shown in FIG. 4. In the third refresh operation, the ferroelectric memory applies the potential differences Vcc and −Vcc to the selected memory cell {WL1, BL3} in periods T1 and T2 respectively, as shown in FIG. 16. After the third refresh operation, therefore, the remanent polarization of the selected memory cell {WL1, BL3} is recovered to the state immediately after the operation of writing the data "1".

In the period T1 of the third refresh operation, the ferroelectric memory applies the potential difference ⅓ Vcc to the nonselected memory cells {WL1, BL1} and {WL1, BL2} respectively. Thus, the nonselected memory cells {WL1, BL1} and {WL1, BL2} shift from the data "0" to remanent polarizations corresponding to the potential difference ⅓ Vcc along hysteresis curves in the period T1 and return to the standby state after the operation in the period T1 thereby returning to the remanent polarizations immediately after the operation of writing the data "0". Therefore, the potential difference ⅓ Vcc applied to the nonselected memory cells {WL1, BL1} and {WL1, BL2} in the period T1 contributes to neither deterioration nor recovery of the remanent polarizations. Thereafter the ferroelectric memory applies the potential difference −⅓ Vcc to the nonselected memory cells {WL1, BL1} and {WL1, BL2} in the period T2 respectively. Thus, the nonselected memory cells {WL1, BL1} and {WL1, BL2} deteriorate the remanent polarizations respectively. After the third refresh operation, therefore, the remanent polarizations of the nonselected memory cells {WL1, BL1} and {WL1, BL2} are deteriorated in correspondence to the potential difference −⅓ Vcc once from the states (see FIG. 15) immediately after the operation of writing the data "0" subsequent to the second refresh operation.

Figure 17:
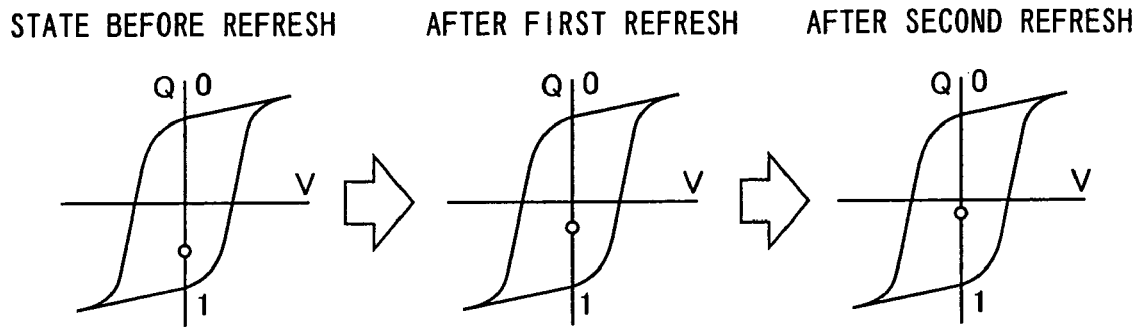
FIG. 17 is a hysteresis diagram for illustrating a problem resulting from the refresh operation according to the driving method A in the first embodiment.

The memory cell {WL1, BL3} subjected to the third refresh operation as hereinabove described deteriorates the remanent polarization in correspondence to the potential difference ⅓ Vcc through the first and second refresh operations respectively, as shown in FIG. 17. After the second refresh operation, therefore, the memory cell {WL1, BL3}, accumulating deterioration of the remanent polarization in correspondence to the potential difference ⅓ Vcc twice, remarkably deteriorates the remanent polarization as compared with that before the refresh operation. The memory cell {WL1, BL3} remarkably deteriorating the remanent polarization may conceivably allow no refresh operation due to incapability of determining whether the data held therein is "0" or "1". When the ferroelectric memory performs the refresh operation according to the driving method A, therefore, data may disappear from unrefreshed memory cells. In the refresh operation according to the driving method B, on the other hand, unrefreshed memory cells accumulate no single deterioration of remanent polarizations exceeding the potential difference −⅓ Vcc as hereinabove described, whereby the ferroelectric memory can inhibit the memory cells from disappearance of data.

Changes of remanent polarizations in the memory cells {WL1, BL1}, {WL1, BL2} and {WL1, BL3}, having remanent polarizations shown in FIG. 19 in unrefreshed states, following the refresh operation according to the driving method A employed in the ferroelectric memory according to comparative example are described with reference to FIGS. 18 to 23.

Figure 18:
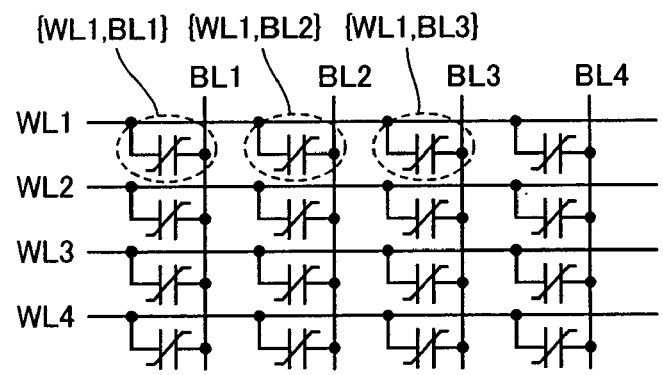
FIG. 18 is an equivalent circuit diagram of refreshed simple matrix memory cells.
Figure 19:
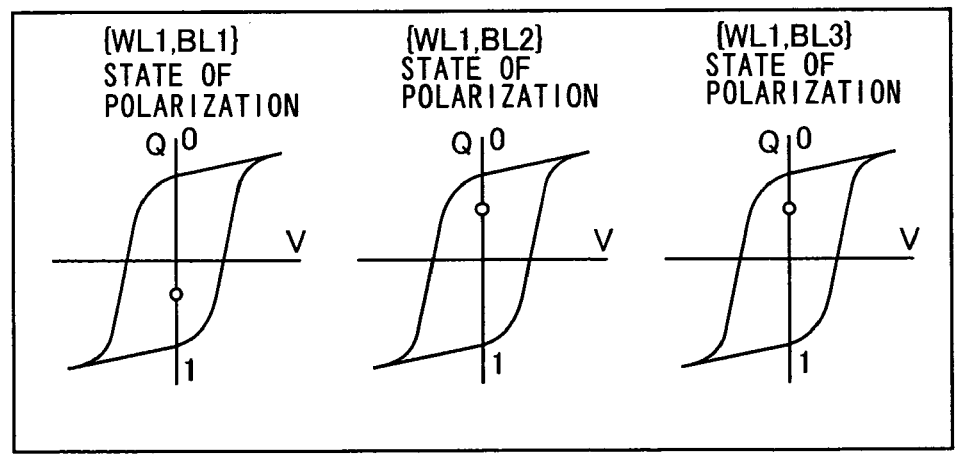
FIG. 19 is a hysteresis diagram showing other remanent polarizations of unrefreshed memory cells in the ferroelectric memory according to the first embodiment.
Figure 20:
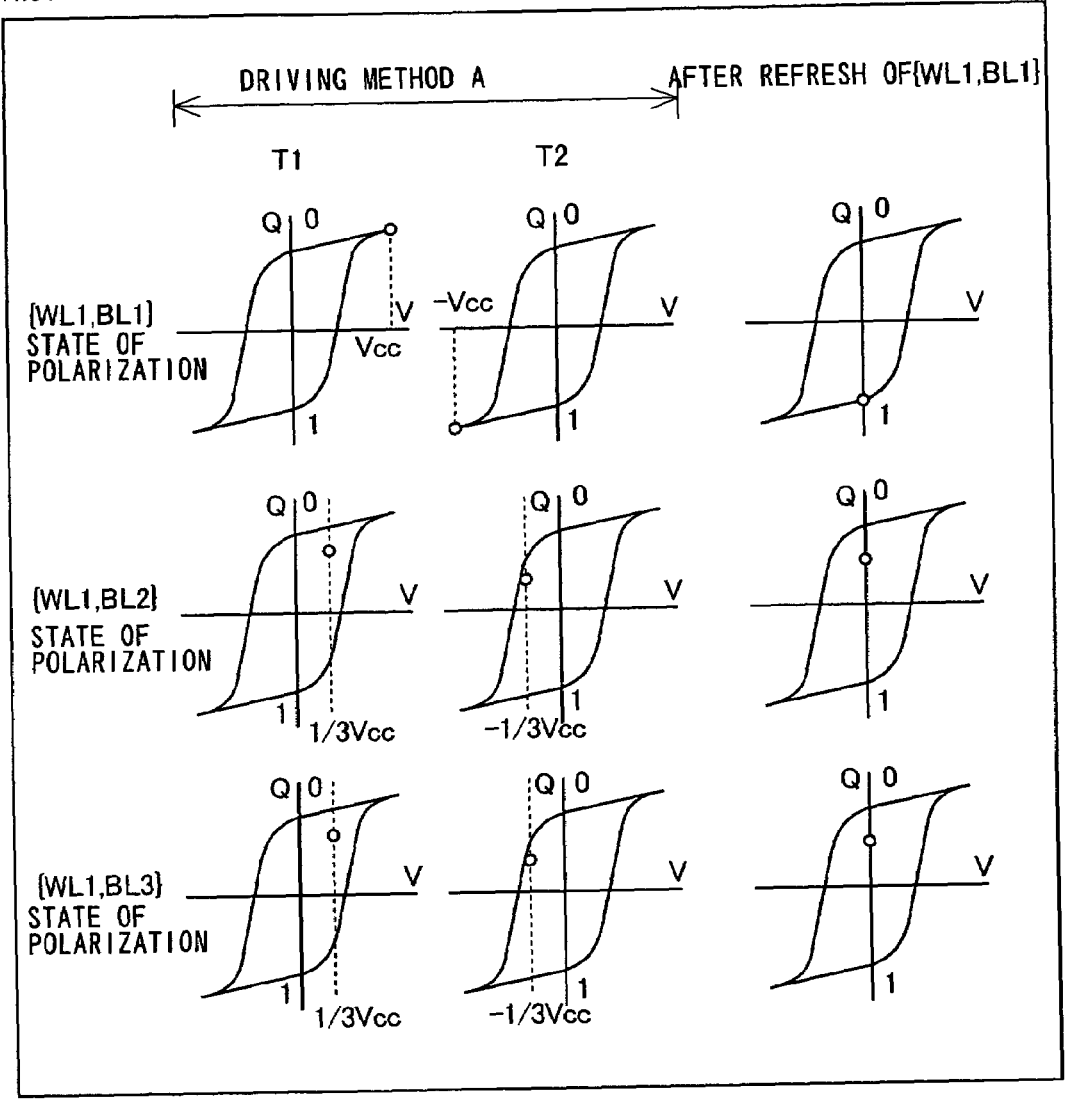
FIGS. 20 to 22 are hysteresis diagrams showing changes of the remanent polarizations after the refresh operation performed on the memory cells having the remanent polarizations shown in FIG. 19 according to the driving method A.

The ferroelectric memory selects the memory cell {WL1, BL1} shown in FIGS. 18 and 19, for performing a first refresh operation according to the driving method A. At this time, the ferroelectric memory refreshes the selected memory cell {WL1, BL1}, holding data "1", through the "1" read-rewrite operations shown in FIG. 4. The ferroelectric memory applies potential differences of about Vcc and −Vcc to the selected memory cell {WL1, BL1} in periods T1 and T2 respectively, as shown in FIG. 20. After the first refresh operation, therefore, the remanent polarization of the selected memory cell {WL1, BL1} is recovered to the state immediately after the operation of writing data "1". In the periods T1 and T2 of the first refresh operation, the ferroelectric memory applies the potential differences ⅓ Vcc and −⅓ Vcc to the nonselected memory cells {WL1, BL2} and {WL1, BL3} respectively. Thus, the nonselected memory cells {WL1, BL2} and {WL1, BL3} recover the remanent polarizations in the period T1, and deteriorate the remanent polarizations in the period T2. Therefore, the nonselected memory cells {WL1, BL2} and {WL1, BL3} recover and deteriorate the remanent polarizations single times respectively, to hold the remanent polarizations identically to those in the unrefreshed states (see FIG. 19) after the first refresh operation.

Figure 21:
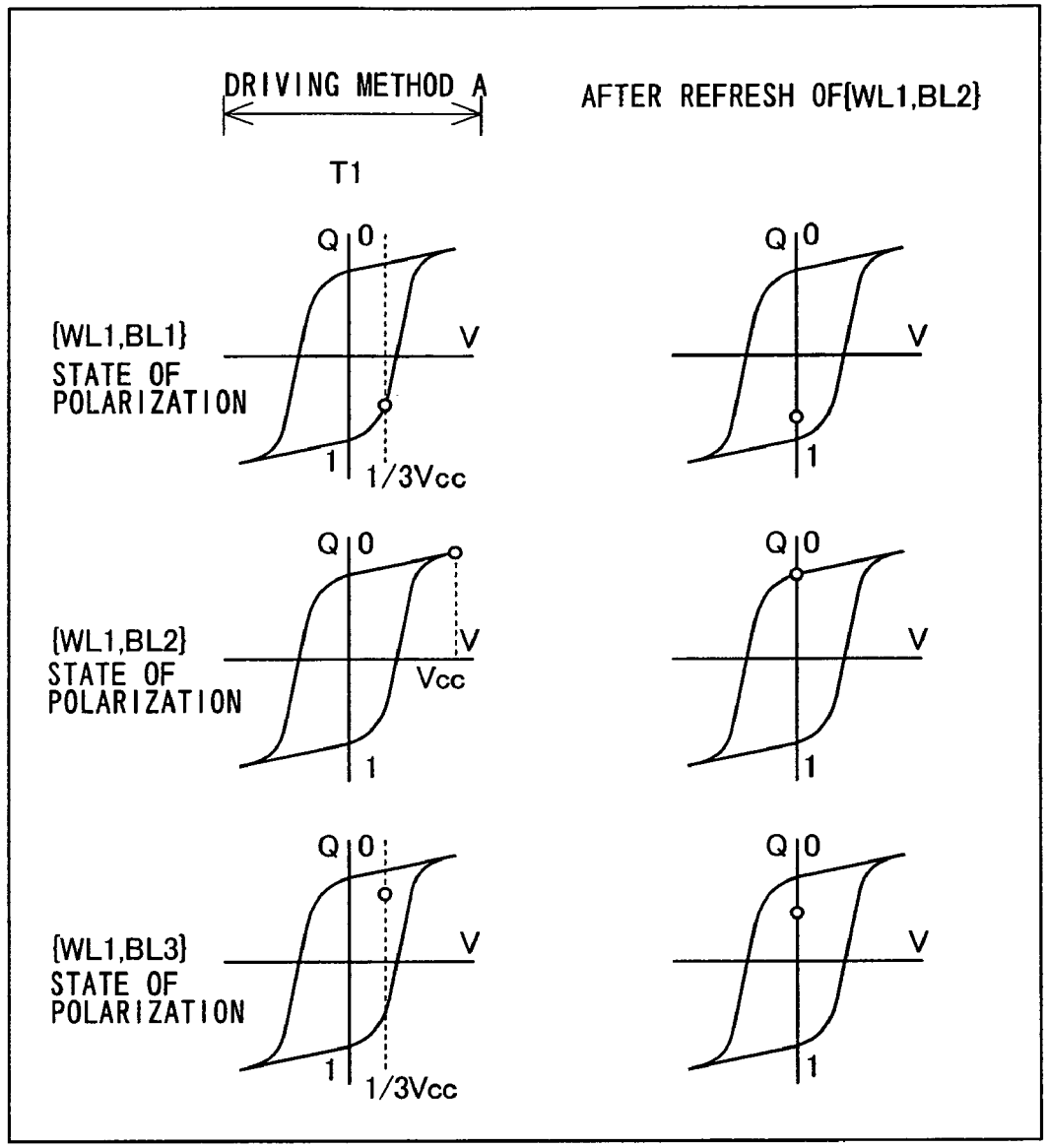

Then, the ferroelectric memory selects the memory cell {WL1, BL2}, for performing a second refresh operation according to the driving method A. At this time, the ferroelectric memory refreshes the selected memory cell {WL1, BL2}, holding data "0", through the "0" write-rewrite operations shown in FIG. 5. In a period T1 of the second refresh operation, the ferroelectric memory applies a potential difference of about Vcc to the selected memory cell {WL1, BL2}, as shown in FIG. 21. After the second refresh operation, therefore, the remanent polarization of the selected memory cell {WL1, BL2} is recovered to the state immediately after the operation of writing the data "0". In the period T1 of the second refresh operation, further, the ferroelectric memory applies the potential difference ⅓ Vcc to the nonselected memory cells {WL1, BL1} and {WL1, BL3} respectively. After the refresh operation, therefore, the nonselected memory cells {WL1, BL1} and {WL1, BL3}, deteriorating the remanent polarizations, deteriorate the remanent polarizations in correspondence to the potential difference ⅓ Vcc once from the states immediately after the operation of writing the data "1" in the first refresh operation (see FIG. 20). After the second refresh operation, further, the nonselected memory cell {WL1, BL3}, recovering the remanent polarization due to the application of the potential difference ⅓ Vcc, recovers the remanent polarization in correspondence to the potential difference ⅓ Vcc once as compared with the state (see FIG. 20) after the first refresh operation.

Figure 22:
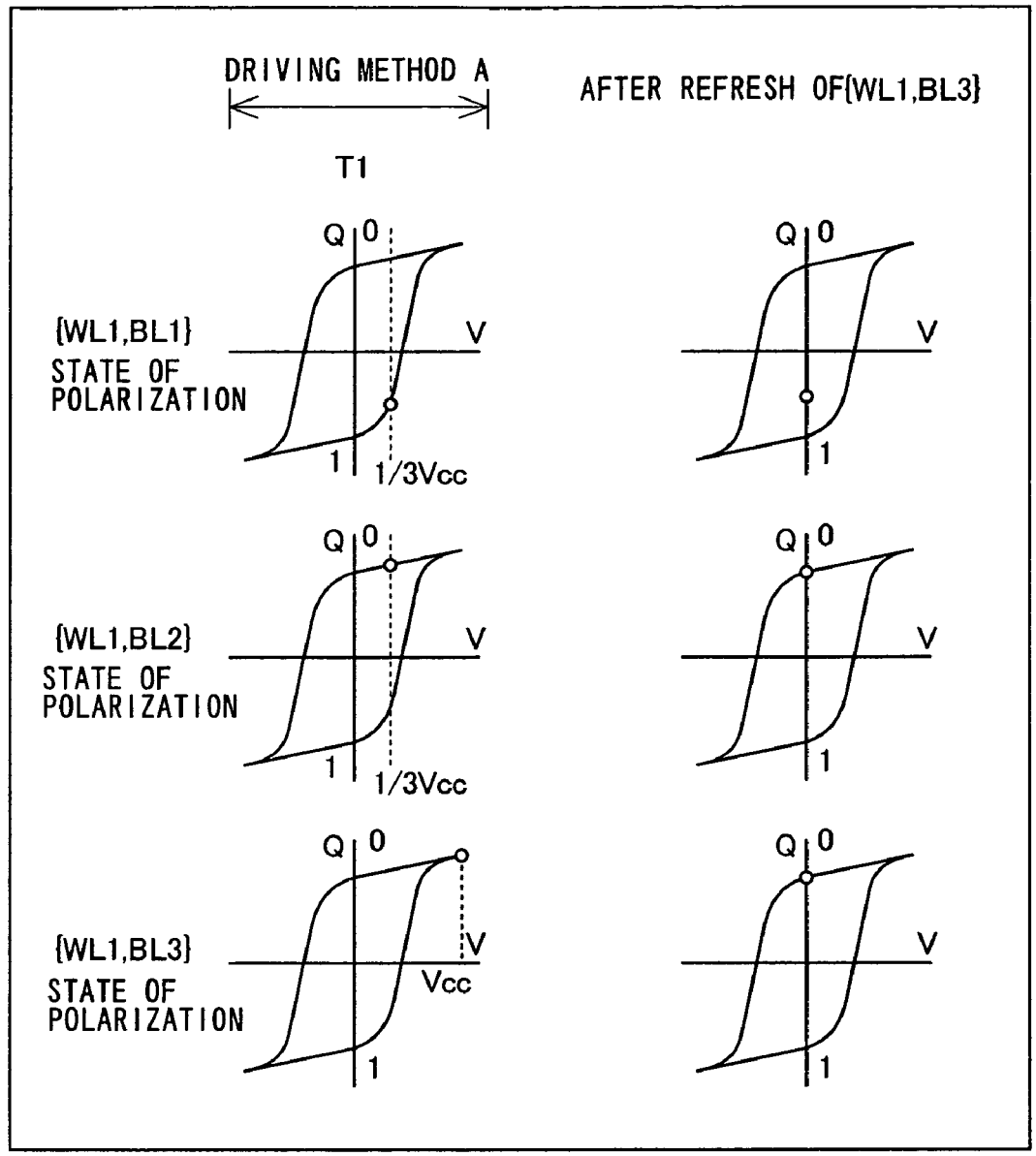

Then, the ferroelectric memory selects the memory cell {WL1, BL3}, for performing a third refresh operation according to the driving method A. At this time, the ferroelectric memory refreshes the selected memory cell {WL1, BL3}, holding data "0", through the "0" read-rewrite operations shown in FIG. 5. In the third refresh operation, the ferroelectric memory applies potential difference of about Vcc to the selected memory cell {WL1, BL3} in a period T1, as shown in FIG. 22. After the third refresh operation, therefore, the remanent polarization of the selected memory cell {WL1, BL3} is recovered to the state immediately after the operation of writing the data "0".

In the period T1 of the third refresh operation, the ferroelectric memory applies the potential difference ⅓ Vcc to the nonselected memory cell {WL1, BL1}. After the third refresh operation, therefore, the nonselected memory cell {WL1, BL1}, deteriorating the remanent polarization, deteriorates the remanent polarization in response to the potential difference ⅓ Vcc once from the state (see FIG. 21) after the second refresh operation. In the period T1 of the third refresh operation, further, the ferroelectric memory applies the potential difference ⅓ Vcc to the nonselected memory cell {WL1, BL2}. Thus, the nonselected memory cell {WL1, BL2} shifts from the state immediately after the operation of writing the data "0" to a remanent polarization corresponding to the potential difference ⅓ Vcc along a hysteresis curve and thereafter returns to the standby state after the operation in the period T1, thereby returning to the remanent polarization immediately after the operation of writing the data "0". Therefore, the potential difference ⅓ Vcc applied to the nonselected memory cell {WL1, BL2} in the period T1 contributes to neither deterioration nor recovery of the remanent polarization. After the third refresh operation, therefore, the nonselected memory cell {WL1, BL2} holds the remanent polarization (see FIG. 21) of the data "0" after the second refresh operation.

Figure 23:
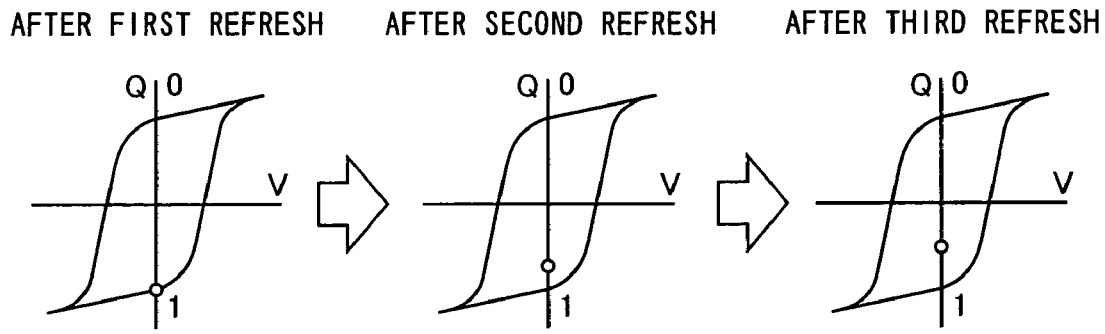
FIG. 23 is a hysteresis diagram for illustrating another problem resulting from the refresh operation according to the driving method A in the first embodiment.

As hereinabove described, the memory cell {WL1, BL1} subjected to the first refresh operation deteriorates the remanent polarization in correspondence to the potential difference ⅓ Vcc through the second and third refresh operations respectively, to accumulate deterioration of the remanent polarization in response to the potential difference ⅓ Vcc twice. Thus, it has been recognized that the remanent polarization is remarkably deteriorated over the first to third refresh operations, as shown in FIG. 23. When the ferroelectric memory performs the refresh operation according to the driving method A, therefore, a memory cell once refreshed disadvantageously progresses deterioration of the remanent polarization later due to subsequent refresh operations on the remaining memory cells. When the ferroelectric memory performs the refresh operation according to the driving method B, on the other hand, the memory cell once refreshed does not deteriorate the remanent polarization beyond the potential difference −⅓ Vcc due to the subsequent refresh operations as hereinabove described, whereby no deterioration of the remanent polarization progresses later.

Second Embodiment

A second embodiment of the present invention is now described. The second embodiment is described with reference to a condition more suitable in a case of employing a driving method according to the aforementioned first embodiment (driving method of performing normal access by a prescribed frequency according to the driving method A and thereafter performing a refresh operation according to the driving method B) than a case of employing only the driving method B through the relation between the total number of read-rewrite operations (normal access) in advance of a refresh operation and the number of refreshed memory cells.

It is assumed that M represents the total number of the read-rewrite operations (driving method A) in advance of the refresh operation (driving method B) and N represents the number of the refreshed memory cells in the case of employing the driving method according to the aforementioned first embodiment. The numbers of operations (frequencies for charging/discharging the memory cells) in the case of employing the driving method according to the aforementioned first embodiment and the case of employing only the driving method B are calculated under the following conditions 1 and 2 respectively. The numbers of operations in the case of employing the driving method according to the aforementioned first embodiment and the case of employing only the driving method B are compared with each other for studying in which case the cycle time (operating time) and power consumption can be further reduced. It is assumed that each of periods T1 to T4 (see FIGS. 4, 5 and 7) of the aforementioned driving methods A and B corresponds to a single number of operations.

(Condition 1)

According to the condition 1, a ferroelectric memory continuously performs only read-rewrite operations for data "0" and thereafter performs a refresh operation. It is assumed that all refreshed memory cells hold the data "0". Under the condition 1, the numbers of operations according to the first embodiment and the case of employing only the driving method B are as follows:

Number of operations according to the first embodiment=M+N×4

Number of operations in the case of employing only the driving method B=M×4

Under the condition 1, therefore, the number of operations according to the first embodiment is smaller than that in the case of employing only the driving method B in the following case:

$N<3M/4$ (Condition 2)

According to the condition 2, the ferroelectric memory continuously performs only read-rewrite operations for data "1" and thereafter performs a refresh operation. It is assumed that all refreshed memory cells hold the data "1". Under the condition 2, the numbers of operations according to the first embodiment and the case of employing only the driving method B are as follows:

Number of operations according to the first embodiment=M×2+N×2

Number of operations in the case of employing only the driving method B=M×2

Under the condition 2, therefore, the number of operations in the case of employing only the driving method B is smaller than that according to the first embodiment.

From the aforementioned results of the conditions 1 and 2, it is understood that the number of operations of the ferroelectric memory can be easily reduced when N<3M/4 by employing the driving method according to the first embodiment as compared with the case of employing only the driving method B. According to the second embodiment, therefore, the ferroelectric memory can reduce the cycle time and power consumption by employing the driving method according to the first embodiment when N<3M/4. When N>3M/4, on the other hand, the number of operations of the ferroelectric memory is reduced by employing only the driving method B as compared with the case of employing the driving method according to the first embodiment. In this case, therefore, the ferroelectric memory may employ only the driving method B.

Third Embodiment

A third embodiment of the present invention is now described with reference to a case of applying the present invention to a case of collectively accessing all memory cells connected to an arbitrary word line WL of a ferroelectric memory dissimilarly to the aforementioned first embodiment.

Figure 24:
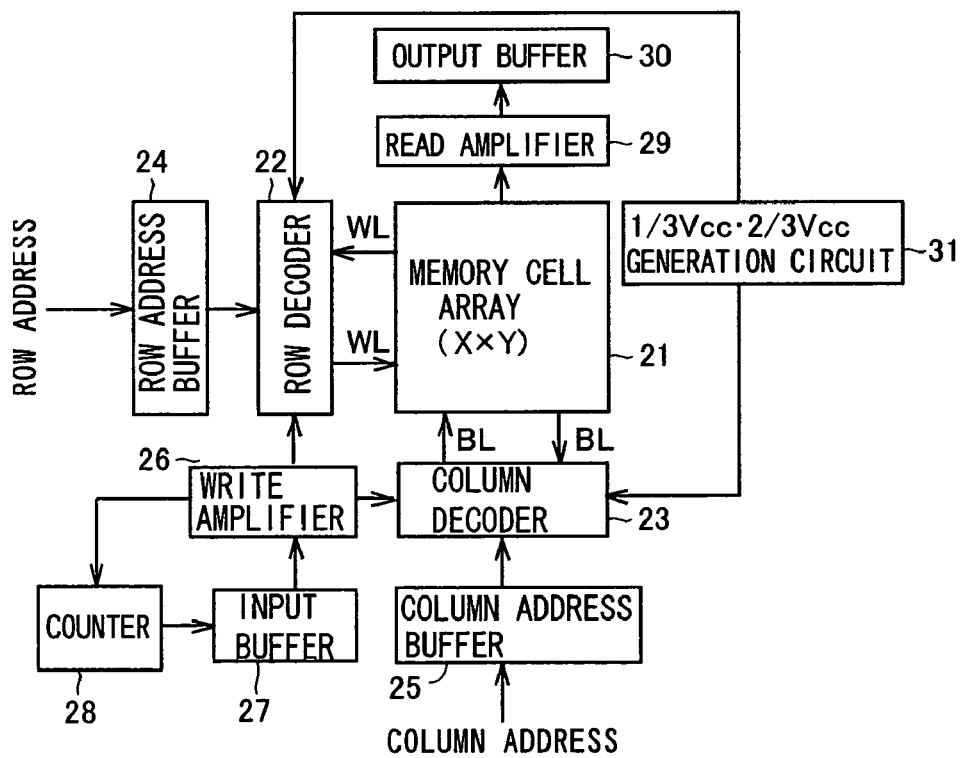
FIG. 24 is a block diagram showing the overall structure of a ferroelectric memory according to a third embodiment of the present invention.

The overall structure of the ferroelectric memory according to the third embodiment is described with reference to FIG. 24. The ferroelectric memory according to the third embodiment comprises a memory cell array 21, a row decoder 22, a column decoder 23, a row address buffer 24, a column address buffer 25, a write amplifier 26, an input buffer 27, a counter 28, a read amplifier 29 consisting of a voltage sense amplifier, an output buffer 30 and a ⅓ Vcc-⅔ Vcc generation circuit 31. The ⅓ Vcc-⅔ Vcc generation circuit 31 is similar in structure to the ⅓ Vcc-⅔ Vcc generation circuit 11 shown in FIGS. 1 and 2. In the ferroelectric memory according to the third embodiment, the read amplifier 29 is directly connected to the memory cell array 21. The remaining structure of the ferroelectric memory according to the third embodiment is similar to that of the ferroelectric memory according to the aforementioned first embodiment.

Figure 25:
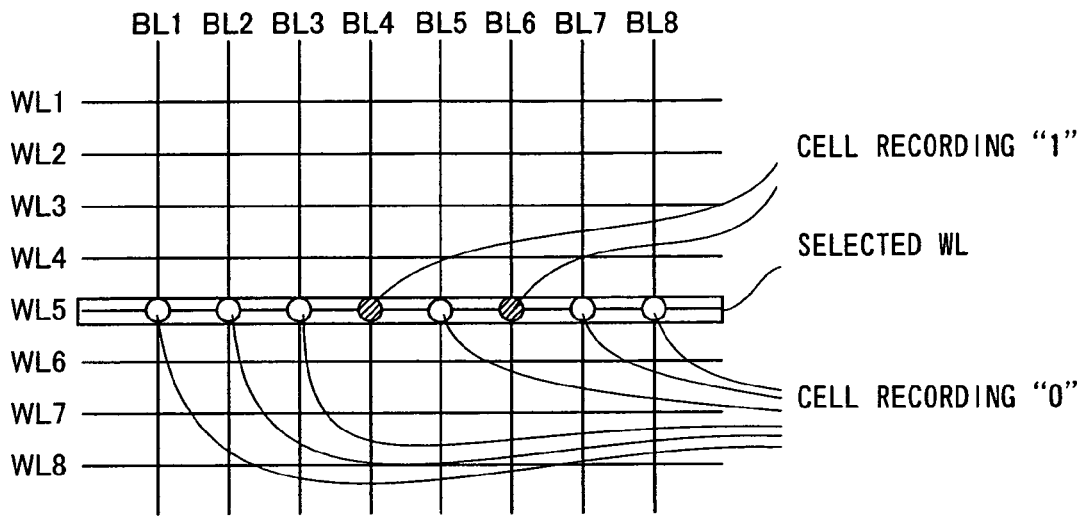
FIG. 25 is a schematic diagram for illustrating data held in memory cells connected to a selected word line in a memory cell array of the ferroelectric memory according to the third embodiment of the present invention.

Operations of the ferroelectric memory according to the third embodiment are described with reference to FIGS. 24 to 29. In the description of the third embodiment, it is assumed that a word line WL5 is selected as shown in FIG. 25. It is also assumed that memory cells connected to bit lines BL4 and BL6 store data "1" while memory cells connected to the remaining bit lines BL1 to BL3, BL5, BL7 and BL8 store data "0" among those connected to the selected word line WL5. It is further assumed that groups of memory cells storing the data "0" form first cell regions and those storing the data "1" form second cell regions among the memory cells connected to the selected word line WL5. It is further assumed that groups of memory cells connected to the bit lines BL4 and BL6 form third cell regions and those connected to the remaining bit lines BL1 to BL3, BL5, BL7 and BL8 form fourth cell regions among memory cells connected to nonselected word lines WL1 to WL4 and WL6 to WL8. In other words, the memory cells of the first and second cell regions connected to the selected word line WL5 are selected cells while those of the third and fourth cell regions connected to the nonselected word lines WL1 to WL4 and WL6 to WL8 are nonselected cells.

The ferroelectric memory according to the third embodiment drives the memory cells according to driving methods C and D. According to the driving method C, the number of necessary operations is reduced while the remanent polarizations of the nonselected cells may be deteriorated in read-rewrite operations or a write operation. According to the driving method D, the number of necessary operations is increased as compared with the aforementioned driving method C while the remanent polarizations of the nonselected cells are not remarkably deteriorated to allow no determination of data in the read-rewrite operations.

According to the third embodiment, the ferroelectric memory performs the read-rewrite operations and the write operation according to the driving method C in normal access, and performs a refresh operation for recovering the remanent polarizations of the memory cells from deterioration, accumulated through the driving method C, according to the driving method D after a prescribed frequency of normal access. According to the third embodiment, the ferroelectric memory counts the frequency of normal access with the counter 28 while performing the refresh operation every prescribed access frequency counted by the counter 28. The driving methods C and D employed for normal access and the refresh operation respectively are now described.

(Driving Method C: Normal Access Operation)
(1) Read-Rewrite Operations

The read-rewrite operations according to the driving method C are described with reference to FIG. 27. It is assumed that operating periods T1 and T2 shown in FIG. 27 are identical to each other (T seconds).

Figure 26:
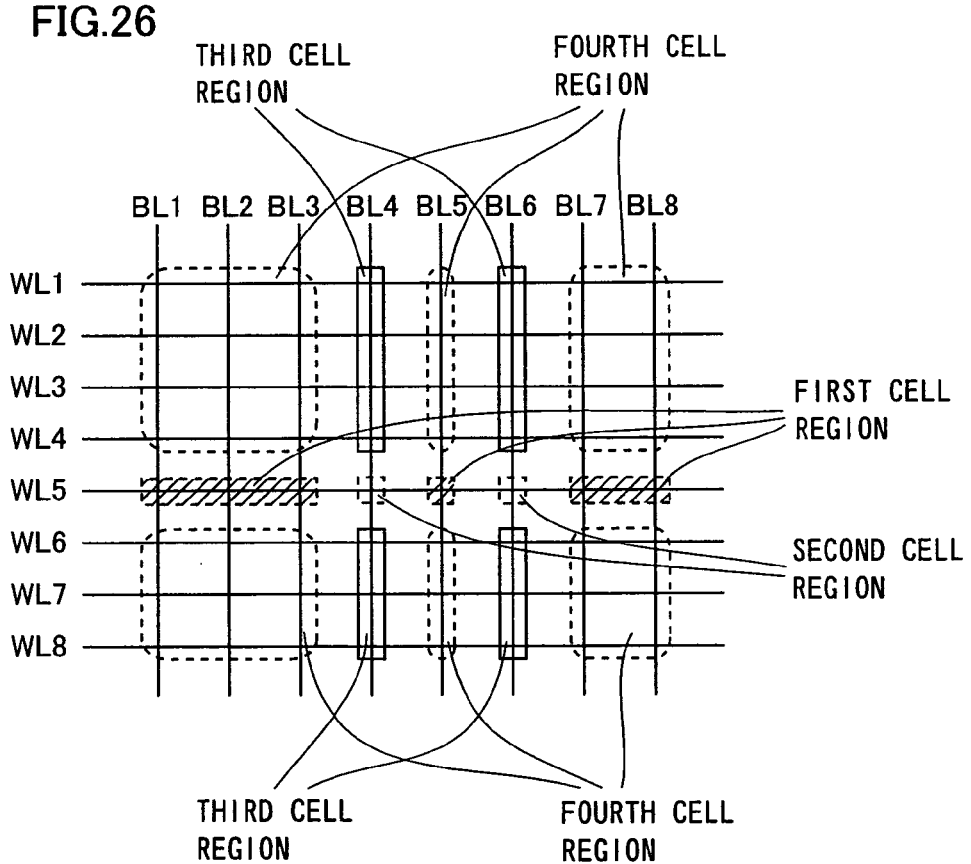
FIG. 26 is a diagram for illustrating definition of cell regions of the memory cell array of the ferroelectric memory according to the third embodiment of the present invention.
Figure 27:
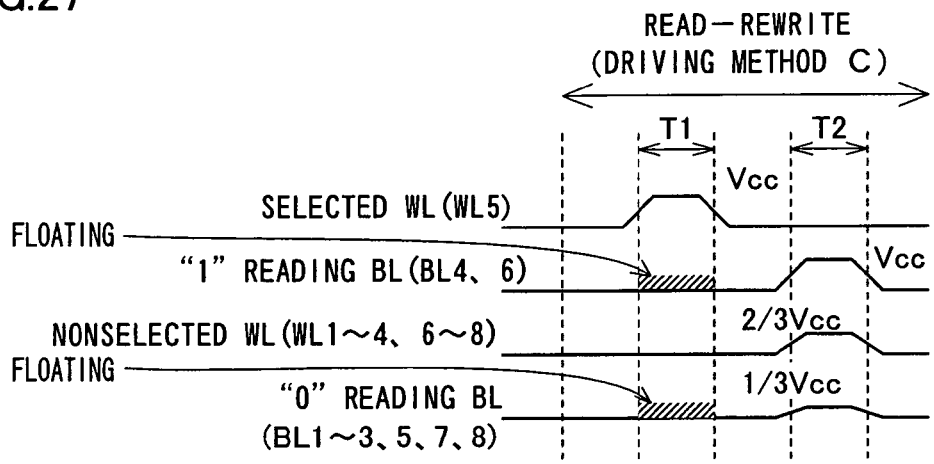
FIG. 27 is a voltage waveform diagram for illustrating read-rewrite operations in normal access according to a driving method C in the third embodiment.

The ferroelectric memory performs the read operation in the period T1 shown in FIG. 27. In a standby state, all word lines WL1 to WL8 and all bit lines BL1 to BL8 are at 0 V. From the standby state, the ferroelectric memory brings all bit lines BL1 to BL8 into floating states. The ferroelectric memory sets the selected word line WL5 to a voltage Vcc at the same timing. In this state, the ferroelectric memory senses the potentials of all bit lines BL1 to BL8, thereby determining data "0" or "1". The ferroelectric memory determines the data "0" or "1" similarly to the ferroelectric memory according to the aforementioned first embodiment. In this read operation in the period T1, the ferroelectric memory applies the following potential differences to the memory cells (see FIG. 26) of the first to fourth cell regions for T seconds respectively:

The ferroelectric memory applies the difference between a potential Vcc and a potential Vr0 ("0" reading potential) (Vcc−Vr0) to the memory cells of the first cell regions for T seconds. The ferroelectric memory applies the difference between the potential Vcc and a potential Vr1 ("1" reading potential) (Vcc−Vr1) to the memory cells of the second cell regions for T seconds. The ferroelectric memory applies a potential difference −Vr1 to the memory cells of the third cell regions for T seconds. The ferroelectric memory applies a potential difference −Vr0 to the memory cells of the fourth cell regions for T seconds.

At this time, the nonselected cells of the third and fourth cell regions deteriorate and recover the remanent polarizations when holding the following data respectively: The nonselected memory cells of the third cell regions recover the remanence polarizations when holding the data "1", while deteriorating the remanent polarizations when holding the data "0". The nonselected memory cells of the fourth cell regions recover the remanent polarizations when holding the data "1", while deteriorating the remanent polarizations when holding the data "0". The data "0" in the selected memory cells of the first cell regions are not destructed through the read operation in the period T1, while the data "1" of the selected memory cells of the second cell regions are destructed so that the ferroelectric memory writes the data "0" therein.

After the aforementioned read operation in the period T1, the ferroelectric memory temporarily returns to the standby state. Thereafter the ferroelectric memory performs a rewrite operation for rewriting the data "1" in the memory cells of the second cell regions in a period T2. In this period T2, the ferroelectric memory sets the selected word line WL5, the nonselected word lines WL1 to WL4 and WL6 to WL8, the bit lines (hereinafter referred to as "1" reading bit lines) BL4 and BL6 connected with the memory cells from which the ferroelectric memory has read the data "1" in the read operation of the period T1 and the bit lines (hereinafter referred to as "0" reading bit lines) BL1 to BL3, BL5, BL7 and BL8 connected with the memory cells from which the ferroelectric memory has read the data "0" in the read operation of the period T1 to voltages ⅔ Vcc, Vcc and ⅓ Vcc respectively. In this case, the ferroelectric memory applies the following potential differences to the memory cells of the first to fourth cell regions for T seconds in the period T2 respectively:

The ferroelectric memory applies the potential difference −⅓ Vcc to the memory cells of the first cell regions. Thus, the memory cells of the first cell regions holding the data "0" deteriorate the remanent polarizations. The ferroelectric memory applies the potential difference −Vcc to the memory cells of the second cell regions for writing the data "1" in the memory cells of the second cell regions, thereby completely rewriting the data "1" destroyed through the read operation in the period T1. The ferroelectric memory applies the potential difference −⅓ Vcc to the memory cells of the third cell regions. Thus, the memory cells of the third cell regions recover the remanent polarizations when holding the data "1", while deteriorating the remanent polarizations when holding the data "0". The ferroelectric memory applies the potential difference ⅓ Vcc to the memory cells of the fourth cell regions. Thus, the memory cells of the fourth cell regions deteriorate the remanent polarizations when holding the data "1", while recovering the remanent polarizations when holding the data "0".

In the ferroelectric memory according to the third embodiment, as hereinabove described, the nonselected memory cells of the third cell regions deteriorate the remanent polarizations twice when holding the data "0" throughout the read-rewrite operations in the normal access according to the driving method C. When the ferroelectric memory repeats the read-rewrite operations according to the driving method C, therefore, the nonselected memory cells of the third cell regions accumulate deterioration of the remanent polarizations.

(2) Write Operation

The write operation according to the driving method C in the normal access is described with reference to FIGS. 26 and 28. The ferroelectric memory performs the write operation through "0" and "1" write operations performed in periods T1 and T2 shown in FIG. 28 respectively. It is assumed that the periods T1 and T2 are identical to each other (T seconds). The ferroelectric memory may perform the operations in the periods T1 and T2 continuously or independently of each other. The respective operations in the write operation are now described. It is assumed that both of the word lines WL1 to WL8 and the bit lines BL1 to BL8 are at 0 V in a standby state.

Figure 28:
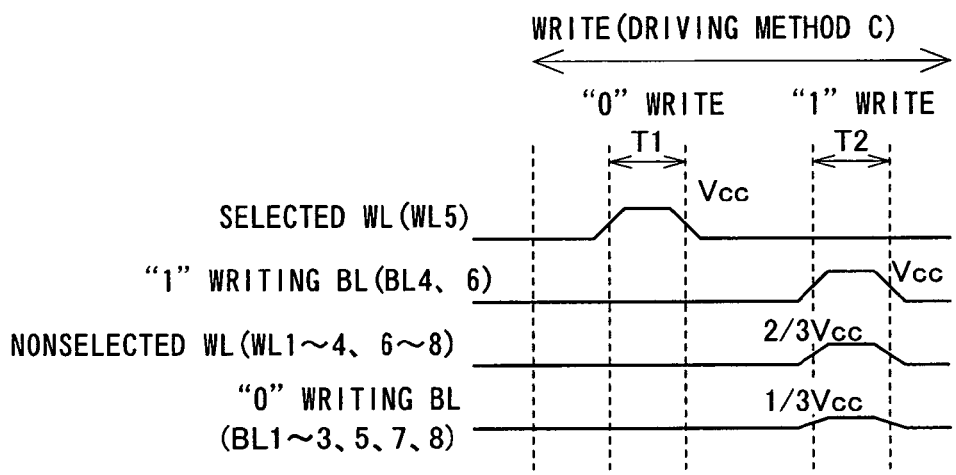
FIG. 28 is a voltage waveform diagram for illustrating a write operation in normal access according to the driving method C in the third embodiment.

In the period T1 shown in FIG. 28, the ferroelectric memory collectively writes data "0" in all memory cells connected to the selected word line WL5. From the standby state, the ferroelectric memory sets only the selected word line WL5 to the voltage Vcc while keeping all bit lines BL1 to BL8 at 0 V. At this time, the ferroelectric memory applies the potential difference Vcc to the selected memory cells of the first and second cell regions. Further, the ferroelectric memory causes no potential differences in the nonselected memory cells of the third and fourth cell regions.

After a lapse of this period T1, the ferroelectric memory sets the voltage of the selected word line WL5 to 0 V and returns to the standby state, thereby completing the collective "0" write operation. In this period T1, the ferroelectric memory writes the data "0" in both of the memory cells of the first and second cell regions having held the data "0" and "1" respectively. The remanent polarizations of the nonselected memory cells of the third and fourth cell regions causing no potential differences remain unchanged.

In the period T2 shown in FIG. 28, the ferroelectric memory writes the data "1". In this period T2, the ferroelectric memory sets the selected word line WL5, the nonselected word lines WL1 to WL4 and WL6 to WL8, the bit lines (hereinafter referred to as "1" writing bit lines) BL4 and BL6 connected with the memory cells of the second cell regions in which the ferroelectric memory must write the data "1" and the bit lines (hereinafter referred to as "0" writing bit lines) BL1 to BL3, BL5, BL7 and BL8 connected with the memory cells of the first cell regions in which the ferroelectric memory must write the data "0" to the voltages 0 V, ⅔ Vcc, Vcc and ⅓ Vcc respectively from the standby state. In this case, the ferroelectric memory applies the potential differences −⅓ Vcc, −Vcc and ⅓ Vcc to the memory cells of the first and third cell regions, the memory cells of the second cell regions and the memory cells of the fourth cell regions for T seconds in the period T2 respectively.

At this time, the nonselected memory cells of the third and fourth cell regions deteriorate and recover the remanent polarizations when holding the following data respectively: The memory cells of the third cell regions recover the remanent polarizations when holding the data "1", while deteriorating the remanent polarizations when holding the data "0". The memory cells of the fourth cell regions deteriorate the remanent polarizations when holding the data "1", while recovering the remanent polarizations when holding the data "0". The selected memory cells of the first cell regions deteriorate the remanent polarizations when the ferroelectric memory performs the "1" write operation in the period T2 continuously to the "0" write operation in the period T1. Further, the memory cells of the first cell regions recover the remanent polarizations when originally holding the data "1". The ferroelectric memory writes the data "1" in the selected memory cells of the second cell regions.

When the ferroelectric memory according to the third embodiment writes the data "1" in the write operation according to the driving method C in the normal access, as hereinabove described, the nonselected memory cells of the third cell regions deteriorate the remanent polarizations if holding the data "0", while the nonselected memory cells of the fourth cell regions deteriorate the remanent polarizations if holding the data "1". When the ferroelectric memory repeats the write operation according to the driving method C in the normal access, therefore, the nonselected memory cells of the third and fourth cell regions holding the data "0" and "1" respectively accumulate deterioration of the remanent polarizations.

(Driving Method D: Refresh Operation)

The read-rewrite operations (refresh operation) according to the driving method D are described with reference to FIGS. 26 and 29.

Figure 29:
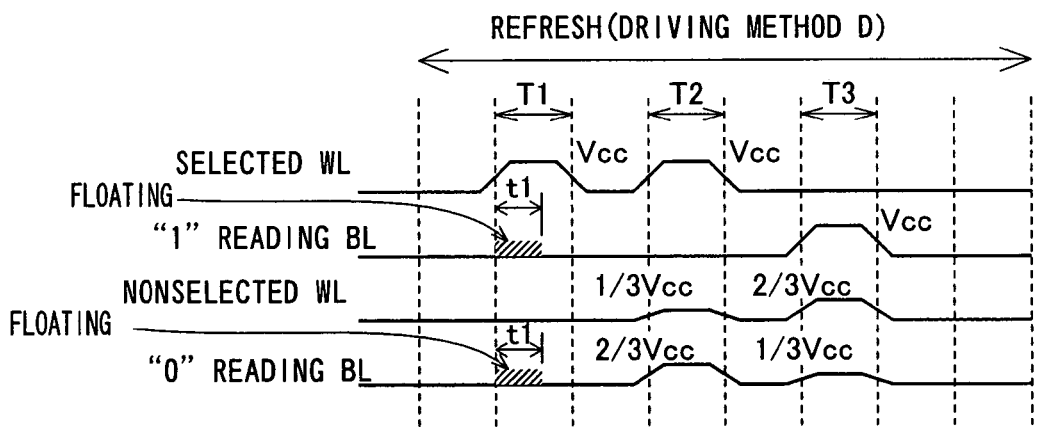
FIG. 29 is a voltage waveform diagram for illustrating a refresh operation (read-rewrite operations) according to a driving method D in the third embodiment.

As shown in FIG. 29, the ferroelectric memory performs the read-rewrite operations (refresh operation) in periods T1, T2 and T3. The periods T1, T2 and T3 are identical to each other (T seconds). The ferroelectric memory may perform operations in the periods T1 to T3 continuously or independently of each other. The ferroelectric memory brings all bit lines BL1 to BL8 into floating states in a period t1, and may start the operation of the period t1 at timing identical to or in advance of that for applying the voltage Vcc to the selected word line WL5 by several nsec. to several 10 nsec. The ferroelectric memory sets the period t1 sufficiently short similarly to the driving method B in the aforementioned first embodiment.

The respective operations in the periods T1 to T3 are now described. It is assumed that the word lines WL1 to WL8 and the bit lines BL1 to BL8 are at 0 V in a standby state.

(1) Read Operation (T1)

The ferroelectric memory reads data in the period T1 shown in FIG. 29. From the standby state, the ferroelectric memory brings all bit lines BL1 to BL8 into floating states while setting the selected word line WL5 to the voltage Vcc at the same timing or in a delay by several nsec. to several 10 nsec. In this state, the ferroelectric memory senses the potentials of all bit lines BL1 to BL8, thereby determining data "0" or "1". The ferroelectric memory determines the data "0" or "1" similarly to the driving method A in the aforementioned first embodiment. In this period t1, the ferroelectric memory applies the following potential differences to the memory cells of the first to fourth cell regions (see FIG. 26) respectively:

The ferroelectric memory applies the potential difference between the potential Vcc and the potential Vr0 ("0" reading potential) (Vcc−Vr0) to the memory cells of the first cell regions in the period t1. The ferroelectric memory applies the difference between the potential Vcc and the potential Vr1 ("1" reading potential) (Vcc−Vr1) to the memory cells of the second cell regions in the period t1. The ferroelectric memory applies the potential difference −Vr1 to the memory cells of the third cell regions in the period t1. The ferroelectric memory applies the potential difference −Vr0 to the memory cells of the fourth cell regions in the period t1.

The period t1 is set so sufficiently short as hereinabove described that deterioration and recovery of the remanent polarizations caused in all memory cells of the third and fourth cell regions connected to the nonselected word lines WL1 to WL4 and WL6 to WL8 in the period t1 can be substantially neglected as compared with deterioration and recovery of the remanent polarizations resulting from the operations performed in the subsequent periods T2 and T3.

After a lapse of the period t1, the ferroelectric memory sets all bit lines BL1 to BL8 to 0 V. This period corresponds to the period T1 other than the period t1, in which the ferroelectric memory applies the following potential difference to the memory cells respectively: The ferroelectric memory applies the potential difference Vcc to the selected memory cells of the first and second cell regions for a period (T1−t1), while causing no potential differences in the nonselected memory cells of the third and fourth cell regions.

After a lapse of the period T1, the ferroelectric memory sets the voltage of the selected word line WL5 to 0 V and returns to the standby state, thereby completing the read operation. In the period T1, the polarizations in the selected memory cells of the first and second cell regions change as follows: The data "0" stored in the memory cells of the first cell regions are not destroyed through the read operation. On the other hand, the data "1" stored in the memory cells of the second cell regions are so destructed that the ferroelectric memory writes the data "0" therein. Therefore, the ferroelectric memory must rewrite the data "1" in the memory cells of the second cell regions. According to the third embodiment, the ferroelectric memory rewrite the data "1" in the periods T2 and T3.

(2) Rewrite Operation (T2 and T3)

From the standby state, the ferroelectric memory sets the selected word line WL5, the nonselected word lines WL1 to WL4 and WL6 to WL8, the "1" reading bit lines BL4 and BL6 and the "0" reading bit lines BL1 to BL3, BL5, BL7 and BL8 to the voltages Vcc, ⅓ Vcc, 0 V and ⅔ Vcc in the period T2 shown in FIG. 29 respectively. In this case, the ferroelectric memory applies the following potential difference to the memory cells of the first to fourth cell regions for T seconds in the period T2 respectively: The ferroelectric memory applies the potential differences ⅓ Vcc, Vcc and −⅓ Vcc to the memory cells of the first and third cell regions, the memory cells of the second cell regions and the memory cells of the fourth cell regions respectively.

After a lapse of the period T2, the ferroelectric memory returns to the standby state as shown in FIG. 29. In the period T2, the polarizations of the memory cells of the first to fourth cell regions change as follows respectively: The memory cells of the first cell regions subjected to the application of the potential difference ⅓ Vcc in the period T2 recover the remanent polarizations. The ferroelectric memory writes the data "0" in the memory cells of the second cell regions, in which the same has written the data "0" in the period T1, again by applying the potential difference Vcc in the period T2. The nonselected memory cells of the third and fourth cell regions recover or deteriorate the remanent polarizations depending on the contents of the data stored therein. More specifically, the memory cells of the third cell regions recover the remanent polarizations when holding the data "0", while deteriorating the remanent polarizations when holding the data "1". The memory cells of the fourth cell regions deteriorate the remanent polarizations when holding the data "0", while recovering the remanent polarizations when holding the data "1".

From the standby state, the ferroelectric memory sets the selected word line WL5, the nonselected word lines WL1 to WL4 and WL6 to WL8, the "1" reading bit lines BL4 and BL6 and the "0" reading bit lines BL1 to BL3, BL5, BL7 and BL8 to the voltages 0 V, ⅔ Vcc, Vcc and ⅓ Vcc in the period T3 shown in FIG. 29 respectively. In this case, the ferroelectric memory applies the following potential differences to the memory cells of the first to fourth cell regions for T seconds in the period T3 respectively: The ferroelectric memory applies the potential differences −⅓ Vcc, −Vcc and ⅓ Vcc to the memory cells of the first and third cell regions, the memory cells of the second cell regions and the memory cells of the fourth cell regions respectively.

After a lapse of the period T3, the ferroelectric memory returns to the standby state thereby completing the series of read-rewrite operations, as shown in FIG. 29. In the period T3, the polarizations of the memory cells of the first to fourth cell regions change as follows respectively: The memory cells of the first cell regions, subjected to the application of the potential difference −⅓ Vcc in the period T3, deteriorate the remanent polarizations. The ferroelectric memory applying the potential difference −Vcc to the memory cells of the second cell regions in the period T3 writes the data "1" therein. Thus, the ferroelectric memory completely rewrites the data "1" destroyed through the read operation. The nonselected memory cells of the third and fourth cell regions recover or deteriorate the remanent polarizations depending on the contents of the data stored therein, similarly to the period T2. More specifically, the memory cells of the third cell regions deteriorate the remanent polarizations when holding the data "0", while recovering the remanent polarizations when holding the data "1". The memory cells of the fourth cell regions recover the remanent polarizations when holding the data "0", while deteriorating the remanent polarizations when holding the data "1".

In the refresh operation employing the driving method D according to the third embodiment, all memory cells of the first, third and fourth cell regions other than those holding the data "1" among those connected to the selected word line WL5 necessarily recover and deteriorate the remanent polarizations single times throughout the read-rewrite operations. When the ferroelectric memory repeats the read-rewrite operations, therefore, no memory cells continuously deteriorate the remanent polarizations.

In the refresh operation employing the driving method D according to the third embodiment, as hereinabove described, the ferroelectric memory applies the voltages ±⅓ Vcc of opposite directions to all memory cells of the first, third and fourth cell regions other than the memory cells holding the data "1" among those connected to the selected word line WL5 single times throughout the read and rewrite operations, thereby suppressing polarization deterioration in the read operation. Thus, the ferroelectric memory can suppress disturbance causing disappearance of the data in all nonselected memory cells of the third and fourth cell regions and the memory cells of the first cell regions holding data "0" among the selected cells.

Changes of the remanent polarizations in the memory cells following the refresh operation employing the driving method D in the ferroelectric memory according to the third embodiment are now described with reference to FIGS. 30 to 33.

Figure 30:
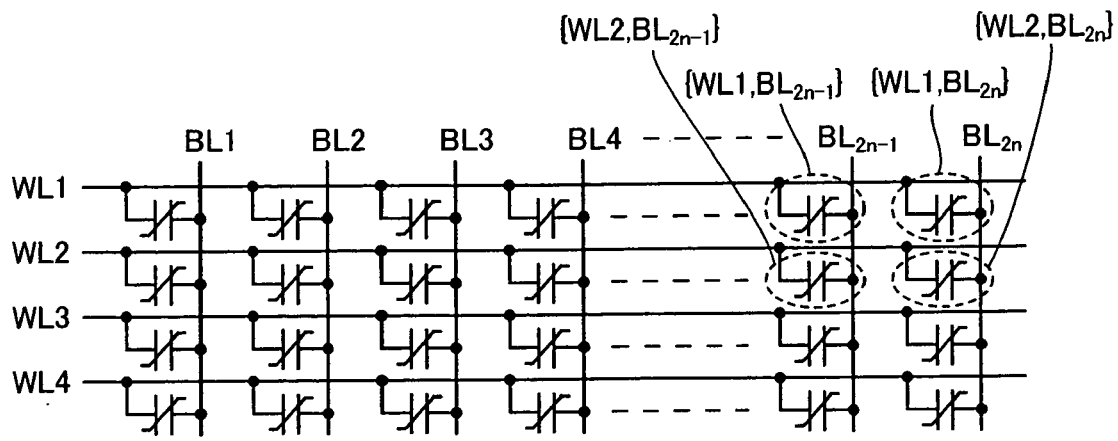
FIG. 30 is an equivalent circuit diagram of refreshed simple matrix memory cells.

In the refresh operation employing the driving method D according to the third embodiment, the ferroelectric memory collectively refreshes all memory cells connected to each word line WL. More specifically, the ferroelectric memory collectively refreshes the memory cells {WL1, BL1}, {WL1, BL2}, {WL1, BL3}, ..., {WL1, $BL_{2n-1}$} and {WL1, $BL_{2n}$} connected to the word line WL1, as shown in FIG. 30. Thereafter the ferroelectric memory collectively refreshes the memory cells {WL2, BL1}, {WL2, BL2}, {WL2, BL3}, ..., {WL2, $BL_{2n-1}$} and {WL2, $BL_{2n}$} connected to the word line WL2. Thereafter the ferroelectric memory successively collectively refreshes the memory cells connected to the word lines WL3 to WLn every word line WL. Thus, the ferroelectric memory refreshes all memory cells.

Figure 31:
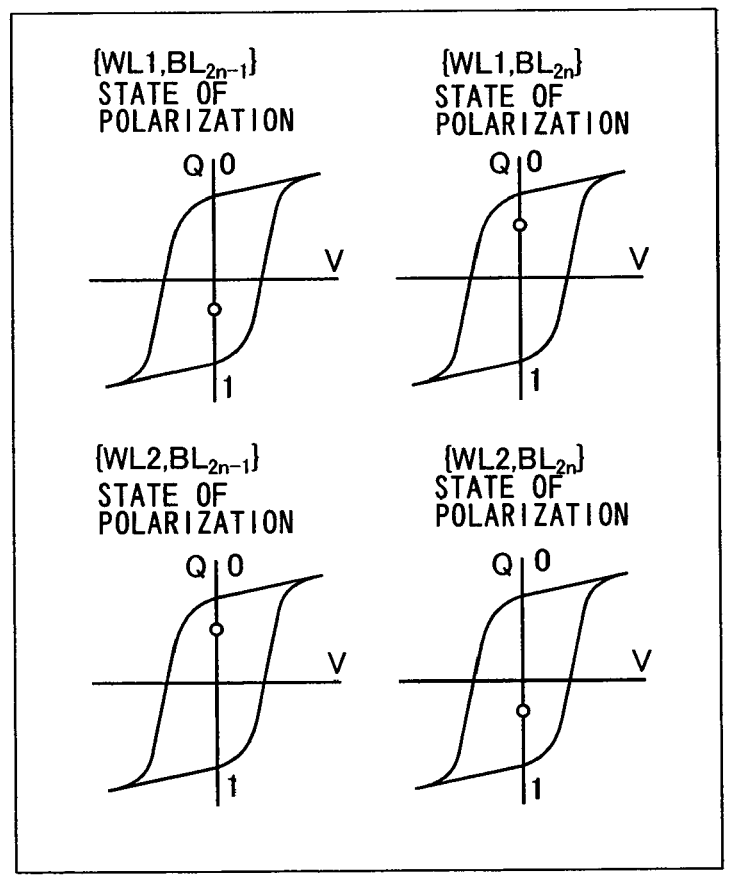
FIG. 31 is a hysteresis diagram showing remanent polarizations of unrefreshed memory cells in the ferroelectric memory according to the third embodiment.

Changes of the remanent polarizations, deteriorated as shown in FIG. 31, of the unrefreshed memory cells {WL1, $BL_{2n-1}$}, {WL1, $BL_{2n}$}, {WL2, $BL_{2n-1}$} and {WL2, $BL_{2n}$} subjected to two refresh operations according to the driving method D are now described. In the unrefreshed states, the memory cells {WL1, $BL_{2n-1}$} and {WL1, $BL_{2n}$} hold the data "1" and "0" respectively. Further, the memory cells {WL2, $BL_{2n-1}$} and {WL2, $BL_{2n}$} hold the data "0" and "1" respectively.

Figure 32:
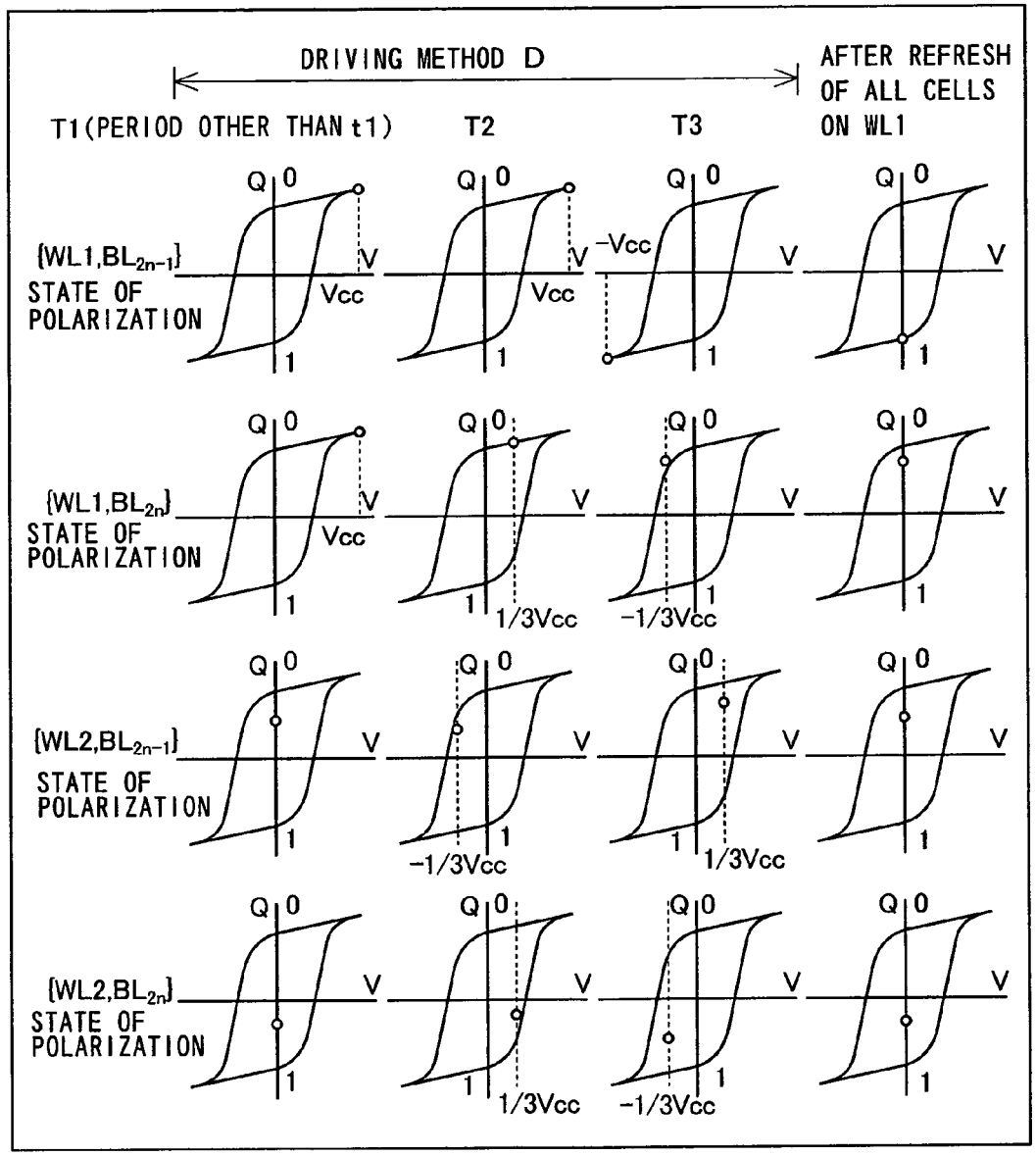
FIG. 32 is a hysteresis diagram showing changes of the remanent polarizations in the memory cells according to the third embodiment following a first refresh operation.

The ferroelectric memory selects the word line WL1 for performing the first refresh operation according to the driving method D. In respective periods T1 (period other than t1) to T3 of the first refresh operation, the ferroelectric memory applies the potential differences Vcc, Vcc and −Vcc to the selected memory cell {WL1, $BL_{2n-1}$} respectively, as shown in FIG. 32. After the first refresh operation, therefore, the selected memory cell {WL1, $BL_{2n-1}$} recovers the remanent polarization to the state immediately after the operation of writing the data "1". In the respective periods T1 (period other than t1) to T3 of the first refresh operation, the ferroelectric memory applies the potential differences Vcc, ⅓ Vcc and −⅓ Vcc to the selected memory cell {WL1, $BL_{2n}$} respectively. Thus, the selected memory cell {WL1, $BL_{2n}$} temporarily recovers the remanent polarization to the state immediately after the operation of writing the data "0" due to the potential difference Vcc applied in the period T1 (period other than t1). The selected memory cell {WL1, $BL_{2n}$} shifts to a remanent polarization corresponding to the potential difference ⅓ Vcc along a hysteresis curve in the period T2 and returns to the standby state after the period T2, thereby returning to the remanent polarization immediately after the operation of writing the data "0". Thereafter the selected memory cell {WL1, $BL_{2n}$} deteriorates the remanent polarization in correspondence to the potential difference −⅓ Vcc once in the period T3. After the first refresh operation, therefore, the selected memory cell {WL1, $BL_{2n}$} deteriorates the remanent polarization in correspondence to the potential difference −⅓ Vcc once from that immediately after the operation of writing the data "0".

In the respective periods T1 (period other than t1) to T3 of the first refresh operation, the ferroelectric memory applies the potential differences 0 V, −⅓ Vcc and ⅓ Vcc to the nonselected memory cell {WL2, $BL_{2n-1}$} respectively. Thus, the remanent polarization of the nonselected memory cell {WL2, $BL_{2n-1}$} remains unchanged in the period T1 (period other than t1). The nonselected memory cell {WL2, $BL_{2n-1}$} deteriorates the remanent polarization in the period T2, and recovers the remanent polarization in the period T3. After the period T3, therefore, the remanent polarization of the nonselected memory cell {WL2, $BL_{2n-1}$} deteriorated and recovered single times in the periods T2 and T3 respectively reaches the same state as that after the period T1 (period other than t1). After the first refresh operation, therefore, the nonselected memory cell {WL2, $BL_{2n-1}$} holds the same remanent polarization as that before the refresh operation (see FIG. 31).

In the respective periods T1 (period other than t1) to T3 of the first refresh operation, the ferroelectric memory applies the potential differences 0 V, ⅓ Vcc and −⅓ Vcc to the nonselected memory cell {WL2, $BL_{2n}$} respectively. Thus, the remanent polarization of the nonselected memory cell {WL2, $BL_{2n}$} remains unchanged in the period T1 (period other than t1). The nonselected memory cell {WL2, $BL_{2n}$} deteriorates the remanent polarization in the period T2, and recovers the remanent polarization in the period T3. After the period T3, therefore, the remanent polarization of the nonselected memory cell {WL2, $BL_{2n}$} deteriorated and recovered single times in the periods T2 and T3 respectively reaches the same state as that after the period T1 (period other than t1). After the first refresh operation, therefore, the nonselected memory cell {WL2, $BL_{2n}$} holds the same remanent polarization as that before the refresh operation (see FIG. 31).

Figure 33:
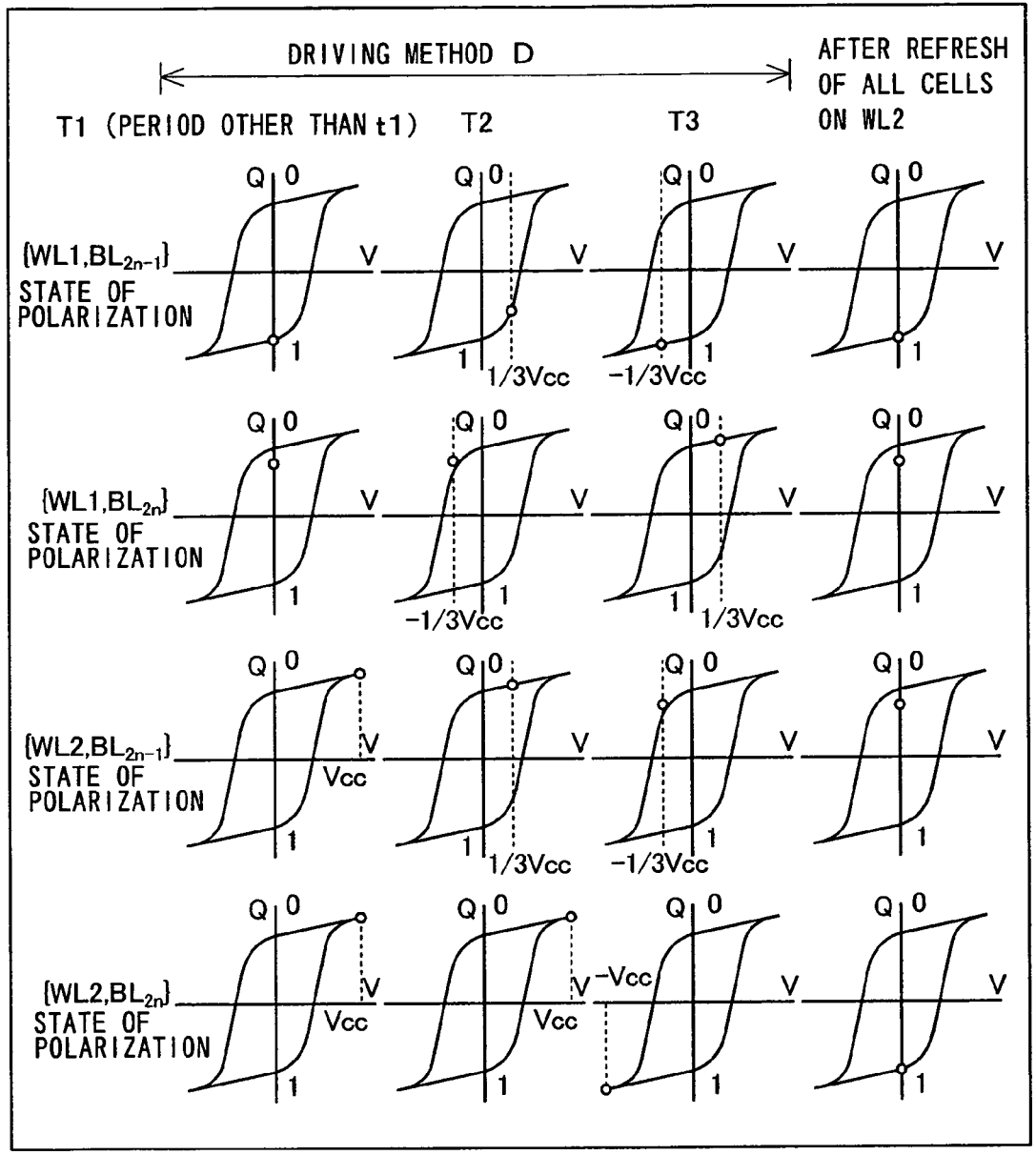
FIG. 33 is a hysteresis diagram showing changes of the remanent polarizations in the memory cells according to the third embodiment following a second refresh operation.

Then, the ferroelectric memory selects the word line WL2 for performing a second refresh operation according to the driving method D. In respective periods T1 (period other than t1) to T3 of the second refresh operation, the ferroelectric memory applies the potential differences Vcc, Vcc and −Vcc to the selected memory cell {WL2, $BL_{2n}$} respectively, as shown in FIG. 33. After the first refresh operation, therefore, the selected memory cell {WL2, $BL_{2n}$} recovers the remanent polarization to that immediately after the operation of writing the data "1".

In the respective periods T1 (period other than t1) to T3 of the second refresh operation, the ferroelectric memory applies the potential differences Vcc, ⅓ Vcc and −⅓ Vcc to the selected memory cell {WL2, $BL_{2n-1}$} respectively. Thus, the selected memory cell {WL2, $BL_{2n-1}$} temporarily recovers the remanent polarization to the state immediately after the operation of writing the data "0" due to the potential difference Vcc applied in the period T1 (period other than t1). The selected memory cell {WL2, $BL_{2n-1}$} shifts to a remanent polarization corresponding to the potential difference ⅓ Vcc along a hysteresis curve in the period T2 and returns to the standby state after the period T2, thereby returning to the remanent polarizations immediately after the operation of writing the data "0". Thereafter the selected memory cell {WL2, $BL_{2n-1}$} deteriorates the remanent polarization in correspondence to the potential difference −⅓ Vcc once in the period T3. After the second refresh operation, therefore, the selected memory cell {WL2, $BL_{2n-1}$} deteriorates the remanent polarization in correspondence to the potential difference $-\frac{1}{3}$ Vcc once from that immediately after the operation of writing the data "0".

In the respective periods T1 (period other than t1) to T3 of the second refresh operation, the ferroelectric memory applies the potential differences 0 V, $\frac{1}{3}$ Vcc and $-\frac{1}{3}$ Vcc to the nonselected memory cell {WL1, BL$_{2n-1}$} respectively. Thus, the remanent polarization of the nonselected memory cell {WL1, BL$_{2n-1}$} remains unchanged in the period T1 (period other than t1). The nonselected memory cell {WL1, BL$_{2n-1}$} deteriorates the remanent polarization in the period T2, and recovers the remanent polarization in the period T3. After the second refresh operation, therefore, the nonselected memory cell {WL1, BL$_{2n-1}$} deteriorating and recovering the remanent polarization single times in the periods T2 and T3 respectively holds the same remanent polarization as that before the first refresh operation (see FIG. 32).

In the respective periods T1 (period other than t1) to T3 of the second refresh operation, the ferroelectric memory applies the potential differences 0 V, $-\frac{1}{3}$ Vcc and $\frac{1}{3}$ Vcc to the nonselected memory cell {WL1, BL$_{2n}$} respectively. Thus, the remanent polarization of the nonselected memory cell {WL1, BL$_{2n}$} remains unchanged in the period T1 (period other than t1). The nonselected memory cell {WL1, BL$_{2n}$} deteriorates the remanent polarization in the period T2, and recovers the remanent polarization in the period T3. After the period T3, therefore, the remanent polarization of the nonselected memory cell {WL1, BL$_{2n}$} deteriorated and recovered single times in the periods T2 and T3 respectively reaches the same state as that after the period T1 (period other than t1). After the second refresh operation, therefore, the nonselected memory cell {WL1, BL$_{2n}$} holds the same remanent polarization as that before the first refresh operation (see FIG. 32).

As hereinabove described, the ferroelectric memory can recover the memory cells {WL1, BL$_{2n-1}$}, {WL1, BL$_{2n}$}, {WL2, BL$_{2n-1}$} and {WL2, BL$_{2n}$} deteriorating the remanent polarizations through the first and second refresh operations according to the driving method D to the remanent polarizations (those after the operation of writing the data "0" or "1") immediately after the operation of writing the data or the states deteriorating the remanent polarizations in correspondence to the potential difference $-\frac{1}{3}$ Vcc ($\frac{1}{3}$ Vcc) once. Further, the memory cells {WL1, BL$_{2n-1}$} and {WL1, BL$_{2n}$} once refreshed do not deteriorate the remanent polarizations beyond the single potential difference $-\frac{1}{3}$ Vcc in the subsequent two refresh operations. Even if the memory cells {WL1, BL$_{2n-1}$} and {WL1, BL$_{2n}$} deteriorate the remanent polarizations beyond the single potential difference $-\frac{1}{3}$ Vcc, the read amplifier 29 (see FIG. 24) can determine the data with the remanent polarizations deteriorated by this degree, leading to no problem such as disappearance of data. While the ferroelectric memory performs a refresh operation on memory cells (the memory cells {WL1, BL$_{2n-1}$} and {WL1, BL$_{2n}$} shown in FIG. 32, for example) connected to an arbitrary word line WL, no deterioration of remanent polarizations progresses in unrefreshed memory cells (the memory cells {WL2, BL$_{2n-1}$} and {WL2, BL$_{2n}$} shown in FIG. 32, for example) among the remaining memory cells.

According to the third embodiment, as hereinabove described, the ferroelectric memory, accessing the selected memory cells of the first and second cell regions according to the driving method C thereby deteriorating the remanent polarizations in the nonselected memory cells of the third and fourth cell regions and thereafter collectively refreshing all memory cells according to the driving method D every word line WL, can recover all memory cells including those deteriorating the remanent polarizations to the remanent polarizations immediately after the operation of writing the data "0" or "1" or the states deteriorated in correspondence to the potential difference $-\frac{1}{3}$ Vcc ($\frac{1}{3}$ Vcc) once, whereby the memory cells can be inhibited from disturbance causing disappearance of the data resulting from deterioration of the remanent polarizations.

According to the third embodiment, further, the ferroelectric memory performs the refresh operation according to the driving method D not every normal access according to the driving method C but after arbitrary memory cells accumulate deterioration of the remanent polarizations after a prescribed access frequency, whereby the operating time for the refresh operation can be remarkably reduced as compared with a case of performing the refresh operation every access. Thus, the ferroelectric memory can inhibit the number of operations from increase also when performing the refresh operation.

Fourth Embodiment

A fourth embodiment of the present invention is now described with reference to a condition more suitable in a case of employing a driving method according to the aforementioned third embodiment (driving method of performing normal access by a prescribed frequency according to the driving method C and thereafter performing a refresh operation according to the driving method D) than a case of employing only the driving method D through the relation between the total number of read-rewrite operations (normal access) in advance of a refresh operation and the number of word lines WL connected with refreshed memory cells.

It is assumed that M represents the total number of the read-rewrite operations (driving method C) in advance of the refresh operation (driving method D) and N represents the number of the word lines WL connected with the refreshed memory cells in the driving method according to the aforementioned third embodiment. The numbers of operations (frequencies for charging/discharging the memory cells) in the case of employing the driving method according to the aforementioned third embodiment and the case of employing only the driving method D are calculated under the following condition 1 respectively. The numbers of operations in the case of employing the driving method according to the aforementioned third embodiment and the case of employing only the driving method D are compared with each other for studying in which case the cycle time (operating time) and power consumption can be further reduced. It is assumed that each of periods T1 to T3 (see FIGS. 27 and 29) of the aforementioned driving methods C corresponds to a single number of operations.

(Condition 1)

According to the condition 1, a ferroelectric memory continuously performs only read-rewrite operations, and thereafter performs a refresh operation. Under the condition 1, the numbers of operations according to the third embodiment and the case of employing only the driving method D are as follows:

Number of operations according to the third embodiment=M×2+N×3

Number of operations in the case of employing only the driving method D=M×3

Under the condition 1, therefore, the number of operations according to the third embodiment is smaller than that in the case of employing only the driving method D in the following case:

$N < M/3$

From the aforementioned results, it is understood that the number of operations of the ferroelectric memory can be easily reduced when N<M/3 by employing the driving method according to the third embodiment as compared with the case of employing only the driving method D. According to the fourth embodiment, therefore, the ferroelectric memory can reduce the cycle time and power consumption by employing the driving method according to the third embodiment for driving memory cells when N<M/3. When N>M/3, on the other hand, the number of operations of the ferroelectric memory is reduced by employing only the driving method D as compared with the case of employing the driving method according to the third embodiment. In this case, therefore, the ferroelectric memory may employ only the driving method D.

Fifth Embodiment

Figure 34:
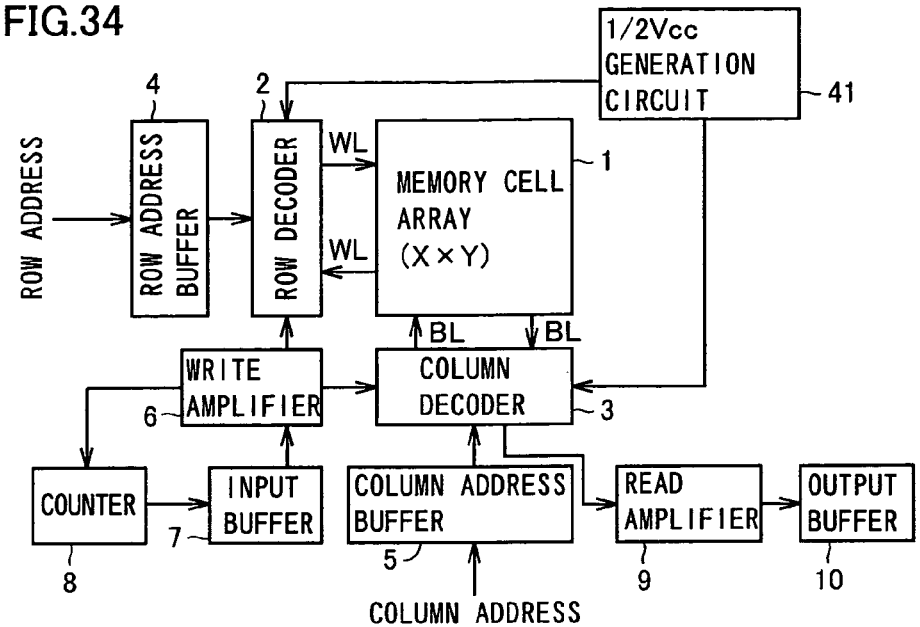
FIG. 34 is a block diagram showing the overall structure of a ferroelectric memory according to a fifth embodiment of the present invention.

A fifth embodiment of the present invention is described with reference to a case of applying potential differences ±½ Vcc to nonselected cells in place of potential differences ±⅓ Vcc in a random access ferroelectric memory similar to that according to the aforementioned first embodiment. More specifically, the ferroelectric memory according to the fifth embodiment comprises a ½ Vcc generation circuit 41 in place of the ⅓ Vcc-⅔ Vcc generation circuit 11 of the ferroelectric memory according to the first embodiment shown in FIG. 1, as shown in FIG. 34. Thus, the ferroelectric memory can apply a voltage ½ Vcc to nonselected word lines WL1, WL3 and WL4 and nonselected bit lines BL1, BL3 and BL4. The remaining structure of the ferroelectric memory according to the fifth embodiment is similar to that of the ferroelectric memory according to the first embodiment shown in FIG. 1.

According to the fifth embodiment, the ferroelectric memory applies three types of voltages 0 V, ½ Vcc and Vcc to the word lines WL and the bit lines BL, i.e., smaller by one type than the four types of voltages 0 V, ⅓ Vcc, ⅔ Vcc and Vcc applied to the word lines WL and the bit lines BL in each of the aforementioned first and second embodiments. Thus, the voltage generation circuit (½ Vcc generation circuit 41) and a control circuit system can be simplified according to the fifth embodiment as compared with the aforementioned first and second embodiments.

Read-rewrite operations and a write operation in the ferroelectric memory according to the fifth embodiment are described with reference to FIGS. 3 and 34 to 38.

The ferroelectric memory according to the fifth embodiment performs the read-rewrite operations and the write operation similarly to the ferroelectric memory according to the aforementioned first embodiment, except that the same applies the potential difference ½ Vcc to nonselected word lines WL1, WL3 and WL4 and nonselected bit lines BL1, BL3 and BL4 in place of the potential differences ⅓ Vcc and ⅔ Vcc. According to the fifth embodiment, the ferroelectric memory operates with two driving methods E and F. According to the driving method E, the number of necessary operations is reduced while remanent polarizations may be deteriorated in nonselected cells in the read-rewrite operations or the write operation. According to the driving method E, the number of necessary operations is increased as compared with the driving method E while nonselected cells cause no remarkable remanent polarizations allowing no determination of data.

According to the fifth embodiment, the ferroelectric memory performs the read-rewrite operations and the write operation with the driving method E in normal access while performing a refresh operation (recovery) for recovering memory cells from deterioration of remanent polarizations accumulated due to the driving method E according to the driving method F after a prescribed frequency or normal access. According to the fifth embodiment, the ferroelectric memory counts the frequency of normal access according to the driving method E with a counter 8 (see FIG. 34) and performs the refresh operation every prescribed access frequency counted by the counter 8. The driving methods E and F employed for the normal access and the refresh operation respectively are now described.

(Driving Method E: Normal Access Operation)

(1) Read-Rewrite Operations

The read-rewrite operations according to the driving method E are described with reference to FIGS. 3, 35 and 36. It is assumed that operating periods T1 and T2 shown in FIG. 35 and an operating period T1 shown in FIG. 36 are identical to each other (T seconds).

Figure 35:
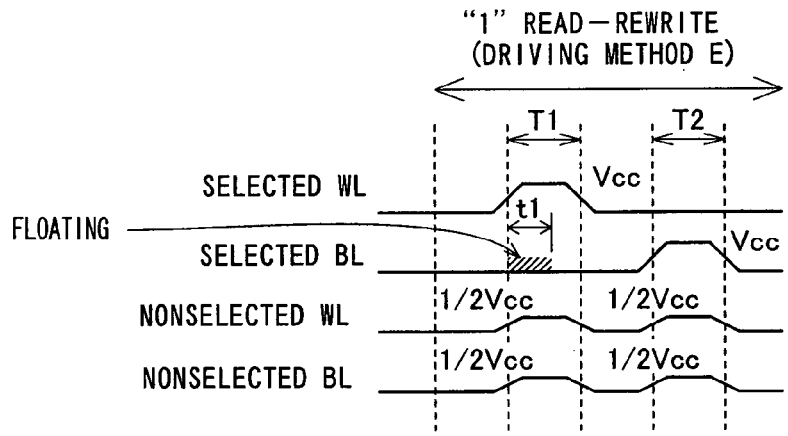
FIGS. 35 and 36 are voltage waveform diagrams for illustrating read-rewrite operations in normal access according to a driving method E in the fifth embodiment.
Figure 36:
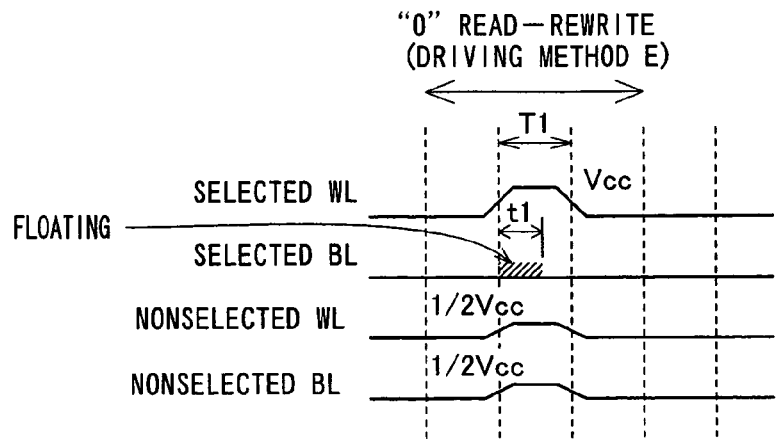

The ferroelectric memory performs the read operation in the period T1 shown in FIGS. 35 and 36. First, both of the word lines WL and the bit lines BL are at the voltage 0 V in a standby state. From the standby state, the ferroelectric memory brings the selected bit line BL2 into a floating state. The ferroelectric memory further sets the selected word line WL2 and the nonselected word lines WL1, WL3 and WL4 and the nonselected bit lines BL1, BL3 and BL4 to the voltages Vcc and ½ Vcc respectively. In this state, the ferroelectric memory senses the voltage of the selected bit line BL2, thereby determining data "0" or "1". After completely determining the data "0" or "1", the ferroelectric memory returns the selected bit line BL2 to the voltage 0 V. It is assumed that the period T1 is for T seconds and the selected bit line BL2 remains in the floating state for a period t1. It is also assumed that the period t1 is set sufficiently short similarly to that in the driving method B according to the aforementioned firs embodiment.

In this case, the ferroelectric memory applies the potential difference ½ Vcc to a nonselected first cell similar to that located on the intersection between the selected word line WL2 and the nonselected bit line BL4 shown in FIG. 3 in the read operation of the period T1. The ferroelectric memory applies the potential difference between the voltage ½ Vcc and the potential (floating potential) of the selected bit line BL2 to a nonselected second cell located on the intersection between the nonselected word line WL4 and the selected bit line BL2 for t1 seconds, and applies the potential difference ½ Vcc thereto for (T−t1) seconds. The ferroelectric memory applies the potential difference 0 V to a nonselected third cell located on the intersection between the nonselected word line WL4 and the nonselected bit line BL4 for T seconds. The ferroelectric memory applies the potential difference between the voltage Vcc and the potential (floating potential) of the selected bit line BL2 to a selected fourth cell located on the intersection between the selected word line WL2 and the selected bit line BL2 for t1 seconds, and applies the potential difference Vcc thereto for (T−t1) seconds.

At this time, the nonselected first to third cells deteriorate and recover the remanent polarizations when holding the following data respectively: The nonselected first cell deteriorates the remanent polarization when holding the data "1", while recovering the remanent polarization when holding the data "0". The nonselected second cell deteriorates the remanent polarization when holding the data "1", while recovering the remanent polarization when holding the data "0". The nonselected third cell neither deteriorates nor recovers the remanent polarization. The selected fourth cell deteriorates the remanent polarization when holding the data "1", while holding the remanent polarization of the data "0" when holding the data "0".

After the aforementioned read operation in the period T1, the ferroelectric memory temporarily returns to the standby state. When reading the data "1" from the selected fourth cell in the aforementioned read operation, the ferroelectric memory sets the selected word line WL2, the nonselected word lines WL1, WL3 and WL4, the selected bit line BL2 and the nonselected bit lines BL1, BL3 and BL4 to the voltages 0 V, ½ Vcc, Vcc and ½ Vcc in the period T2 respectively as shown in FIG. 35, thereby rewriting the data "1". In this case, the ferroelectric memory applies the following potential difference to the first to fourth cells in the period T2 respectively: The ferroelectric memory applies the potential differences −½ Vcc, −½ Vcc and 0 V to the nonselected first, second and third cells respectively. Thus, the nonselected first cell recovers the remanent polarization when holding the data "1", while deteriorating the remanent polarization when holding the data "0". The nonselected second cell recovers the remanent polarization when holding the data "1", while deteriorating the remanent polarization when holding the data "0". The nonselected third cell neither deteriorates nor recovers the remanent polarization. The ferroelectric memory completely rewrites the data "1" by applying the potential difference −Vcc to the selected fourth cell.

When the ferroelectric memory reads the data "0" from the selected fourth cell in the aforementioned read operation, on the other hand, the selected fourth cell holds the remanent polarization of the data "0" in the period T1 as described above, whereby the ferroelectric memory performs no rewrite operation in periods subsequent to the period T1, as shown in FIG. 36. Thus, the nonselected first to third cells hold deterioration and recovery of the remanent polarizations resulting from the read operation in the period T1.

When the ferroelectric memory reads the data "1" from the selected fourth cell in the read-rewrite operations according to the driving method E in the normal access, as hereinabove described, the nonselected first and second cells deteriorate and recover the remanent polarizations single times, whereby the remanent polarizations remain unchanged. Further, the nonselected third cell neither deteriorates nor recovers the remanent polarization, whereby the remanent polarization remains unchanged. When the ferroelectric memory reads the data "0" from the selected fourth cell, on the other hand, the nonselected first and second cells deteriorate the remanent polarizations when holding the data "1" respectively. When the ferroelectric memory repeats the operation of reading the data "0" according to the driving method E, therefore, the nonselected first and second cells holding the data "1" accumulate deterioration of the remanent polarizations.

The write operation according to the driving method E is described with reference to FIGS. 3 and 37.

(2) Write Operation

In the standby state, both of the word lines WL and the bit lines BL are at 0 V. In order to write the data "0" in the selected fourth cell, the ferroelectric memory applies the voltages Vcc, 0 V, ½ Vcc and ½ Vcc to the selected word line WL2, the selected bit line BL2, the nonselected word lines WL1, WL3 and WL4 and the nonselected bit lines BL1, BL3 and BL4 in the period T1 respectively. Thus, the ferroelectric memory applies the following potential differences to the first to fourth cells (see FIG. 3) in the "0" write operation in the period T1:

In the "0" write operation in the period T1, the ferroelectric memory applies the potential difference ½ Vcc to the nonselected first cell. The ferroelectric memory applies the potential difference ½ Vcc to the nonselected second cell. The ferroelectric memory applies the potential difference 0 V to the nonselected third cell. The ferroelectric memory applies the potential difference Vcc to the selected fourth cell. Thus, the ferroelectric memory writes the data "0" in the selected fourth cell.

At this time, the nonselected first to third cells deteriorate and recover the remanent polarizations when holding the following data respectively: The nonselected first cell deteriorates the remanent polarization when holding the data "1", while recovering the remanent polarization when holding the data "0". The nonselected second cell deteriorates the remanent polarization when holding the data "1", while recovering the remanent polarization when holding the data "0". The nonselected third cell neither deteriorates nor recovers the remanent polarization.

Figure 37:
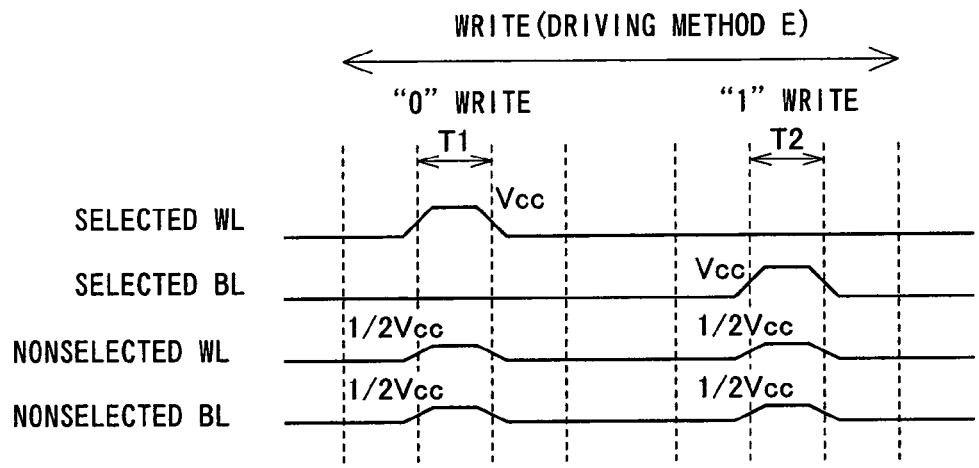
FIG. 37 is a voltage waveform diagram for illustrating a write operation in normal access according to the driving method E in the fifth embodiment.

In order to write the data "1" in the selected fourth cell, the ferroelectric memory applies the voltages 0 V, Vcc, ½ Vcc and ½ Vcc to the selected word line WL2, the selected bit line BL2, the nonselected word lines WL1, WL3 and WL4 and the nonselected bit lines BL1, BL3 and BL4 respectively from the standby state, as shown in a period T2 of FIG. 37. Thus, the ferroelectric memory applies the following potential differences to the first to fourth cells (see FIG. 3) in the "1" write operation in the period T2 respectively:

In the "1" write operation in the period T2, the ferroelectric memory applies the potential difference −½ Vcc to the nonselected first cell. The ferroelectric memory applies the potential difference −½ Vcc to the nonselected third cell. The ferroelectric memory applies the potential difference 0 V to the nonselected third cell. The ferroelectric memory applies the potential difference −Vcc to the selected fourth cell. Thus, the ferroelectric memory writes the data "1" in the selected fourth cell.

At this time, the nonselected first to third cells deteriorate and recover the remanent polarizations when holding the following data respectively: The nonselected first cell recovers the remanent polarization when holding the data "1", while deteriorating the remanent polarization when holding the data "0". The nonselected second cell recovers the remanent polarization when holding the data "1", while deteriorating the remanent polarization when holding the data "0". The nonselected third cell neither deteriorates nor recovers the remanent polarization.

In the "0" write operation according to the driving method E in the normal access, as hereinabove described, the nonselected first and second cells deteriorate the remanent polarizations when holding the data "1" respectively. In the "1" write operation, the nonselected first and second cells deteriorate the remanent polarizations when holding the data "0" respectively. When the ferroelectric memory repeats only the operation of writing the data "0" according to the driving method E, therefore, the nonselected first and second cells holding the data "1" accumulate deterioration of the remanent polarizations. When the ferroelectric memory repeats only the operation of writing the data "1" according to the driving method E, on the other hand, the nonselected first and second cells holding the data "0" accumulate deterioration of the remanent polarizations. When the ferroelectric memory alternately performs the operations of writing the data "0" and "1" respectively by the same frequencies, however, the nonselected first and second cells deteriorate and recover the remanent polarizations by the same frequencies in response thereto, not to accumulate deterioration of the remanent polarizations.

(Driving Method F: Refresh Operation)

The read-rewrite operations according to the driving method F are described with reference to FIG. 38.

(1) Read Operation (T1)

Figure 38:
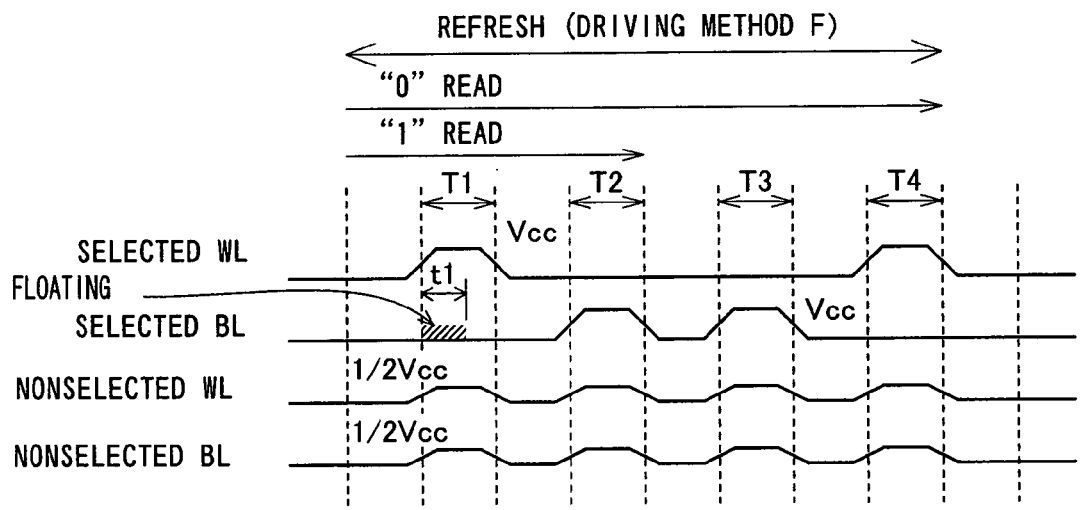
FIG. 38 is a voltage waveform diagram for illustrating a refresh operation (read-rewrite operations) according to the driving method E in the fifth embodiment.
Figure 39:
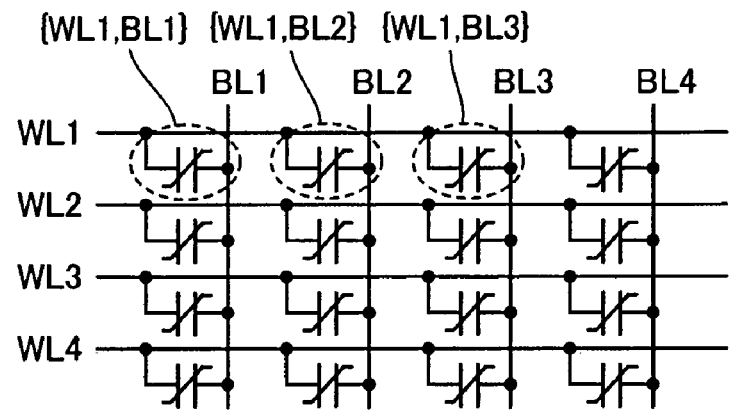
FIG. 39 is an equivalent circuit diagram of refreshed simple matrix memory cells.

The ferroelectric memory performs the read operation in a period T1 shown in FIG. 38. From the standby state (0 V), the ferroelectric memory brings the selected bit line BL2 into a floating state. The ferroelectric memory sets the selected word line WL2, the nonselected word lines WL1, WL3 and WL4 and the nonselected bit lines BL1, BL3 and BL4 to the voltages Vcc, ½ Vcc and ½ Vcc respectively at the same timing. In this state, the ferroelectric memory senses the potential of the selected bit line BL2, thereby determining data "0" or "1". The ferroelectric memory determines the data "0" or "1" similarly to the aforementioned first embodiment. After determining the data "0" or "1", the ferroelectric memory returns the selected bit line BL2 to 0 V. It is assumed that the period T1 corresponds to T seconds and the selected bit line BL2 remains in the floating state for t1 seconds. It is also assumed that the period t1 when the selected bit line BL2 is in the floating state is set sufficiently short similarly to the aforementioned firs embodiment.

In this case, the ferroelectric memory applies the potential difference ½ Vcc to the nonselected first cell for T seconds. The ferroelectric memory applies the potential difference between the voltage ½ Vcc and the potential (floating potential) of the selected bit line BL2 (½ Vcc−floating potential) to the nonselected second cell for t1 seconds, and applies the potential difference ½ Vcc thereto for (T−t1) seconds. The ferroelectric memory applies the potential difference 0 V to the nonselected third cell for T seconds. The ferroelectric memory applies the potential difference between the voltage Vcc and the potential (floating potential) of the selected bit line BL2 (Vcc−floating potential) to the nonselected second cell for t1 seconds, and thereafter applies the potential difference Vcc thereto for (T−t1) seconds.

As hereinabove described, the period t1 when the selected bit line BL2 is in the floating state is set so sufficiently short that the remanent polarizations change in the read operation of the period T1 as follows: The nonselected first cell deteriorates the remanent polarization when holding the data "1", while recovering the remanent polarization when holding the data "0". The nonselected second cell deteriorates the remanent polarization when holding the data "1", while recovering the remanent polarization when holding the data "0". The nonselected third cell neither deteriorates nor recovers the remanent polarization. The selected fourth cell deteriorates the remanent polarization when holding the data "1", while holding the remanent polarization of the data "0" when holding the data "0".

(2) Data "1" Rewrite Operation (T2)

After the aforementioned read operation in the period T1, the ferroelectric memory temporarily returns to the standby state. Thereafter the ferroelectric memory sets the selected word line WL2, the nonselected word lines WL1, WL3 and WL4, the selected bit line BL2 and the nonselected bit lines BL1, BL3 and BL4 to the voltages 0 V, ½ Vcc, Vcc and ½ Vcc in the period T2 respectively. In this case, the ferroelectric memory applies the following potential differences to the first to fourth cells in the period T2 respectively: The ferroelectric memory applies the potential differences −½ Vcc, −½ Vcc and 0 V to the nonselected first, second and third cells for T seconds respectively. Thus, the nonselected first cell recovers the remanent polarization when holding the data "1", while deteriorating the remanent polarization when holding the data "0". The nonselected second cell recovers the remanent polarization when holding the data "1", while deteriorating the remanent polarization when holding the data "0". The nonselected third cell neither deteriorates nor recovers the remanent polarization. The ferroelectric memory applies the potential difference −Vcc to the selected fourth cell for T seconds. When reading the data "1" in the read operation of the period T1, therefore, the ferroelectric memory completely rewrites the data "1" through the operation in the period T2, to terminate the read-rewrite operations at this point of time.

(3) Compensatory Operation for Rewriting Data "0" (T3)

After the aforementioned operation of rewriting the data "1" in the period T2, the ferroelectric memory temporarily returns to the standby state. Thereafter the ferroelectric memory sets the selected word line WL2, the nonselected word lines WL1, WL3 and WL4, the selected bit line BL2 and the nonselected bit lines BL1, BL3 and BL4 to the voltages 0 V, ½ Vcc, Vcc and ½ Vcc in the period T3 respectively. In this case, the ferroelectric memory applies the following potential differences to the first to fourth cells for T seconds respectively: The ferroelectric memory applies the potential differences −½ Vcc, −½ Vcc and 0 V to the nonselected first, second and third cells for T seconds respectively. The ferroelectric memory applies the potential difference −Vcc to the selected fourth cell for T seconds. According to this application of the potential differences, the nonselected first cell recovers the remanent polarization when holding the data "1", while deteriorating the remanent polarization when holding the data "0". The nonselected second cell recovers the remanent polarization when holding the data "1", while deteriorating the remanent polarization when holding the data "0". The nonselected third cell neither deteriorates nor recovers the remanent polarization. In the selected fourth cell holding the data "1" through the operation in the aforementioned period T2, the ferroelectric memory rewrites the data "1" therein.

(4) Data "0" Rewrite Operation (T4)

After the compensatory operation for rewriting the data "0" in the aforementioned period T3, the ferroelectric memory temporarily returns to the standby state. Thereafter the ferroelectric memory sets the selected word line WL2, the nonselected word lines WL1, WL3 and WL4, the selected bit line BL2 and the nonselected bit lines BL1, BL3 and BL4 to the voltages Vcc, ½ Vcc, 0 V and ½ Vcc in the period T4 respectively. Thus, the ferroelectric memory applies the potential differences ½ Vcc, ½ Vcc and 0 V to the nonselected first, second and third cells for T seconds respectively. The ferroelectric memory applies the potential difference Vcc to the selected fourth cell. Thus, the nonselected first cell deteriorates the remanent polarization when holding the data "1", while recovering the remanent polarization when holding the data "0". The nonselected second cell deteriorates the remanent polarization when holding the data "1", while recovering the remanent polarization when holding the data "0". The nonselected third cell neither deteriorates nor recovers the remanent polarization. The ferroelectric memory applying the potential difference Vcc to the selected fourth cell rewrites the data "0" therein. The ferroelectric memory terminates the series of read-rewrite operations with the operation in this period T4.

In the refresh operation employing the driving method F according to the fifth embodiment, the ferroelectric memory advances to the operation in the period T2 when reading the data "1" in the read-rewrite operations, while advancing to the operation in the period T4 when reading the data "0". Thereafter the ferroelectric memory shifts to the subsequent read and rewrite operations. In the driving method F according to the fifth embodiment, the frequencies of deterioration and recovery of the remanent polarizations are equalized with each other, or neither deterioration nor recovery of the remanent polarizations takes place in both of the cases of reading the data "1" and "0". Also when the ferroelectric memory repeats the read-rewrite operations, therefore, the nonselected cells do not accumulate deterioration of the remanent polarizations, to result in no disappearance of finally held data.

In the refresh operation employing the driving method F according to the fifth embodiment, the ferroelectric memory, alternately applying the potential differences ±½ Vcc to the nonselected first cell while alternately applying the potential difference between the voltage ½ Vcc and the potential of the selected bit line BL2 and the potential differences ½ Vcc and −½ Vcc to the nonselected second cell and applying the potential difference 0 V to the nonselected third cell for canceling deterioration of the remanent polarizations in the nonselected cells resulting from disturbance throughout the read-rewrite operations, can inhibit the nonselected cells from disappearance of data resulting from deterioration of the remanent polarizations.

Changes of the remanent polarizations of the memory cells resulting from the refresh operation of the ferroelectric memory according to the fifth embodiment employing the driving method F are described with reference to FIGS. 39 to 43.

According to the fifth embodiment, the ferroelectric memory performs the refresh operation every word line WL, similarly to the aforementioned first embodiment. More specifically, the ferroelectric memory successively refreshes the memory cells {WL1, BL1}, {WL1, BL2}, {WL1, BL3}, . . . , {WL1, BLn} connected to the word line WL1. Thereafter the ferroelectric memory successively refreshes the memory cells {WL2, BL1}, {WL2, BL2}, {WL2, BL3}, . . . , {WL2, BLn} connected to the word line WL2. Thereafter the ferroelectric memory similarly successively refreshes the memory cells connected to the word lines WL3 to WLn. Thus, the ferroelectric memory refreshes all memory cells.

Figure 40:
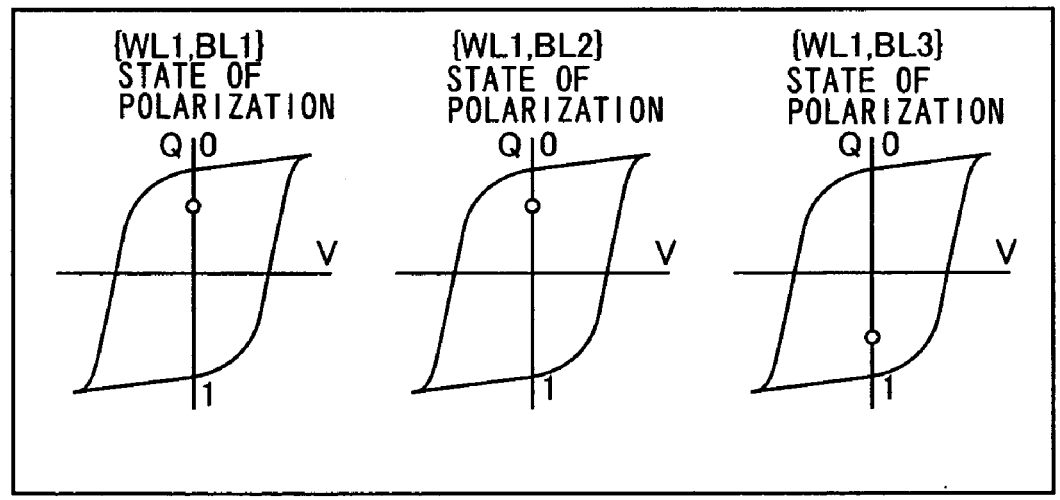
FIG. 40 is a hysteresis diagram showing remanent polarizations of unrefreshed memory cells in the ferroelectric memory according to the fifth embodiment.

Changes of the remanent polarizations of the memory cells {WL1, BL1}, {WL1, BL2} and {WL1, BL3}, having remanent polarizations deteriorated as shown in FIG. 40 in unrefreshed states, subjected to three refresh operations according to the driving method F are now described. The ferroelectric memory performs the three refresh operations according to the driving method F similarly to the three refresh operations (see FIGS. 11 to 13) according to the aforementioned first embodiment, except that the same applies the potential differences ±½ Vcc to the memory cells {WL1, BL1}, {WL1, BL2} and {WL1, BL3} in place of the potential differences ±⅓ Vcc.

Figure 41:
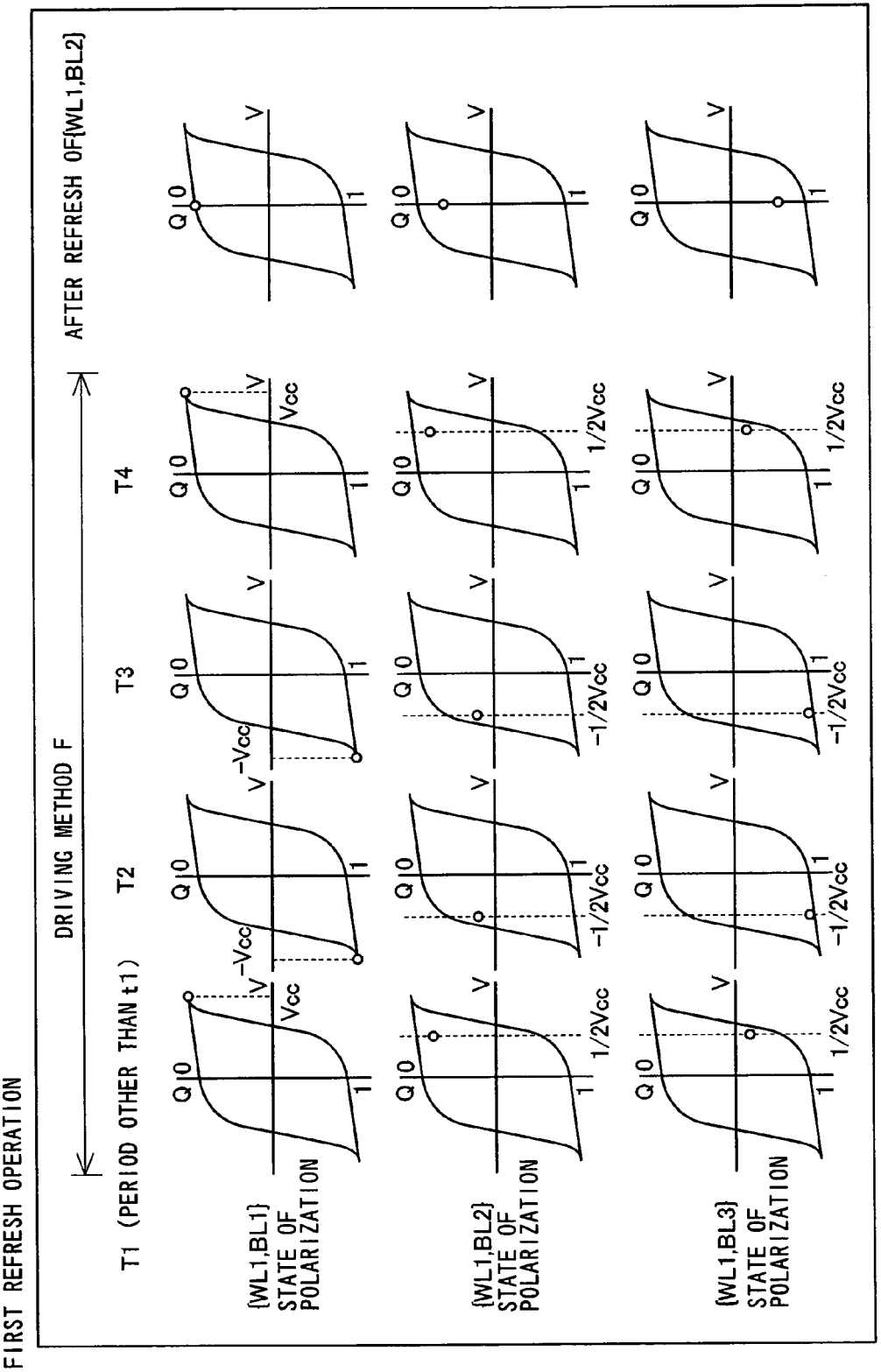
FIG. 41 is a hysteresis diagram showing changes of the remanent polarizations in the memory cells according to the fifth embodiment following a first refresh operation.

The ferroelectric memory selects the memory cell {WL1, BL1} for the first refresh operation according to the driving method F. The ferroelectric memory applies the potential differences Vcc, −Vcc, −Vcc and Vcc to the selected memory cell {WL1, BL1} in periods T1 (period other than t1) to T4 respectively, as shown in FIG. 41. After the first refresh operation, therefore, the remanent polarization of the selected memory cell {WL1, BL1} is recovered to the state immediately after the operation of writing the data "0", as shown in FIG. 41. In the periods T1 (period other than t1) to T4 of the first refresh operation, the ferroelectric memory applies the potential differences ½ Vcc, −½ Vcc, −½ Vcc and ½ Vcc to the nonselected memory cell {WL1, BL2} respectively, while applying the potential differences ½ Vcc, −½ Vcc, −½ Vcc and ½ Vcc to the nonselected memory cell {WL1, BL3} respectively. Thus, the ferroelectric memory applies the potential differences ±½ Vcc of opposite directions to the nonselected memory cells {WL1, BL2} and {WL1, BL3} twice respectively, whereby the nonselected memory cells {WL1, BL2} and {WL1, BL3} recover and deteriorate the remanent polarizations twice respectively. After the first refresh operation, therefore, the nonselected memory cells {WL1, BL2} and {WL1, BL3} hold the remanent polarizations identically to those (see FIG. 40) before the refresh operation.

Figure 42:
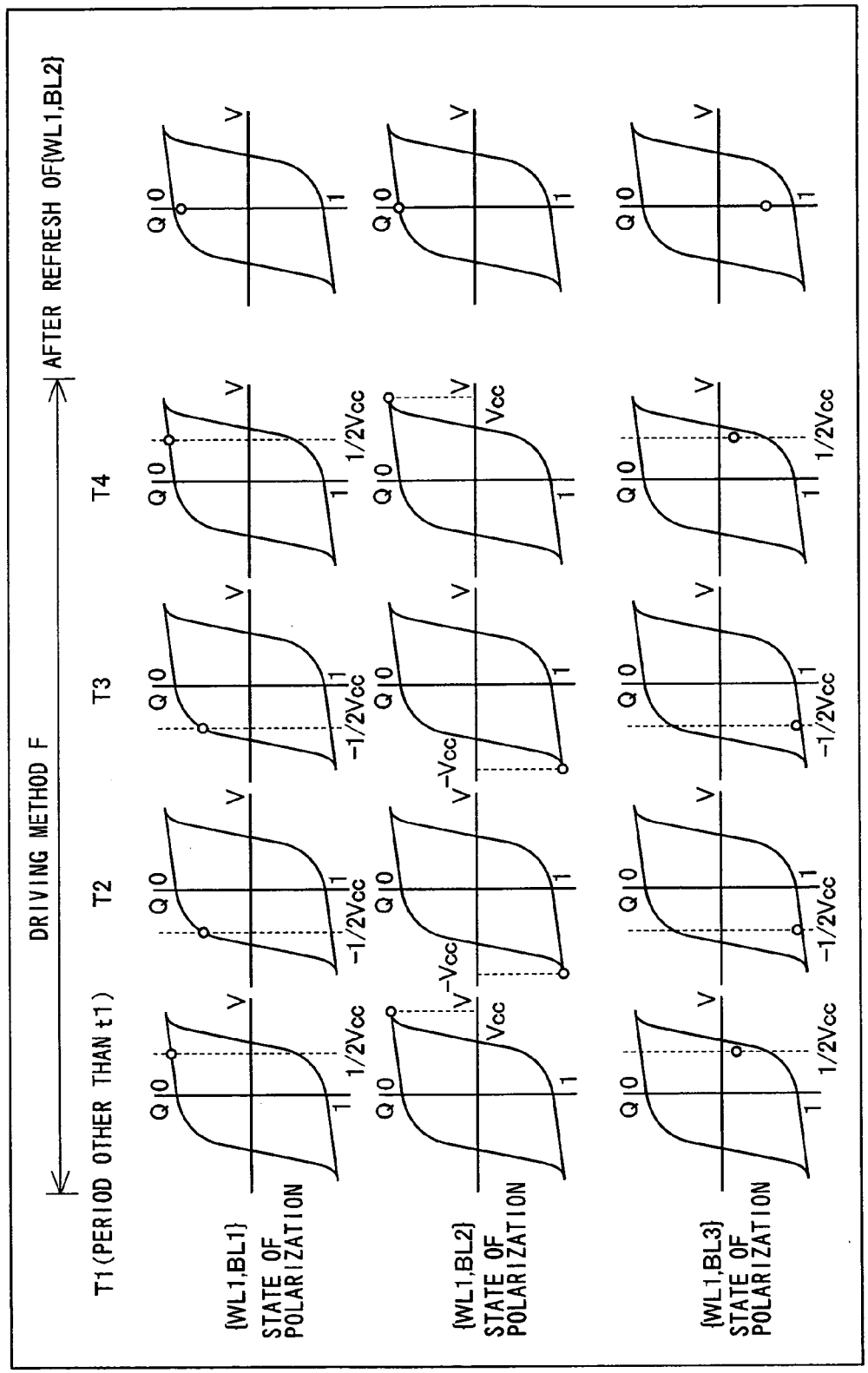
FIG. 42 is a hysteresis diagram showing changes of the remanent polarizations in the memory cells according to the fifth embodiment following a second refresh operation.

Then, the ferroelectric memory selects the memory cell {WL1, BL2} for performing the second refresh operation according to the driving method F. In the second refresh operation, the ferroelectric memory applies the potential differences Vcc, −Vcc, −Vcc and Vcc to the selected memory cell {WL1, BL2} in periods T1 (period other than t1) to T4 respectively, as shown in FIG. 42. After the second refresh operation, therefore, the remanent polarization of the selected memory cell {WL1, BL2} is recovered to the state immediately after the operation of writing the data "0".

In the periods T1 (period other than t1) to T4 of the second refresh operation, the ferroelectric memory applies the potential differences ½ Vcc, −½ Vcc, −½ Vcc and ½ Vcc to the nonselected memory cells {WL1, BL1} and {WL1, BL3} respectively. Thus, the nonselected memory cell {WL1, BL1} shifts to a remanent polarization corresponding to the potential difference ½ Vcc along a hysteresis curve in the period T1 (period other than t1) and thereafter returns to the standby state for returning to the remanent polarization immediately after the operation of writing the data "0", and hence the potential difference applied in the period T1 (period other than t1) contributes to neither deterioration nor recovery of the remanent polarization. The nonselected memory cell {WL1, BL1}, deteriorating the remanent polarization twice in the periods T2 and T3 and recovering the remanent polarization once in the period T4, deteriorates the remanent polarization in correspondence to the potential difference −½ Vcc once after the second refresh operation.

In the second refresh operation, the ferroelectric memory applies the potential differences ±½ Vcc of opposite directions to the nonselected memory cell {WL1, BL3} twice in the periods T1 (period other than t1) to T4 respectively, thereby recovering and deteriorating the remanent polarization thereof twice respectively. After the second refresh operation, therefore, the nonselected memory cell {WL1, BL3} holds the same remanent polarization as that after the first refresh operation (see FIG. 41).

Figure 43:
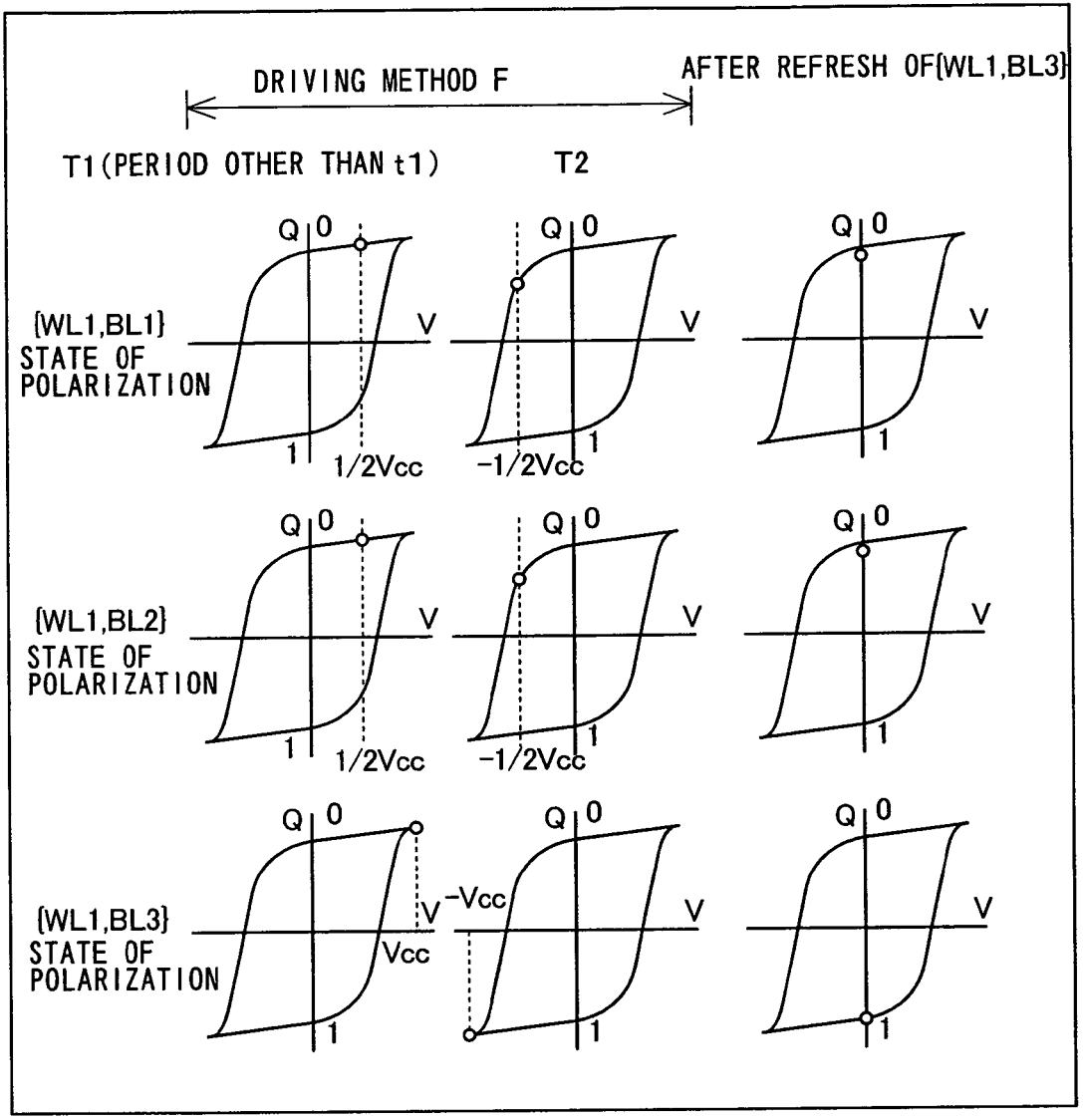
FIG. 43 is a hysteresis diagram showing changes of the remanent polarizations in the memory cells according to the fifth embodiment following a third refresh operation.

Then, the ferroelectric memory selects the memory cell {WL1, BL3} for performing the third refresh operation according to the driving method F. In periods T1 (period other than t1) and T2 of the third refresh operation, the ferroelectric memory applies the potential differences Vcc and −Vcc to the selected memory cell {WL1, BL3} respectively, as shown in FIG. 43. After the third refresh operation, therefore, the selected memory cell {WL1, BL3} recovers the remanent polarization to that immediately after the operation of writing the data "1".

In the periods T1 (period other than t1) and T2 of the third refresh operation, the ferroelectric memory applies the potential differences ½ Vcc and −½ Vcc to the nonselected memory cells {WL1, BL1} and {WL1, BL2} respectively. Thus, the ferroelectric memory applies the potential differences ±½ Vcc of opposite directions to the nonselected memory cell {WL1, BL1} by the same frequencies in the periods T1 (period other than t1) and T2 respectively, thereby recovering and deteriorating the remanent polarization thereof by the same frequencies. After the third refresh operation, therefore, the nonselected memory cell {WL1, BL1} holds the same remanent polarization as that after the second refresh operation (see FIG. 42). The nonselected memory cell {WL1, BL2} shifts to a remanent polarization corresponding to the potential difference ½ Vcc along a hysteresis curve in the period T1 (period other than t1) and thereafter returns to the standby state for returning to the state immediately after the operation of writing the data "0", and hence the potential difference applied in the period T1 (period other than t1) contributes to neither deterioration nor recovery of the remanent polarization. The nonselected memory cell {WL1, BL2} deteriorating the remanent polarization once in the period T2 deteriorates the remanent polarization in correspondence the potential difference −½ Vcc once after the third refresh operation.

As hereinabove described, the ferroelectric memory can recover the memory cells {WL1, BL1}, {WL1, BL2} and {WL1, BL3} deteriorating the remanent polarizations to the remanent polarizations immediately after the write operation, i.e., the remanent polarizations immediately after the operation of writing the data "0" or "1", through the three refresh operations according to the driving method F. Further, the memory cell {WL1, BL1} once refreshed causes no deterioration of the remanent polarization beyond the single potential difference −½ Vcc in the subsequent second and third refresh operations. Even if the memory cell {WL1, BL1} deteriorates the remanent polarization beyond the single potential difference −½ Vcc, a read amplifier 9 (see FIG. 34) can determine the data from the remanent polarization causing this degree of deterioration, substantially leading to no problem such as disappearance of data. While the ferroelectric memory performs the refresh operation on the arbitrary memory cell {WL1, BL1} shown in FIG. 41, no deterioration of remanent polarizations progresses in the remaining unrefreshed memory cells {WL1, BL2} and {WL1, BL3} shown in FIG. 41, as hereinabove described.

According to the fifth embodiment, as hereinabove described, the ferroelectric memory, accessing the selected fourth cell according to the driving method E thereby deteriorating the remanent polarizations in the nonselected first and second cells and thereafter successively refreshing all memory cells according to the driving method F, can recover all memory cells including those deteriorating the remanent polarizations to the remanent polarizations immediately after the operation of writing the data "0" or "1" or the states deteriorated in response to the potential difference −½ Vcc (½ Vcc) once, whereby the memory cells can be inhibited from disturbance causing disappearance of data resulting from deterioration of the remanent polarizations.

According to the fifth embodiment, the ferroelectric memory performs the refresh operation according to the driving method F not every normal access according to the driving method E but after the arbitrary memory cell accumulates deterioration of the remanent polarization after a prescribed access frequency, whereby the time for the refresh operation can be remarkably reduced as compared with a case of performing the refresh operation every access. Thus, the ferroelectric memory can inhibit the number of operations from increase also when performing the refresh operation.

Sixth Embodiment

A ferroelectric memory according to a sixth embodiment of the present invention, collectively accessing word lines WL similarly to the ferroelectric memory according to the aforementioned third embodiment, applies potential differences ±½ Vcc to memory cells in place of ±⅓ Vcc.

Figure 44:
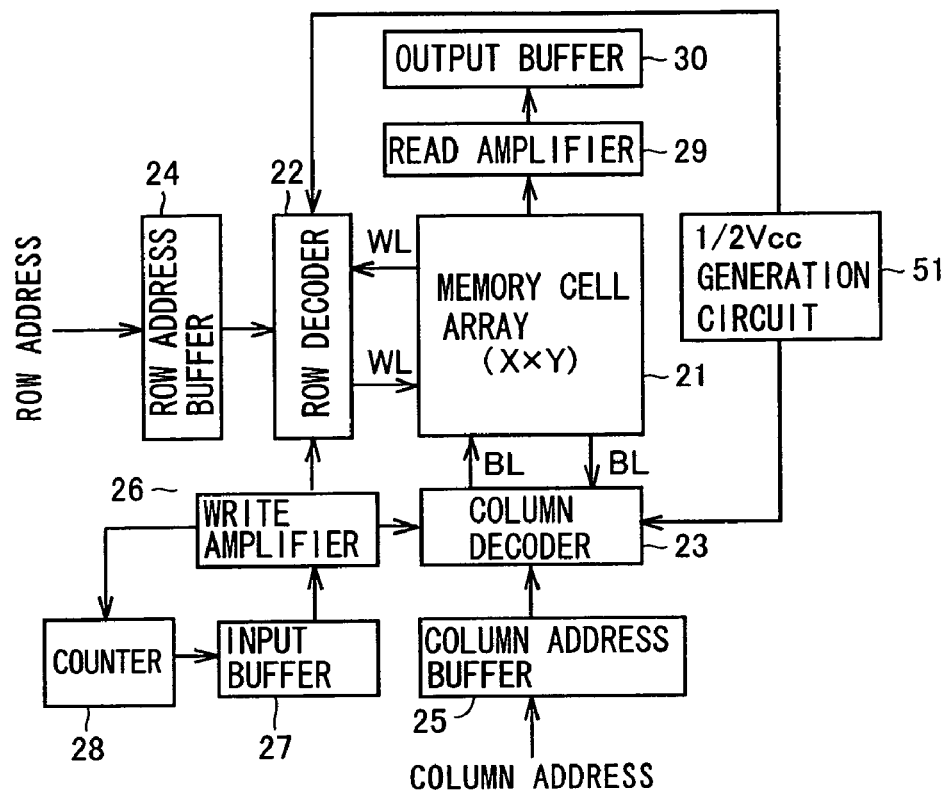
FIG. 44 is a block diagram showing the overall structure of a ferroelectric memory according to a sixth embodiment of the present invention.

Referring to FIG. 44, the ferroelectric memory according to the sixth embodiment has a structure obtained by replacing the ⅓ Vcc·⅔ Vcc generation circuit 31 (see FIG. 24) of the ferroelectric memory according to the aforementioned third embodiment with a ½ Vcc generation circuit 51. The remaining structure of the ferroelectric memory according to the sixth embodiment is similar to that of the ferroelectric memory according to the aforementioned third embodiment.

According to the sixth embodiment, the ferroelectric memory applies three types of voltages 0 V, ½ Vcc and Vcc, i.e., smaller by one type than the four types of voltages 0 V, ⅓ Vcc, ⅔ Vcc and Vcc in each of the aforementioned third and fourth embodiments, to the word lines WL and bit lines BL. Thus, the voltage generation circuit (½ Vcc generation circuit 51) and a control circuit system can be simplified in the sixth embodiment as compared with the aforementioned third and fourth embodiments.

Operations of the ferroelectric memory according to the sixth embodiment are now described with reference to FIGS. 26 and 45 to 47.

The ferroelectric memory according to the sixth embodiment employs two driving methods G and H. According to the driving method G, the number of necessary operations is reduced while the remanent polarizations of nonselected cells may be deteriorated in read-rewrite operations or a write operation. According to the driving method H, on the other hand, the number of necessary operations is increased as compared with the driving method G while the remanent polarizations of the nonselected cells are not remarkably deteriorated to allow no determination of data in the read-rewrite operations.

According to the sixth embodiment, the ferroelectric memory performs the read-rewrite operations and the write operation with the driving method G in normal access, while performing a refresh operation (recovery) with the driving method H for recovering the memory cells from deterioration of remanent polarizations accumulated through the driving method G after a prescribed frequency of normal access. According to the sixth embodiment, the ferroelectric memory counts the frequency of normal access according to the driving method G with a counter 28 and performs the refresh operation every prescribed access frequency counted by the counter 28, similarly to the aforementioned third embodiment. The driving methods G and H employed for the normal access and the refresh operation respectively are now described.

(1) Read-Rewrite Operation

The read-rewrite operations and the write operation (normal access) according to the driving method G are described with reference to FIGS. 45 and 46. It is assumed that operating periods T1 and T2 shown in FIGS. 45 and 46 are identical to each other (T seconds).

Figure 45:
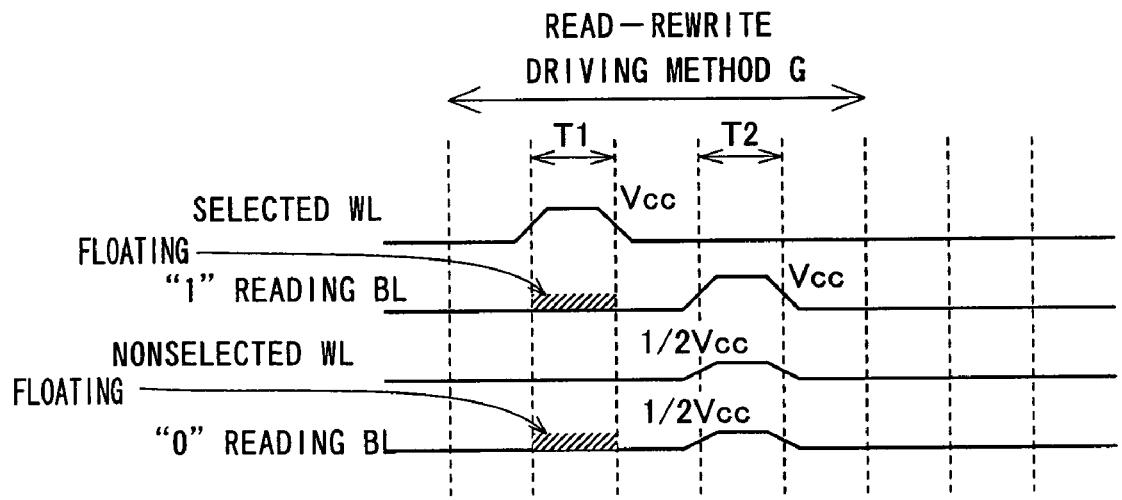
FIG. 45 is a voltage waveform diagram for illustrating read-rewrite operations in normal access according to a driving method G in the sixth embodiment.
Figure 46:
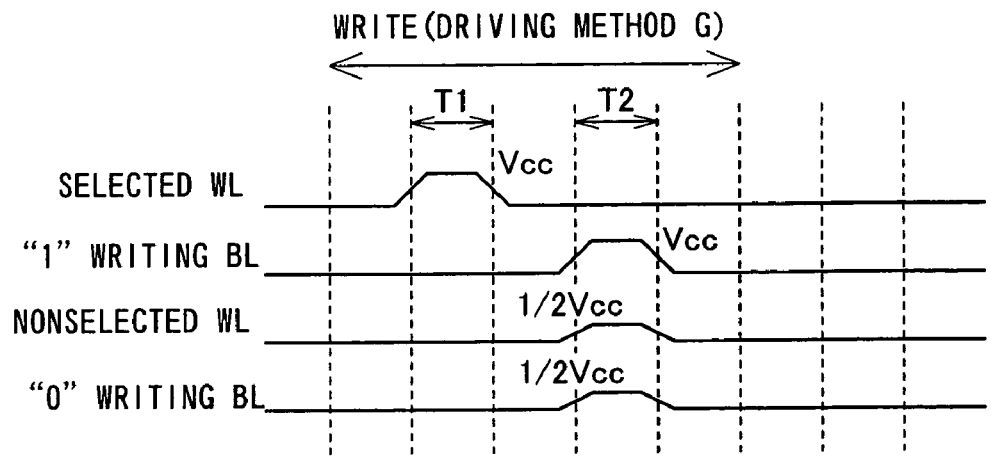
FIG. 46 is a voltage waveform diagram for illustrating a write operation in normal access according to the driving method G in the sixth embodiment.

The ferroelectric memory performs the read operation in the period T1 shown in FIG. 45. This read operation is similar to that with the driving method C according to the aforementioned third embodiment. In the read operation of the period T1, the ferroelectric memory applies the following potential differences to memory cells of first to fourth cell regions (see FIG. 26) for T seconds respectively: The ferroelectric memory applies the potential difference between the voltage Vcc and a voltage Vr0 ("0" reading potential) (Vcc−Vr0) to the memory cells of the first cell regions for T seconds. The ferroelectric memory applies the potential difference between the voltage Vcc and a voltage Vr1 ("1" reading potential) (Vcc−Vr1) to the memory cells of the second cell regions for T seconds. The ferroelectric memory applies a potential difference −Vr1 to the memory cells of the third cells for T seconds. The ferroelectric memory applies a potential difference −Vr0 to the memory cells of the fourth cell regions for T seconds.

At this time, nonselected memory cells of the third and fourth cell regions deteriorate and recover the remanent polarizations when holding the following data respectively: The nonselected memory cells of the third cell regions recover the remanent polarizations when holding the data "1", while deteriorating the remanent polarizations when holding the data "0". The nonselected memory cells of the fourth cell regions recover the remanent polarizations when holding the data "1", while deteriorating the remanent polarizations when holding the data "0". The ferroelectric memory does not destroy the data "0" of the selected memory cells of the first cell regions through the read operation in the period T1, while destroying the data "1" of the selected memory cells of the second cell regions and rewriting the data "0" therein.

After the read operation in the aforementioned period T1, the ferroelectric memory temporarily returns to a standby state. Thereafter the ferroelectric memory performs the rewrite operation for rewriting the data "1" in the memory cells of the second cell regions in the period T2. In the period T2, the ferroelectric memory sets a selected word line WL5, nonselected word lines WL1 to WL4 and WL6 to WL8, "1" reading bit lines BL4 and BL6 and "0" reading bit lines BL1 to BL3, BL5, BL7 and BL8 to voltages 0 V, ½ Vcc, Vcc and ½ Vcc respectively. In this case, the ferroelectric memory applies the following potential differences to the memory cells of the first to fourth cell regions for T seconds in the period T2 respectively:

The ferroelectric memory applies the potential difference −½ Vcc to the memory cells of the first cell regions. Thus, the memory cells of the first cell regions holding the data "0" deteriorate the remanent polarizations. The ferroelectric memory applies the potential difference −Vcc to the memory cells of the second cell regions. Thus, the ferroelectric memory writes the data "1" in to the memory cells of the second cell regions. The ferroelectric memory applies the potential difference −½ Vcc to the memory cells of the third cell regions. Thus, the memory cells of the third cell regions recover the remanent polarizations when holding the data "1", while deteriorating the remanent polarizations when holding the data "0". The ferroelectric memory applies the potential difference 0 V to the memory cells of the fourth cell regions. Thus, the memory cells of the fourth cell regions neither deteriorate nor recover the remanent polarizations.

In the ferroelectric memory according to the sixth embodiment, as hereinabove described, the nonselected memory cells of the third cell regions deteriorate the remanent polarizations twice when holding the data "0", while deteriorating the remanent polarizations once when holding the data "0" throughout the read-rewrite operations according to the driving method G in the normal access. When the ferroelectric memory repeats the read-rewrite operations according to the driving method G, therefore, the nonselected memory cells of the third and fourth cell regions accumulate deterioration of the remanent polarizations.

(2) Write Operation

The write operation according to the driving method G in the normal access is now described with reference to FIGS. 26 and 46. The ferroelectric memory performs the write operation throughout a "0" write operation and a "1" write operation in period T1 and T2 shown in FIG. 46 respectively. It is assumed that the periods T1 and T2 are identical to each other (T seconds). The ferroelectric memory may perform the operations in the periods T1 and T2 continuously or independently of each other. The operations in the read operation are now described. It is assumed that both of the word lines WL and the bit lines BL are at 0 V in the standby state.

In the period T1 shown in FIG. 46, the ferroelectric memory collectively writes the data "0" in all memory cells connected to the selected word line WL5. From the standby state, the ferroelectric memory sets only the selected word line WL5 to the voltage Vcc while maintaining all bit lines BL1 to BL8 at 0 V. At this time, the ferroelectric memory applies the potential difference Vcc to the selected memory cells of the first and second cell regions in the period T1. The ferroelectric memory causes no potential differences in the nonselected memory cells of the third and fourth cell regions.

After a lapse of the period T1, the ferroelectric memory sets the voltage of the selected word line WL5 to 0 V and returns to the standby state, thereby completing the collective "0" write operation. In this period T1, the ferroelectric memory writes the data "0" in the memory cells of the first and second cell regions having held the data "0" and "1" respectively. The remanent polarizations of the nonselected memory cells of the third and fourth cell regions causing no potential differences remain unchanged.

In the period T2 shown in FIG. 46, the ferroelectric memory writes the data "1". In this period T2, the ferroelectric memory sets the selected word line WL5, the nonselected word lines WL1 to WL4 and WL6 to WL8, the "1" writing bit lines BL4 and BL6 and the "0" writing bit lines BL1 to BL3, BL5, BL7 and BL8 to the voltages 0 V, ½ Vcc, Vcc and ½ Vcc respectively. In this case, the ferroelectric memory applies the potential differences ½ Vcc, −Vcc, −½ Vcc and 0 V to the memory cells of the first, second, third and fourth cell regions for T seconds in the period T2 respectively.

Thus, the memory cells of the third cell regions recover the remanent polarizations when holding the data "1", while deteriorating the remanent polarizations when holding the data "0". The memory cells of the fourth cell regions neither deteriorate nor recover the remanent polarizations. The selected memory cells of the first cell regions hold the data "0". The ferroelectric memory writes the data "1" in the selected memory cells of the second cell regions.

When the ferroelectric memory according to the sixth embodiment writes the data "1" through the write operation according to the driving method in the normal access, the nonselected memory cells of the third cell regions deteriorate the remanent polarizations when holding the data "0", as hereinabove described. When the ferroelectric memory repeats the write operation according to the driving method G in the normal access, therefore, the nonselected memory cells of the third cell regions holding the data "0" accumulate deterioration of the remanent polarizations.

(Driving Method H: Refresh Operation)

The read-rewrite operations (refresh operation) according to the driving method H are now described with reference to FIGS. 26 and 47.

Figure 47:
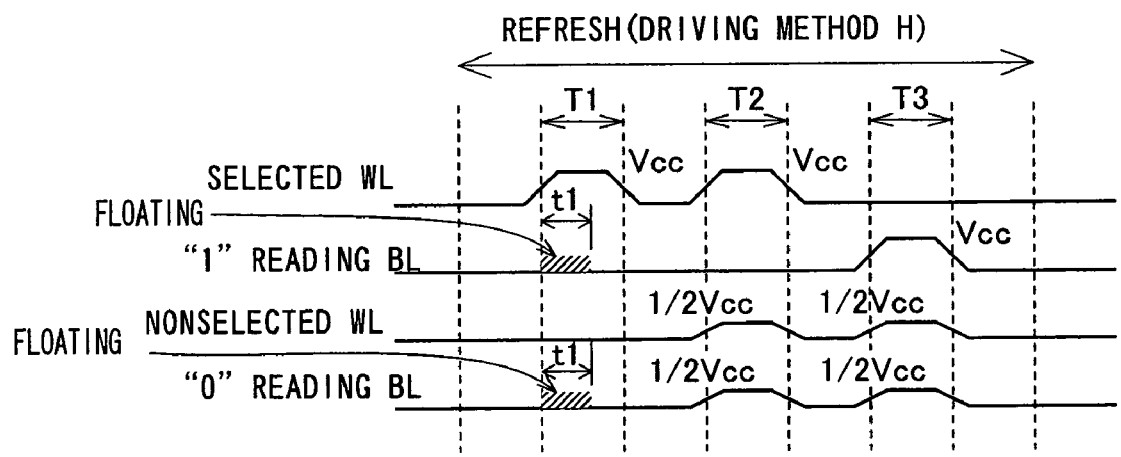
FIG. 47 is a voltage waveform diagram for illustrating a refresh operation (read-rewrite operations) according to a driving method H in the sixth embodiment.

As shown in FIG. 47, the ferroelectric memory performs the read-rewrite operations (refresh operation) in periods T1, T2 and T3. It is assumed the periods T1 to T3 are identical to each other (T seconds). The ferroelectric memory may perform operations in the periods T1 to T3 continuously or independently of each other. The ferroelectric memory brings all bit lines BL1 to BL8 into floating states in a period t1. The operations in the periods T1 to T3 are now described. It is assumed that the word lines WL1 to WL8 and the bit lines BL1 to BL8 are at 0 V in a standby state.

(1) Read Operation (T1)

The ferroelectric memory reads data in the period T1 shown in FIG. 47. From the standby state, the ferroelectric memory brings all bit lines BL1 to BL8 into floating states, and sets the selected word line WL5 to the voltage Vcc at the same timing or in a delay of several nsec. to several 10 nsec. In this state, the ferroelectric memory determines data "0" or "1" similarly to the aforementioned third embodiment.

In the period t1 for bringing all bit lines BL1 to BL8 into the floating states, the ferroelectric memory applies the potential difference between the voltage Vcc and a potential Vr0 ("0" reading potential) (Vcc–Vr0) to the memory cells of the first cell regions. The ferroelectric memory applies the potential difference between the voltage Vcc and a potential Vr1 ("1" reading potential) (Vcc–Vr1) to the memory cells of the second cell regions in the period t1. The ferroelectric memory applies the potential difference –Vr to the memory cells of the third cell regions in the period t1. The ferroelectric memory applies the potential difference –Vr0 to the memory cells of the fourth cell regions in the period t1.

After a lapse of the period t1, the ferroelectric memory sets all bit lines BL1 to BL8 to 0 V. This period corresponds to the period T1 other than t1. In this period T1 other than t1, the ferroelectric memory applies the potential difference Vcc to the selected memory cells of the first and second cell regions for a period (T–t1), while the nonselected memory cells of the third and fourth cell regions causing no potential difference neither deteriorate nor recover the remanent polarizations.

After a lapse of the period T1, the ferroelectric memory sets the voltage of the selected word line WL5 to 0 V and returns to the standby state, thereby completing the read operation. In the period T1, the remanent polarizations of the selected memory cells of the first and second cell regions change as follows: The ferroelectric memory does not destroy the data "0" stored in the memory cells of the first cell regions through the read operation. On the other hand, the ferroelectric memory destroys the data "1" stored in the memory cells of the second cell regions, and writes the data "0" therein. Therefore, the ferroelectric memory must rewrite the data "1" in the memory cells of the second cell regions. According to the sixth embodiment, the ferroelectric memory performs this rewrite operation in periods T2 and T3.

(2) Rewrite Operation (T2, T3)

From the standby state, the ferroelectric memory sets the selected word line WL5, the nonselected word lines WL1 to WL4 and WL6 to WL8, the "1" reading bit lines BL4 and BL6 and the "0" reading bit lines BL1 to BL3, BL5, BL7 and BL8 to the voltages Vcc, ½ Vcc, 0 V and ½ Vcc in the period T2 shown in FIG. 47 respectively. In this case, the ferroelectric memory applies the potential differences ½ Vcc, Vcc and 0 V to the memory cells of the first and third cell regions, the memory cells of the second cell regions and the memory cells of the fourth cell regions for T seconds in the period T2 respectively.

After a lapse of the period T2, the ferroelectric memory returns to the standby state as shown in FIG. 47. In the period T2, the remanent polarizations of the memory cells of the first to fourth cell regions change as follows: The memory cells of the first cell regions holding the data "0" recover the remanent polarizations due to the application of the potential difference ½ Vcc in the period T2. In the period T2, the ferroelectric memory applies the potential difference Vcc to the memory cells of the second cell regions, in which the same has written the data "0" in the period T1, thereby rewriting the data "0" therein. The nonselected memory cells of the third cell regions recover or deteriorate the remanent polarizations depending on the contents of the stored data. More specifically, the memory cells of the third cell regions recover the remanent polarizations when holding the data "0", while deteriorating the remanent polarizations when holding the data "1". The memory cells of the fourth cell regions neither deteriorate nor recover the remanent polarizations.

Then, the ferroelectric memory sets the selected word line WL5, the nonselected word lines WL1 to WL4 and WL6 to WL8, the "1" reading bit lines BL4 and BL6 and the "0" reading bit lines BL1 to BL3, BL5, BL7 and BL8 to the voltages 0 V, ½ Vcc, Vcc and ½ Vcc from the standby state in the period T3 shown in FIG. 47 respectively. In this case, the ferroelectric memory applies the following potential differences to the memory cells of the first to fourth cell regions for T seconds in the period T3 respectively: The ferroelectric memory applies the potential differences –½ Vcc, –Vcc and 0 V to the memory cells of the first and third cell regions, the memory cells of the second cell regions and the memory cells of the fourth cell regions respectively.

After a lapse of the period T3, the ferroelectric memory returns to the standby state as shown in FIG. 47, for terminating the series of read-rewrite operations. In the period T3, the polarizations of the memory cells of the first to fourth regions change as follows respectively: The memory cells of the first cell regions storing the data "0", subjected to the application of the potential difference –½ Vcc in the period T3, deteriorate the remanent polarizations. The ferroelectric memory applying the potential difference –Vcc to the memory cells of the second cell regions in the period T3 writes the data "1" therein. Thus, the ferroelectric memory completely rewrites the data "1" destroyed through the read operation. The nonselected memory cells of the third cell regions recover or deteriorate the remanent polarizations depending on the contents of the data stored therein, similarly to the period T2. More specifically, the memory cells of the third cell regions deteriorate the remanent polarizations when holding the data "0", while recovering the remanent polarizations when holding the data "1". The memory cells of the fourth cell regions neither deteriorate nor recover the remanent polarizations.

In the refresh operation employing the driving method H according to the sixth embodiment, the memory cells of the first and third cell regions necessarily recover and deteriorate the remanent polarizations once while the memory cells of the fourth cell regions neither deteriorate nor recover the remanent polarizations throughout the read-rewrite operations. Therefore, no memory cells continuously deteriorate the remanent polarizations when the ferroelectric memory repeats the read-rewrite operations.

In the refresh operation employing the driving method H according to the sixth embodiment, as hereinabove described, the ferroelectric memory, applying the voltages ±½ Vcc of opposite directions to the memory cells of the first and third cell regions once while applying the potential difference 0 V to the memory cells of the fourth cell regions throughout the read and rewrite operations, can inhibit the memory cells of the first, third and fourth cell regions from deterioration of the remanent polarizations. Thus, the ferroelectric memory can inhibit the memory cells of the first cell regions, holding the data "0", from disturbance causing disappearance of data among all nonselected memory cells of the third and fourth cell regions and all selected memory cells.

Changes of the remanent polarizations in the memory cells following the refresh operation of the ferroelectric memory according to the sixth embodiment employing the driving method H are now described with reference to FIGS. 48 to 51.

Figure 48:
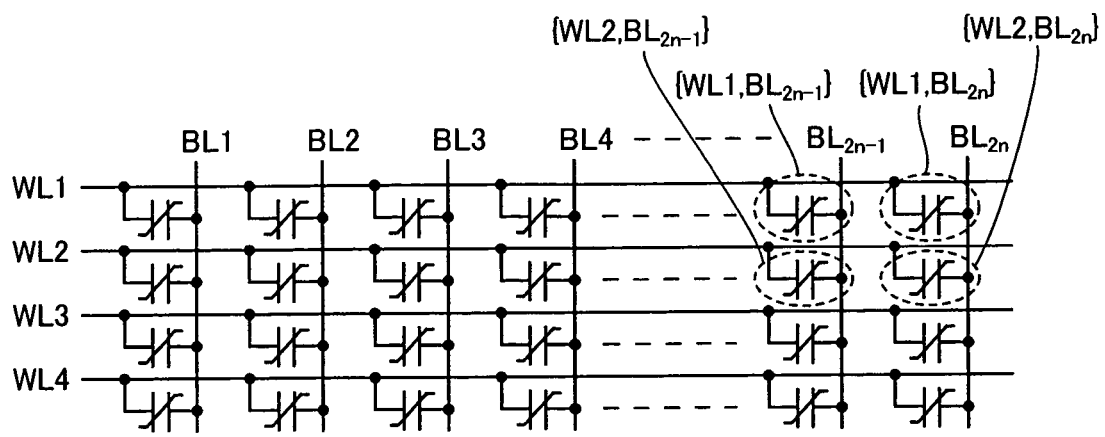
FIG. 48 is an equivalent circuit diagram of refreshed simple matrix memory cells.

In the refresh operation employing the driving method H according to the sixth embodiment, the ferroelectric memory collectively refreshes all memory cells connected to each word line WL, similarly to the aforementioned third embodiment. More specifically, the ferroelectric memory collectively refreshes memory cells {WL1, BL1}, {WL1, BL2}, {WL1, BL3}, ..., {WL1, $BL_{2n-1}$} and {WL1, $BL_{2n}$} connected to the word line WL1, as shown in FIG. 48. Thereafter the ferroelectric memory collectively refreshes memory cells {WL2, BL1}, {WL2, BL2}, {WL2, BL3}, ..., {WL2, $BL_{2n-1}$} and {WL2, $BL_{2n}$} connected to the word line WL2.

Thereafter the ferroelectric memory successively collectively refreshes the memory cells connected to the word lines WL3 to WLn every word line WL. Thus, the ferroelectric memory refreshes all memory cells.

Figure 49:
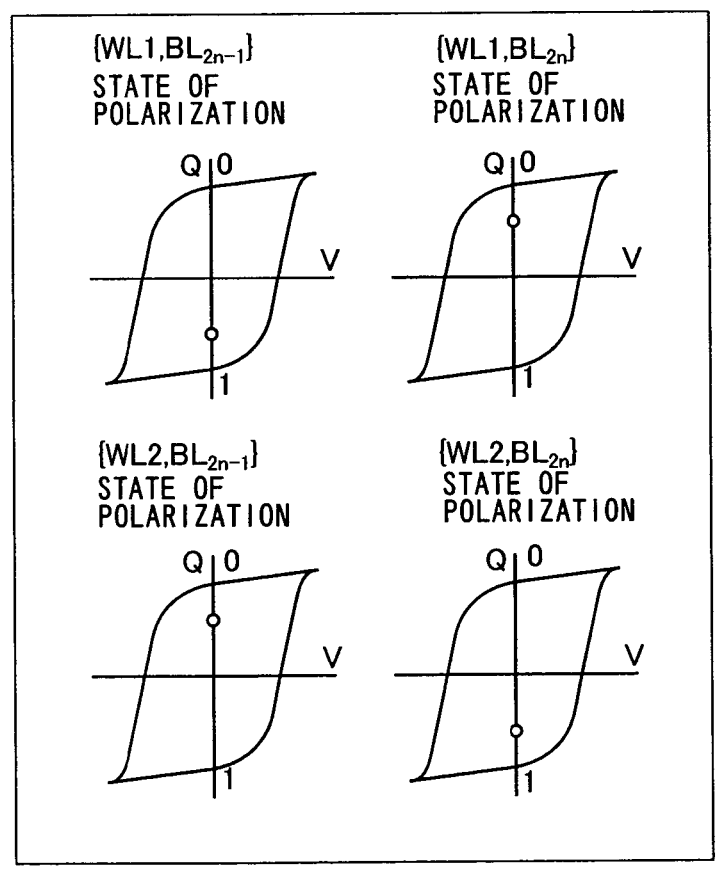
FIG. 49 is a hysteresis diagram showing remanent polarizations of unrefreshed memory cells in the ferroelectric memory according to the sixth embodiment.

Changes of the remanent polarizations of the memory cells {WL1, $BL_{2n-1}$}, {WL1, $BL_{2n}$}, {WL2, $BL_{2n-1}$} and {WL2, $BL_{2n}$}, having remanent polarizations deteriorated as shown in FIG. 49 in unrefreshed states, subjected to two refresh operations according to the driving method H are now described. In the unrefreshed states, the memory cells {WL1, $BL_{2n-1}$} and {WL1, $BL_{2n}$} hold the data "1" and "0" respectively. Further, the memory cells {WL2, $BL_{2n-1}$} and {WL2, $BL_{2n}$} hold the data "0" and "1" respectively.

Figure 50:
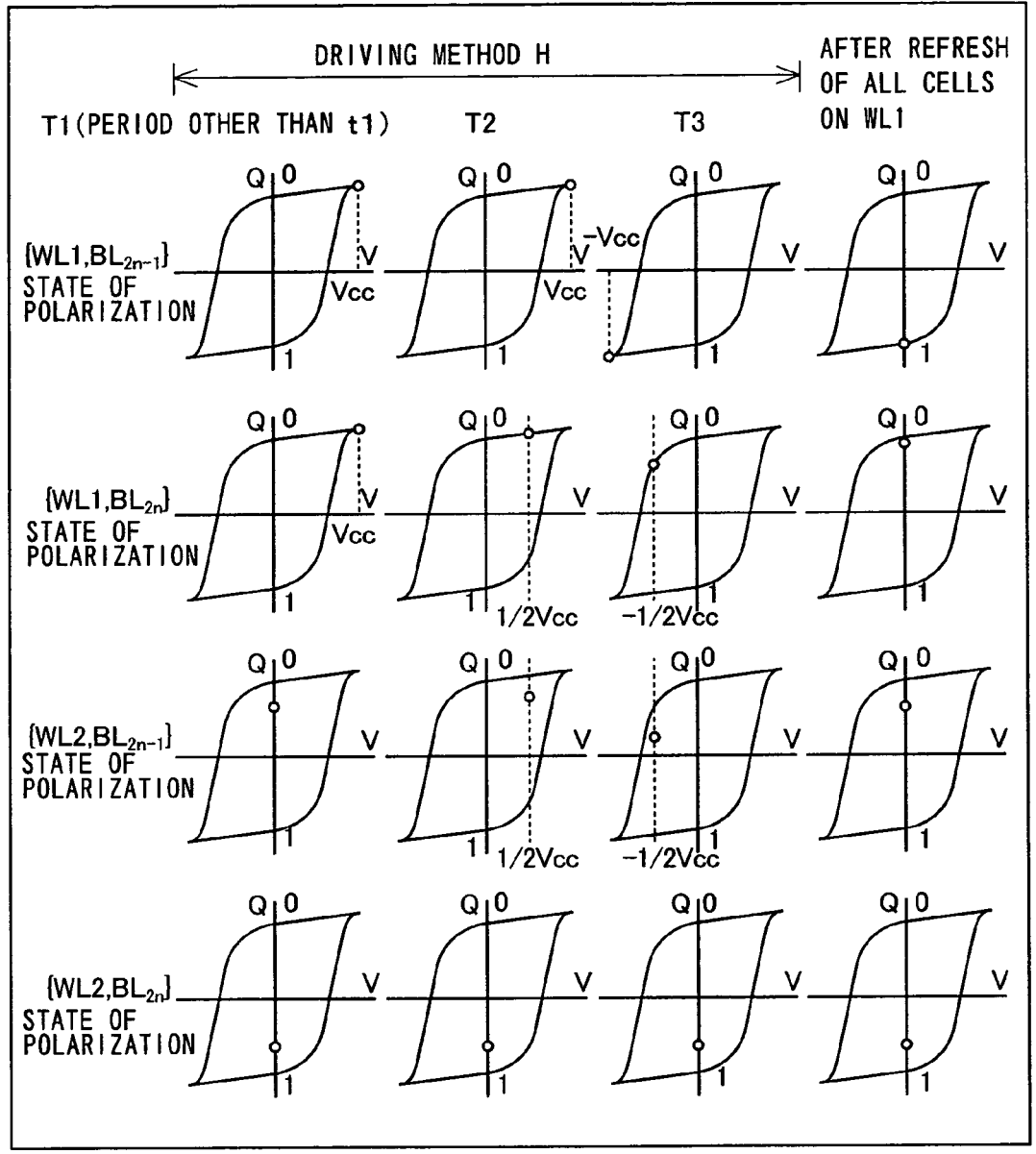
FIG. 50 is a hysteresis diagram showing changes of the remanent polarizations in the memory cells according to the sixth embodiment following a first refresh operation.

The ferroelectric memory selects the word line WL1 for performing the first refresh operation according to the driving method H. In respective periods T1 (period other than t1) to T3 of the first refresh operation, the ferroelectric memory applies the potential differences Vcc, Vcc and −Vcc to the selected memory cell {WL1, $BL_{2n-1}$} respectively, as shown in FIG. 50. After the first refresh operation, therefore, the selected memory cell {WL1, $BL_{2n-1}$} recovers the remanent polarization to the state immediately after the operation of writing the data "1". In the respective periods T1 (period other than t1) to T3 of the first refresh operation, the ferroelectric memory applies the potential differences Vcc, ½ Vcc and −½ Vcc to the selected memory cell {WL1, $BL_{2n}$} respectively. Thus, the selected memory cell {WL1, $BL_{2n}$} temporarily recovers the remanent polarization to the state immediately after the operation of writing the data "0" due to the potential difference Vcc applied in the period T1 (period other than t1). The selected memory cell {WL1, $BL_{2n}$} shifts to a remanent polarization corresponding to the potential difference ½ Vcc along a hysteresis curve in the period T2 and returns to the standby state after the period T2, thereby returning to the remanent polarization immediately after the operation of writing the data "0". Thereafter the selected memory cell {WL1, $BL_{2n}$} deteriorates the remanent polarization in correspondence to the potential difference −½ Vcc once in the period T3. After the first refresh operation, therefore, the selected memory cell {WL1, $BL_{2n}$} deteriorates the remanent polarization in correspondence to the potential difference −½ Vcc once from that immediately after the operation of writing the data "0".

In the respective periods T1 (period other than t1) to T3 of the first refresh operation, the ferroelectric memory applies the potential differences 0 V, ½ Vcc and −½ Vcc to the nonselected memory cell {WL2, $BL_{2n-1}$} respectively. Thus, the remanent polarization of the nonselected memory cell {WL2, $BL_{2n-1}$} remains unchanged in the period T1 (period other than t1). The nonselected memory cell {WL2, $BL_{2n-1}$} recovers the remanent polarization in the period T2, and deteriorates the remanent polarization in the period T3. After the period T3, therefore, the remanent polarization of the nonselected memory cell {WL2, $BL_{2n-1}$} deteriorated and recovered single times in the periods T2 and T3 respectively reaches the same state as that after the period T1 (period other than t1). After the first refresh operation, therefore, the nonselected memory cell {WL2, $BL_{2n-1}$} holds the same remanent polarization as that before the refresh operation (see FIG. 49). In all periods T1 (period other than t1) to T3 of the first refresh operation, the ferroelectric memory applies the potential differences 0 V to the nonselected memory cell {WL2, $BL_{2n}$} respectively. After the first refresh operation, therefore, the nonselected memory cell {WL2, $BL_{2n}$} holds the same remanent polarization as that before the refresh operation (see FIG. 49).

Figure 51:
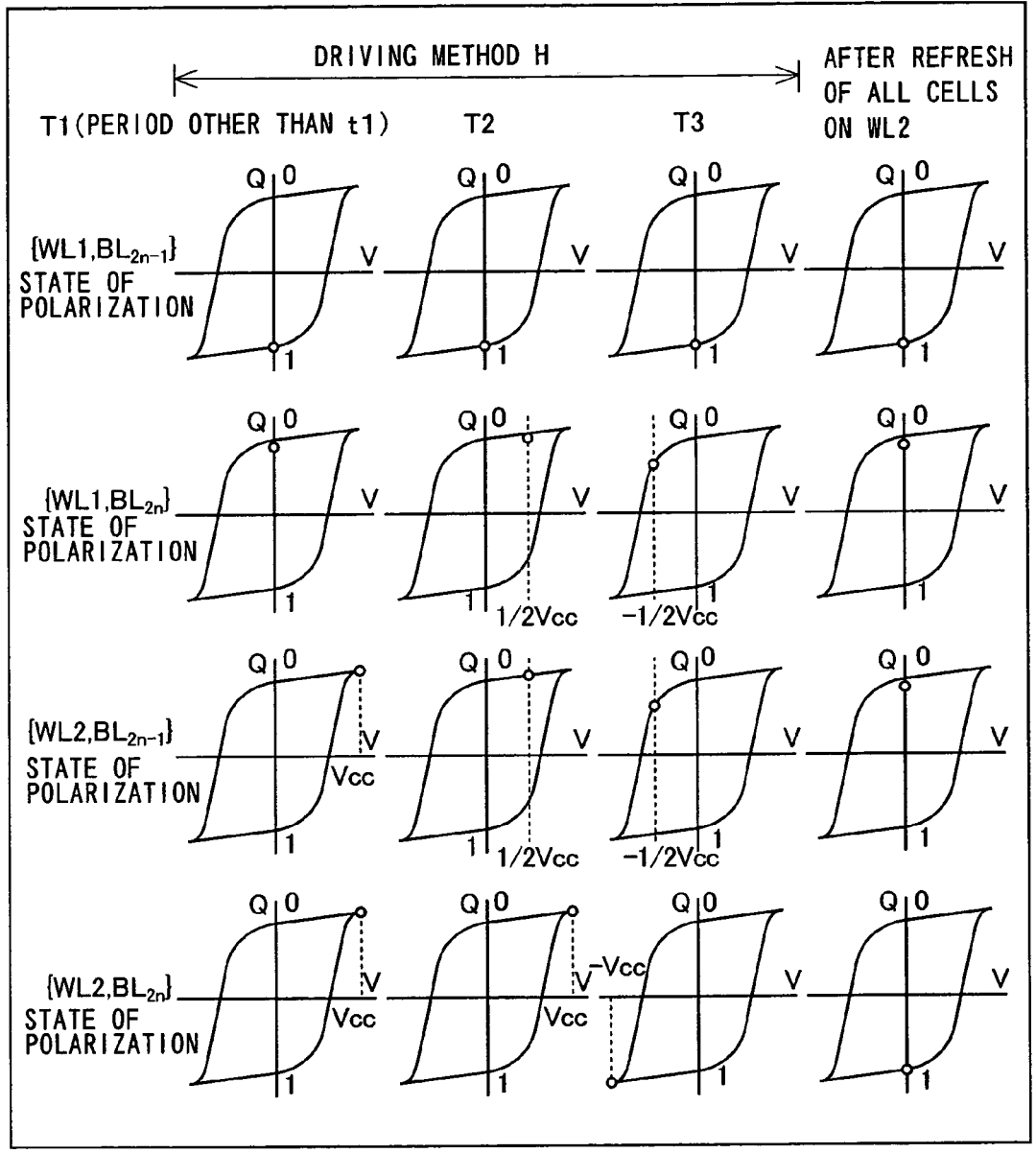
FIG. 51 is a hysteresis diagram showing changes of the remanent polarizations in the memory cells according to the sixth embodiment following a second refresh operation.

Then, the ferroelectric memory selects the word line WL2 for performing the second refresh operation according to the driving method H. In respective periods T1 (period other than t1) to T3 of the second refresh operation, the ferroelectric memory applies the potential differences Vcc, Vcc and −Vcc to the selected memory cell {WL2, $BL_{2n}$} respectively, as shown in FIG. 51. After the second refresh operation, therefore, the selected memory cell {WL2, $BL_{2n}$} recovers the remanent polarization to that immediately after the operation of writing the data "1".

In the respective periods T1 (period other than t1) to T3 of the second refresh operation, the ferroelectric memory applies the potential differences Vcc, ½ Vcc and −½ Vcc to the selected memory cell {WL2, $BL_{2n-1}$} respectively. Thus, the selected memory cell {WL2, $BL_{2n-1}$} temporarily recovers the remanent polarization to the state immediately after the operation of writing the data "0" due to the potential difference Vcc applied in the period T1 (period other than t1). The selected memory cell {WL2, $BL_{2n-1}$} shifts to a remanent polarization corresponding to the potential difference ½ Vcc along a hysteresis curve in the period T2 and returns to the standby state after the period T2, thereby returning to the remanent polarization immediately after the operation of writing the data "0". Thereafter the selected memory cell {WL2, $BL_{2n-1}$} deteriorates the remanent polarization in correspondence to the potential difference −½ Vcc once in the period T3. After the second refresh operation, therefore, the selected memory cell {WL2, $BL_{2n-1}$} deteriorates the remanent polarization in correspondence to the potential difference −½ Vcc once from that immediately after the operation of writing the data "0".

In all periods T1 (period other than t1) to T3 of the second refresh operation, the ferroelectric memory applies the potential difference 0 V to the nonselected memory cell {WL1, $BL_{2n-1}$}. After the second refresh operation, therefore, the nonselected memory cell {WL1, $BL_{2n-1}$} holds the remanent polarization immediately after the operation of writing the data "1", i.e., the state after the first refresh operation (see FIG. 50). In the periods T1 (period other than t1) to T3 of the second refresh operation, the ferroelectric memory applies the potential differences 0 V, ½ Vcc and −½ Vcc to the nonselected memory cell {WL1, $BL_{2n}$} respectively. Thus, the remanent polarization of the nonselected memory cell {WL1, $BL_{2n}$} remains unchanged in the period T1 (period other than t1). The nonselected memory cell {WL1, $BL_{2n}$} recovers the remanent polarization in the period T2, and deteriorates the remanent polarization in the period T3. After the period T3, therefore, the remanent polarization of the nonselected memory cell {WL1, $BL_{2n}$} recovered and deteriorated single times in the periods T2 and T3 respectively reaches the same state as that after the period T1 (period other than t1). After the second refresh operation, therefore, the nonselected memory cell {WL1, $BL_{2n}$} holds the same remanent polarization as that after the first refresh operation (see FIG. 50).

As hereinabove described, the ferroelectric memory can recover the memory cells {WL1, $BL_{2n-1}$}, {WL1, $BL_{2n}$}, {WL2, $BL_{2n-1}$} and {WL2, $BL_{2n}$} deteriorating the remanent polarizations through the first and second refresh operations according to the driving method H to the remanent polarizations immediately after the operation of writing the data, i.e., the remanent polarizations after the operation of writing the data "0" or "1". Further, the memory cells {WL1, $BL_{2n-1}$} and {WL1, $BL_{2n}$} once refreshed do not deteriorate the remanent polarizations beyond the single potential difference −½ Vcc in the subsequent two refresh operations. Even if the memory cells {WL1, $BL_{2n-1}$} and {WL1, $BL_{2n}$} deteriorate the remanent polarizations beyond the single potential difference −½ Vcc, a read amplifier 29 (see FIG. 44) can determine the data with the remanent polarizations deteriorated by this degree, substantially leading to no problem such as disappearance of data. While the ferroelectric memory performs a refresh operation on memory cells (the memory cells {WL1, BL$_{2n-1}$} and {WL1, BL$_{2n}$} shown in FIG. 50, for example) connected to an arbitrary word line WL, no deterioration of remanent polarizations progresses in unrefreshed memory cells (the memory cells {WL2, BL$_{2n-1}$} and {WL2, BL$_{2n}$} shown in FIG. 50, for example) among the remaining memory cells.

According to the sixth embodiment, as hereinabove described, the ferroelectric memory, accessing the selected memory cells of the first and second cell regions according to the driving method G thereby deteriorating the remanent polarizations in the nonselected memory cells of the third and fourth cell regions and thereafter collectively refreshing all memory cells according to the driving method H every word line WL, can recover all memory cells including those deteriorating the remanent polarizations to the remanent polarizations immediately after the operation of writing the data "0" or "1" or the states deteriorated in correspondence to the potential difference −½ Vcc (½ Vcc) once, whereby the memory cells can be inhibited from disturbance causing disappearance of the data resulting from deterioration of the remanent polarizations.

According to the sixth embodiment, further, the ferroelectric memory performs the refresh operation according to the driving method H not every normal access according to the driving method G but after arbitrary memory cells accumulate deterioration of the remanent polarizations after a prescribed access frequency, whereby the operating time for the refresh operation can be remarkably reduced as compared with a case of performing the refresh operation every access. Thus, the ferroelectric memory can inhibit the number of operations from increase also when performing the refresh operation.

Although the present invention has been described and illustrated in detail, it is clearly understood that the same is by way of illustration and example only and is not to be taken by way of limitation, the spirit and scope of the present invention being limited only by the terms of the appended claims.

For example, while the ferroelectric memory according to each of the aforementioned embodiments employs the combination of the driving methods A and B, the driving methods C and D, the driving methods E and F or the driving methods G and H as that of the driving methods for the normal read-rewrite operations and the refresh operation on the memory cells respectively, the present invention is not restricted to this but the ferroelectric memory may alternatively perform the normal read-rewrite operations with any of the driving methods A, C, E and G while performing the refresh operation with any of the driving methods B, D, F and H.

While the present invention is applied to the memory comprising the memory cell array constituted of the memory cells directly connected to the word lines WL and the bit lines BL in each of the aforementioned embodiments, the present invention is not restricted to this but may alternatively be applied to a memory comprising a memory cell array having a hierarchical structure consisting of a plurality of local memory cell arrays including memory cells. More specifically, a ferroelectric memory according to a modification of the first embodiment is so constituted that a memory cell array 61 includes a plurality of local memory cell arrays 61*a* each including a plurality of memory cells (not shown), as shown in FIG. 52.

Figure 52:
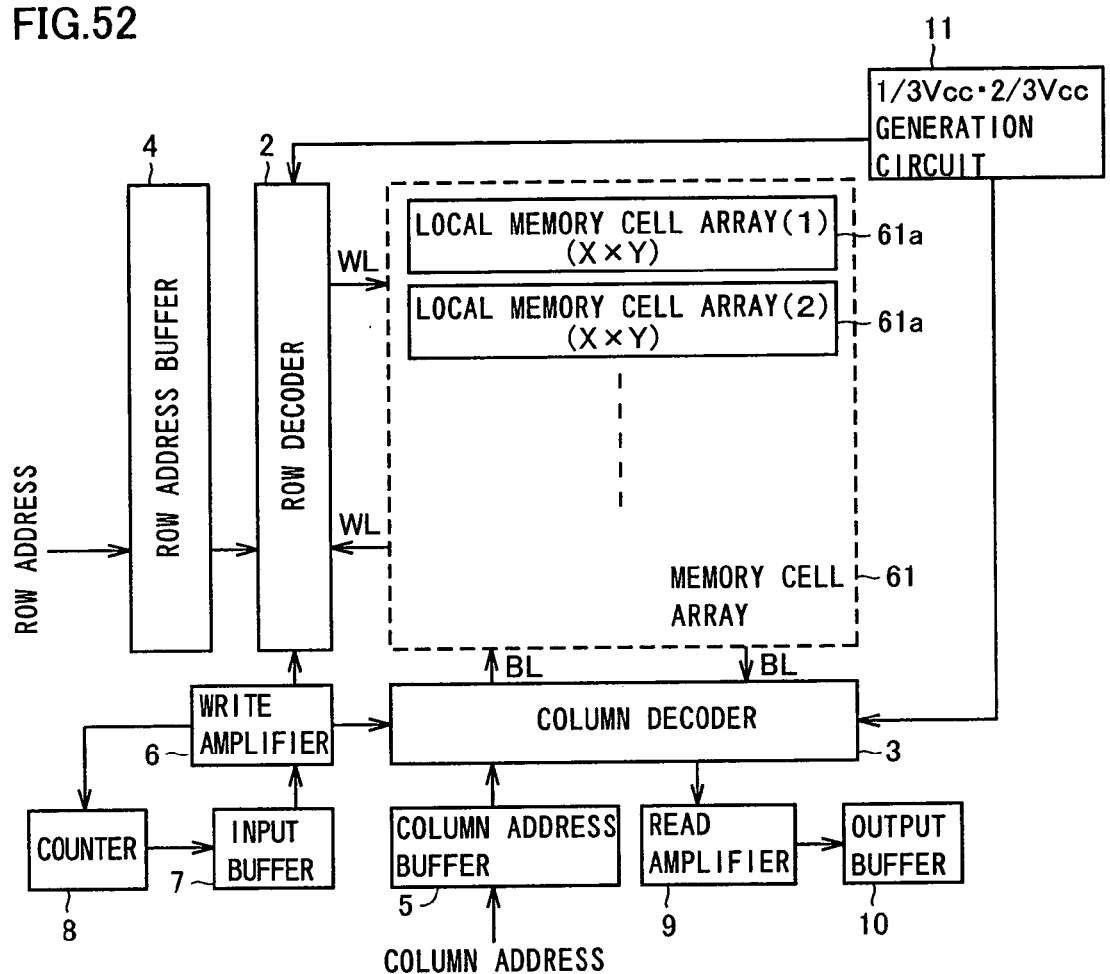
FIG. 52 is a block diagram showing the overall structure of a ferroelectric memory according to a modification of the first embodiment of the present invention.

The ferroelectric memory according to the modification of the first embodiment shown in FIG. 52 individually performs normal read-rewrite operations and a write operation with any of the driving methods A, C, E and G every local memory cell array 61*a*, and performs a refresh operation with any of the driving methods B, D, F and H. More specifically, the ferroelectric memory performs normal read-rewrite operations and a write operation on an arbitrary local memory cell array (1) (see FIG. 52) while performing a refresh operation on another local memory cell array (2) (see FIG. 52) at the same time. The local memory cell arrays (1) and (2) are examples of the "first local memory cell array" and the "second local memory cell array" in the present invention respectively. When individually performing the normal read-rewrite operations and the write operation as well as the refresh operation every local memory cell array 61*a*, the ferroelectric memory can substantially avoid occurrence of a period allowing no normal external access (the read-rewrite operations and the write operation) resulting from the refresh operation.

Figure 53:
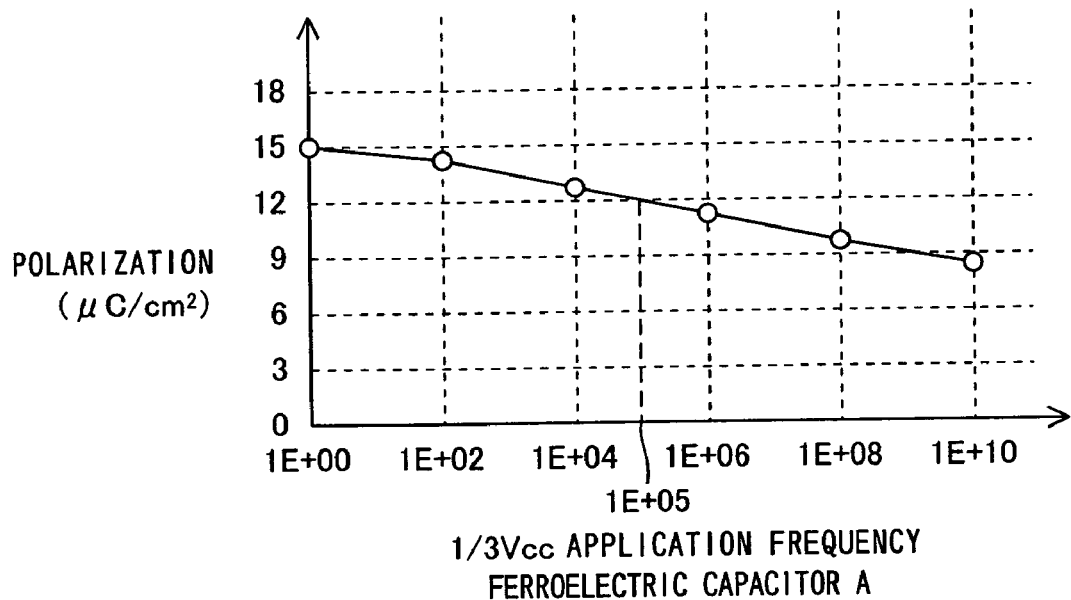
FIGS. 53 and 54 illustrate the relations between remanent polarizations and frequencies of application of a voltage ⅓ Vcc in ferroelectric capacitors constituting memory cells in the present invention.
Figure 54:
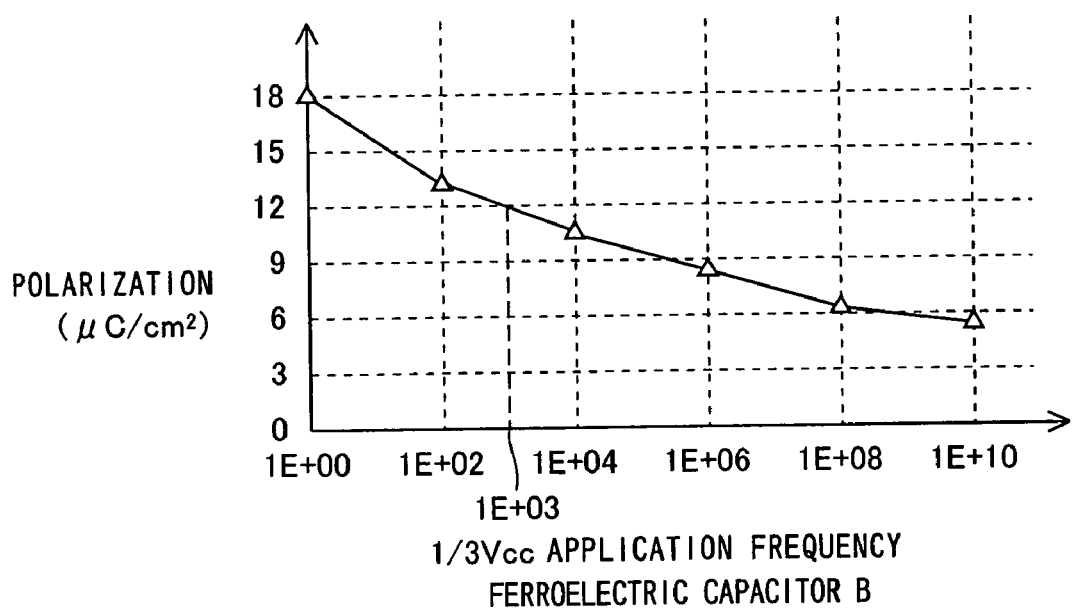
Figure 55:
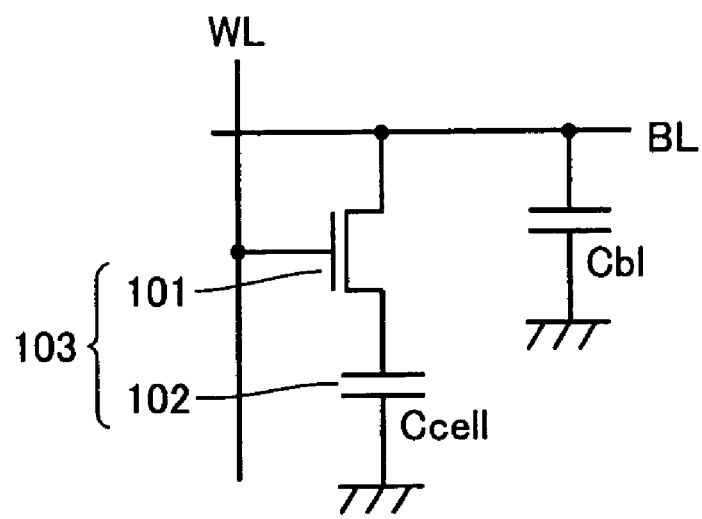
FIG. 55 is an equivalent circuit diagram showing the structure of each memory cell of a conventional DRAM.
Figure 56:
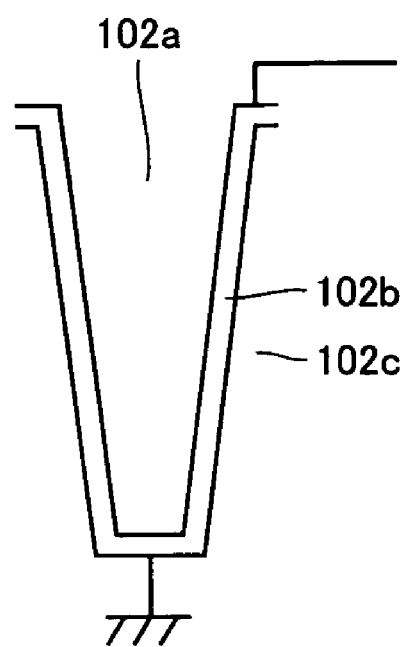
FIG. 56 is a sectional view showing the structure of each trench capacitor of the conventional DRAM.
Figure 57:
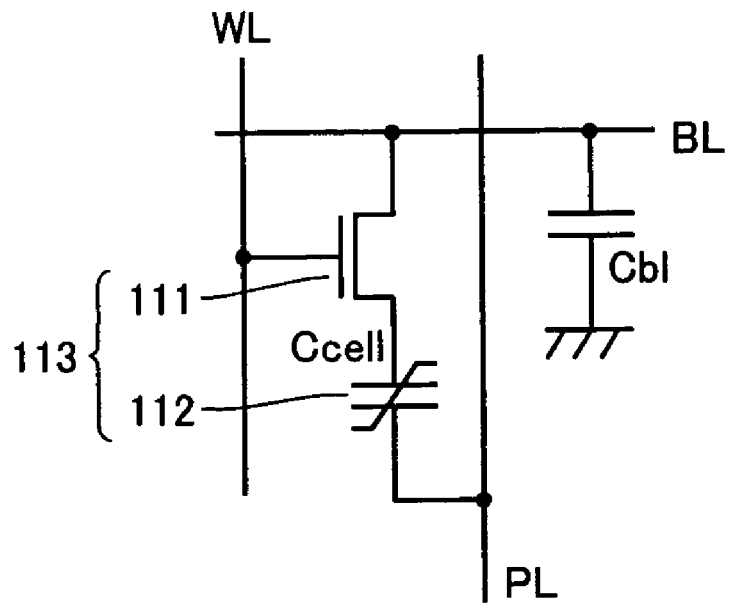
FIG. 57 is an equivalent circuit diagram showing each memory cell of a conventional one-transistor one-capacitor ferroelectric memory.

While the frequency of normal access in advance of the refresh operation is not particularly clearly stated in each of the aforementioned embodiments, the frequency of the normal access in advance of a proper refresh operation can be set every memory according to the present invention. More specifically, the maximum value of the frequency of normal access in advance of the refresh operation depends on the circuit structure of the memory and the characteristics of the ferroelectric capacitors constituting the memory cells. Consider a circuit structure prepared by adjusting the capacitances of a read amplifier and a wire connected to the read amplifier when ferroelectric capacitors hold data having polarizations of at least 12 μC/cm$^2$, so that the data can be determined. In this case, normal access can be made to a ferroelectric capacitor A having the relation between a polarization and a frequency of application of a potential difference ⅓ Vcc shown in FIG. 53 by a frequency of applying the potential difference ⅓ Vcc 10$^5$ times at the maximum in advance of a refresh operation. According to a similar circuit structure, normal access can be made to a ferroelectric capacitor B having the relation between a polarization and a frequency of application of a potential difference ⅓ Vcc shown in FIG. 54 by a frequency of applying the potential difference ⅓ Vcc 10$^3$ times at the maximum in advance of a refresh operation. On the other hand, consider a case of employing a circuit structure prepared by adjusting the capacitances of a read amplifier and a wire connected to the read amplifier when ferroelectric capacitors hold data having polarizations of at least 10 μC/cm$^2$, so that the data can be determined. In this case, normal access can be made to the ferroelectric capacitor A shown in FIG. 53 by a frequency of applying the potential difference ⅓ Vcc about 10$^6$ times to about 10$^7$ times in advance of a refresh operation. According to a similar circuit structure, normal access can be made to the ferroelectric capacitor B shown in FIG. 54 by a frequency of applying the potential difference ⅓ Vcc about 10$^4$ times in advance of a refresh operation.

While the ferroelectric memory counts the frequency of normal access to the memory cells with the counter while performing the refresh operation every prescribed access frequency counted by the counter in each of the aforementioned embodiments, the present invention is not restricted to this but the ferroelectric memory may alternatively count the time of normal access to the memory cells with counting means (e.g., a timer) for counting the access time while performing the refresh operation every lapse of the prescribed access time counted with the counting means. In this case, the counter provided in the structure of the memory according to each of the aforementioned embodiments may be replaced with the counting means (timer) for counting the access time.

While the ferroelectric memory according to each of the aforementioned embodiments performs the refresh operation every memory cell connected to the selected word line WL, the present invention is not restricted to this but the ferroelectric memory may alternatively perform the refresh operation every memory cell connected to the selected bit line BL.

While each of the aforementioned embodiments has been described with reference to the ferroelectric memory employed as an example of the inventive memory, the present invention is not restricted to this but is also applicable to a memory other than the ferroelectric memory.

What is claimed is:

1. A memory comprising:
 a memory cell array including a bit line, a word line arranged to intersect with said bit line and memory cells connected between said bit line and said word line,
 said memory accessing a selected memory cell thereby deteriorating a remanent polarization in an arbitrary memory cell and thereafter performing recovery for recovering all the memory cells to remanent polarizations immediately after a write operation or remanent polarizations subjected to a single application of a voltage applied to a nonselected memory cell in the access.

2. The memory according to claim 1, further performing said recovery so that a memory cell other than a memory cell subjected to said recovery maintains said remanent polarization immediately after said write operation or said remanent polarization subjected to a single application of said voltage applied to said nonselected memory cell in said access.

3. The memory according to claim 1, wherein
 said memory cells include a selected memory cell connected to a selected bit line and a selected word line and a nonselected memory cell other than said selected memory cell,
 said memory performing said recovery by applying a first voltage pulse supplying an electric field of a first direction and a second voltage pulse supplying an electric field opposite to said first direction to said memory cells at the same frequency throughout read and rewrite operations performed on said selected memory cell while varying a method of applying said first voltage pulse and said second voltage pulse to said memory cells with first or second data read through said read operation.

4. The memory according to claim 3, performing said recovery once on each of a plurality of said selected memory cells connected to said selected word line.

5. The memory according to claim 3, wherein
 the voltage of the first voltage pulse and the voltage of the second voltage pulse are substantially ⅓ of a voltage applied to a selected memory cell in said write operation.

6. The memory according to claim 3, wherein
 the voltage of the first voltage pulse and the voltage of the second voltage pulse are substantially half of a voltage applied to said selected memory cell in said write operation.

7. The memory according to claim 3, applying each of said first voltage pulse and said second voltage pulse once when reading said first data through said read operation, and
 applying each of said first voltage pulse and said second voltage pulse twice when reading said second data through said read operation.

8. The memory according to claim 1, wherein
 said memory cells include a selected memory cell connected to a selected word line and a nonselected memory cell other than said selected memory cell,
 said memory performing said recovery by applying a first voltage pulse supplying an electric field of a first direction and a second voltage pulse supplying an electric field opposite to said first direction to said memory cells at the same frequency or substantially applying no voltage pulse throughout read and rewrite operations performed on said selected memory cell.

9. The memory according to claim 8, wherein the memory performs said recovery on a plurality of selected memory cells connected to the selected word line.

10. The memory according to claim 8, wherein
 the voltage of the first voltage pulse and the voltage of the second voltage pulse are substantially ⅓ of a voltage applied to said selected memory cell in said write operation.

11. The memory according to claim 8, wherein
 the voltage of the first voltage pulse and the voltage of the second voltage pulse are substantially half of a voltage applied to said selected memory cell in said write operation.

12. The memory according to claim 1, wherein
 said memory cell array has an hierarchical structure consisting of a plurality of local memory cell arrays including said memory cells.

13. The memory according to claim 12, wherein
 said plurality of local memory cell arrays include a first local memory cell array and a second local memory cell array, and
 said memory accesses said first local memory cell array and performs said recovery on said second local memory cell array at the same time.

14. The memory according to claim 1, further comprising counting means for counting the frequency of access to said memory cells,
 in order to perform said recovery in connection with every prescribed access to said memory cells counted by said counting means.

15. The memory according to claim 14, wherein
 said counting means includes a counter for counting the frequency of access to said memory cells.

16. The memory according to claim 1, further comprising counting means for counting the access time to said memory cells,
 in order to perform said recovery in connection with the end of every prescribed access time to said memory cells counted by said counting means.

17. The memory according to claim 16, wherein
 said counting means includes a timer for counting said access time to said memory cells.

18. The memory according to claim 1, wherein
 said voltage applied to a nonselected memory cell in said access is substantially ⅓ of a voltage applied to a selected memory cell in said write operation.

19. The memory according to claim 1, wherein
 said voltage applied to a nonselected memory cell in said access is substantially half of a voltage applied to a selected memory cell in said write operation.

20. The memory according to claim 1, further comprising a sensing part for determining data of said memory cells on the basis of remanent polarizations of said memory cells in a read operation, wherein said remanent polarizations subjected to a single application of the voltage applied to said nonselected memory cell in said access allow data determination by said sensing part.

21. The memory according to claim 1, wherein said memory cells consist of single ferroelectric capacitors connected between said bit line and said word line.

* * * * *